US012635240B2

(12) United States Patent
Zhang et al.

(10) Patent No.: US 12,635,240 B2
(45) Date of Patent: May 19, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN); Beijing BOE Technology Development Co., Ltd., Beijing (CN)

(72) Inventors: Tiaomei Zhang, Beijing (CN); Wenbo Chen, Beijing (CN); Ziyang Yu, Beijing (CN); Yao Huang, Beijing (CN); Zhiliang Jiang, Beijing (CN); Ming Hu, Beijing (CN); Xiangdan Dong, Beijing (CN)

(73) Assignees: Chengdu BOE Optoelectronics Technology Co., Ltd., Chengdu (CN); BOE Technology Group Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 285 days.

(21) Appl. No.: 18/692,677

(22) PCT Filed: May 23, 2023

(86) PCT No.: PCT/CN2023/095803
§ 371 (c)(1),
(2) Date: Mar. 15, 2024

(87) PCT Pub. No.: WO2024/239236
PCT Pub. Date: Nov. 28, 2024

(65) Prior Publication Data
US 2026/0052772 A1 Feb. 19, 2026

(51) Int. Cl.
*H10D 86/40* (2025.01)
*G09G 3/32* (2016.01)
*H10D 86/60* (2025.01)

(52) U.S. Cl.
CPC ............. *H10D 86/441* (2025.01); *G09G 3/32* (2013.01); *H10D 86/60* (2025.01);
(Continued)

(58) Field of Classification Search
CPC ... G09G 2300/0413; G09G 2300/0819; G09G 2300/0426; G09G 2300/0842;
(Continued)

(56) References Cited

U.S. PATENT DOCUMENTS

2003/0231527 A1* 12/2003 Nakase ................ G11C 29/023
365/196
2015/0102312 A1* 4/2015 Lee ........................ H10K 59/88
257/40
(Continued)

FOREIGN PATENT DOCUMENTS

WO 2023039842 A1 3/2023

OTHER PUBLICATIONS

International Search Report & Written Opinion mailed Jan. 31, 2024, regarding PCT/CN2023/095803.

*Primary Examiner* — Dong Hui Liang
(74) *Attorney, Agent, or Firm* — Intellectual Valley Law, P.C.

(57) ABSTRACT

An array substrate is provided. The array substrate includes a plurality of first signal lines extending along a second direction, respectively. The plurality of first signal lines include a plurality of third voltage supply lines and a plurality of fourth voltage supply lines. A respective third voltage supply line of the plurality of third voltage supply lines is in a region having a column of pixel driving circuits. A respective fourth voltage supply line of the plurality of fourth voltage supply lines is in a region having a column of dummy circuits. The plurality of third voltage supply lines are configured to provide a first reference voltage signal. The
(Continued)

plurality of fourth voltage supply lines are configured to provide a second reference voltage signal, the second reference voltage signal being different from the first reference voltage signal.

20 Claims, 48 Drawing Sheets

(52) U.S. Cl.
CPC .............. *G09G 2300/0413* (2013.01); *G09G 2300/0426* (2013.01); *G09G 2300/0819* (2013.01); *G09G 2300/0842* (2013.01); *G09G 2310/08* (2013.01); *G09G 2330/021* (2013.01)

(58) Field of Classification Search
CPC ... G09G 2300/0861; G09G 2300/0809; G09G 2300/0452; G09G 3/3233; G09G 3/32; G09G 3/3266; G09G 3/3208; G09G 3/3225; G09G 3/20; G09G 3/3275; G09G 3/3291; G09G 2320/0233; G09G 2320/045; G09G 2320/0247; G09G 2310/08; G09G 2310/0251; G09G 2310/0262; G09G 2310/061; G09G 2310/0286; G09G 2310/0202
See application file for complete search history.

(56) References Cited

U.S. PATENT DOCUMENTS

| | | | |
|---|---|---|---|
| 2015/0248861 A1 | 9/2015 | Kong et al. | |
| 2015/0262526 A1* | 9/2015 | Park | G09G 3/3233 |
| | | | 345/76 |
| 2016/0218155 A1* | 7/2016 | Park | H10K 59/131 |
| 2016/0321990 A1* | 11/2016 | Kim | G09G 3/3233 |
| 2018/0012542 A1* | 1/2018 | Lee | G09G 3/3275 |
| 2021/0167161 A1 | 6/2021 | Yang et al. | |

* cited by examiner

GL2-2

Vssh

FIG. 14A     FIG. 14B

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/095803, filed May 23, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of first signal lines extending along a second direction, respectively; wherein the plurality of first signal lines comprise a plurality of third voltage supply lines and a plurality of fourth voltage supply lines; wherein a respective third voltage supply line of the plurality of third voltage supply lines is in a region having a column of pixel driving circuits; a respective fourth voltage supply line of the plurality of fourth voltage supply lines is in a region having a column of dummy circuits; the plurality of third voltage supply lines are configured to provide a first reference voltage signal; and the plurality of fourth voltage supply lines are configured to provide a second reference voltage signal, the second reference voltage signal being different from the first reference voltage signal.

Optionally, an orthographic projection of the respective third voltage supply line on a base substrate at least partially overlaps with an orthographic projection of active layers of driving transistors in the column of pixel driving circuits on the base substrate; and an orthographic projection of the respective fourth voltage supply line on the base substrate at least partially overlaps with an orthographic projection of dummy active layers of dummy driving transistors in the column of dummy circuits on the base substrate.

Optionally, an orthographic projection of the respective third voltage supply line on a base substrate at least partially overlaps with an orthographic projection of active layers of compensating transistors in the column of pixel driving circuits on the base substrate; and an orthographic projection of the respective fourth voltage supply line on the base substrate at least partially overlaps with an orthographic projection of dummy active layers of dummy compensating transistors in the column of dummy circuits on the base substrate.

Optionally, the active layers of the compensating transistors and the dummy active layers of the dummy compensating transistors are in a second semiconductor material layer; active layers of driving transistors in the column of pixel driving circuits and dummy active layers of dummy driving transistors in the column of dummy circuits are in a first semiconductor material layer; and the second semiconductor material layer is on a side of the first semiconductor material layer away from the base substrate.

Optionally, at least two third voltage supply lines of the plurality of third voltage supply lines are between two adjacent fourth voltage supply lines of the plurality of fourth voltage supply lines; and at least two columns of pixel driving circuits are between two adjacent columns of dummy circuits.

Optionally, the array substrate further comprises a plurality of second signal lines extending along the second direction, respectively; wherein the plurality of second signal lines comprise a plurality of data lines and a plurality of reset signal lines; wherein a respective data line of the plurality of data lines is in the region having the column of pixel driving circuits; and a respective reset signal line of the plurality of reset signal lines is in the region having the column of dummy circuits.

Optionally, at least two data lines of the plurality of data lines are between two adjacent reset signal lines of the plurality of reset signal lines.

Optionally, the plurality of reset signal lines comprise a plurality of fourth reset signal lines and a plurality of fifth reset signal lines; the plurality of fourth reset signal lines and the plurality of fifth reset signal lines are alternately arranged in regions having columns of dummy circuits; and a respective fourth reset signal of the plurality of fourth reset signal lines and a respective fifth reset signal line of the plurality of fifth reset signal lines are configured to provide reset signals to different reset transistors in a same pixel driving circuit.

Optionally, the plurality of reset signal lines comprise a plurality of fourth reset signal lines, a plurality of fifth reset signal lines, and a plurality of sixth reset signal lines; the plurality of fourth reset signal lines, the plurality of fifth reset signal lines, and the plurality of sixth reset signal lines are alternately arranged in regions having columns of dummy circuits; and a respective fourth reset signal of the plurality of fourth reset signal lines, a respective fifth reset signal line of the plurality of fifth reset signal lines, and a respective sixth reset signal of the plurality of sixth reset signal lines are configured to provide reset signals to different reset transistors in a same pixel driving circuit.

Optionally, the array substrate further comprises a plurality of first voltage supply lines extending along a first direction, respectively; wherein the plurality of first voltage supply lines and the plurality of third voltage supply lines form a first interconnected voltage supply network configured to provide the first reference voltage signal; the plurality of first voltage supply lines respectively cross over the plurality of third voltage supply lines; a respective first voltage supply line of the plurality of first voltage supply lines is connected to at least multiple ones of the plurality of third voltage supply lines; and the respective third voltage supply line is connected to at least multiple ones of the plurality of first voltage supply lines.

Optionally, the first interconnected voltage supply network further comprises a plurality of voltage supply branches in a plurality of pixel driving circuits, respectively; a voltage supply branch is connected to the respective first voltage supply line; and the respective third voltage supply line is connected to the voltage supply branch in the pixel driving circuit.

Optionally, the plurality of voltage supply branches are in a first signal line layer; and the respective third voltage supply line is in a second signal line layer.

Optionally, the array substrate further comprises a plurality of second voltage supply lines extending along a first direction, respectively; wherein the plurality of second voltage supply lines and the plurality of fourth voltage supply lines form a second interconnected voltage supply network configured to provide the second reference voltage signal; the plurality of second voltage supply lines respectively cross over the plurality of fourth voltage supply lines; a respective second voltage supply line of the plurality of second voltage supply lines is connected to at least multiple ones of the plurality of fourth voltage supply lines; and the respective fourth voltage supply line is connected to at least multiple ones of the plurality of second voltage supply lines.

Optionally, the second interconnected voltage supply network further comprises a plurality of dummy voltage supply branches in a plurality of dummy circuits, respectively; a dummy voltage supply branch is connected to the respective second voltage supply line; and the respective fourth voltage supply line is connected to the dummy voltage supply branch.

Optionally, the respective second voltage supply line is in a third gate metal layer; the plurality of dummy voltage supply branches are in a first signal line layer on a side of the third gate metal layer away from a base substrate; and the respective fourth voltage supply line is in a second signal line layer on a side of the first signal line layer away from the base substrate.

Optionally, the array substrate further comprises a first interconnected reset signal line network configured to provide a first reset signal to a plurality of pixel driving circuits; wherein the first interconnected reset signal line network comprises a plurality of first reset signal lines respectively along a first direction and a plurality of fifth reset signal lines respectively along a second direction; wherein the plurality of first reset signal lines respectively cross over the plurality of fifth reset signal lines; a respective first reset signal line of the plurality of first reset signal lines is connected to at least multiple ones of the plurality of fifth reset signal lines; and a respective fifth reset signal line of the plurality of fifth reset signal lines is connected to at least multiple ones of the plurality of first reset signal lines.

Optionally, the array substrate further comprises a second interconnected reset signal line network configured to provide a third reset signal to a plurality of pixel driving circuits; wherein the second interconnected reset signal line network comprises a plurality of third reset signal lines respectively along a first direction and a plurality of fourth reset signal lines respectively along a second direction; wherein the plurality of third reset signal lines respectively cross over the plurality of fourth reset signal lines; a respective third reset signal line of the plurality of third reset signal lines is connected to at least multiple ones of the plurality of fourth reset signal lines; and a respective fourth reset signal line of the plurality of fourth reset signal lines is connected to at least multiple ones of the plurality of third reset signal lines.

Optionally, the second interconnected reset signal line network further comprises a plurality of dummy reset signal connecting lines in a plurality of dummy circuits, respectively, a dummy reset signal connecting line is connected to the respective third reset signal line; and the respective fourth reset signal line is connected to the dummy reset signal connecting line.

Optionally, the respective third reset signal line is in a second gate metal layer, the plurality of dummy reset signal connecting lines are in a first signal line layer; and the respective fourth reset signal line is in the second signal line layer.

Optionally, the array substrate further comprises a light shield; wherein the light shield comprises a plurality of islands and a plurality of bridges; an orthographic projection of a respective island of the plurality of islands on a base substrate covers an orthographic projection of an active layer of a driving transistor in a pixel driving circuit, or an orthographic projection of a dummy active layer of a dummy driving transistor in a dummy circuit; the plurality of bridges comprise bridges extending along a first direction for connecting multiple islands in a same row, and bridges extending along a second direction for connecting multiple islands in a same column; an orthographic projection of the plurality of third voltage supply lines and the plurality of fourth voltage supply lines on the base substrate covers an orthographic projection of the bridges extending along a second direction on the base substrate; and the orthographic projection of the plurality of third voltage supply lines and the plurality of fourth voltage supply lines on the base substrate at least partially overlaps with an orthographic projection of the plurality of islands on the base substrate.

In another aspect, the present disclosure provides an array substrate, comprising a plurality of first signal lines extending along a second direction, respectively; and a plurality of second signal lines extending along the second direction, respectively; wherein the plurality of first signal lines comprise a plurality of third voltage supply lines and a plurality of fourth voltage supply lines; the plurality of second signal lines comprise a plurality of data lines and a plurality of reset signal lines; a respective third voltage supply line of the plurality of third voltage supply lines is in a region having a column of pixel driving circuits; a respective fourth voltage supply line of the plurality of fourth voltage supply lines is in a region having a column of dummy circuits; the plurality of reset signal lines are configured to provide a reset signal; and the plurality of fourth voltage supply lines are configured to provide a second reference voltage signal, the second reference voltage signal being different from the reset signal.

Optionally, the second reference voltage signal has a voltage level lower than a voltage level of the reset signal.

Optionally, the plurality of third voltage supply lines are configured to provide a first reference voltage signal; and the second reference voltage signal has a voltage level lower than a voltage level of the first reference voltage signal.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of first signal lines extending along a second direction, respectively. Optionally, the plurality of first signal lines comprise a plurality of third voltage supply lines and a plurality of fourth voltage supply lines. Optionally, a respective third voltage supply line of the plurality of third voltage supply lines is in a region having a column of pixel driving circuits. Optionally, a respective fourth voltage supply line of the plurality of fourth voltage supply lines is in a region having a column of dummy circuits. Optionally, the plurality of third voltage supply lines are configured to provide a first reference voltage signal. Optionally, the plurality of fourth voltage supply lines are configured to provide a second reference voltage signal, the second reference voltage signal being different from the first reference voltage signal.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
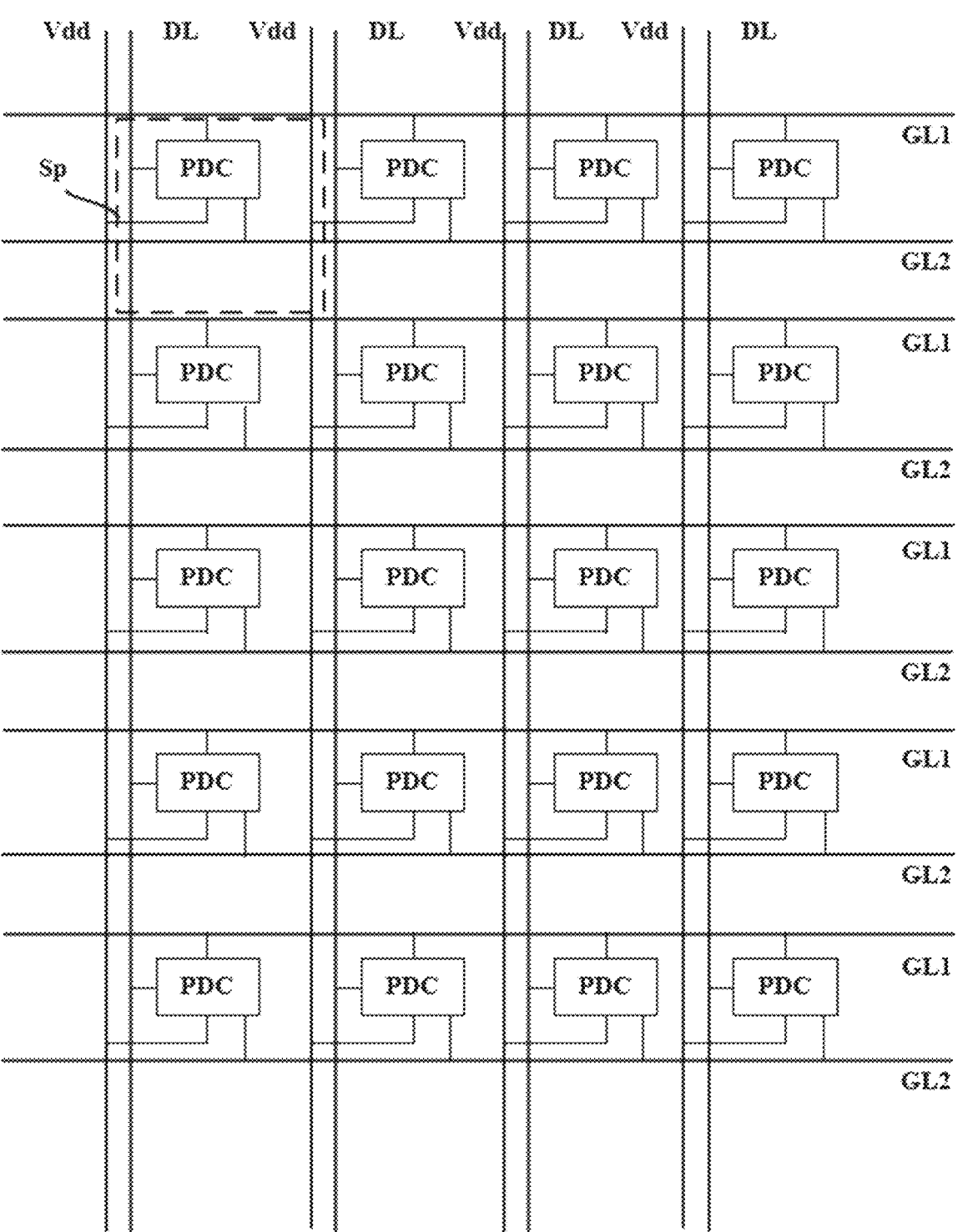
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage ΔV that drives light emission in the light emitting element.

Figure 2A:
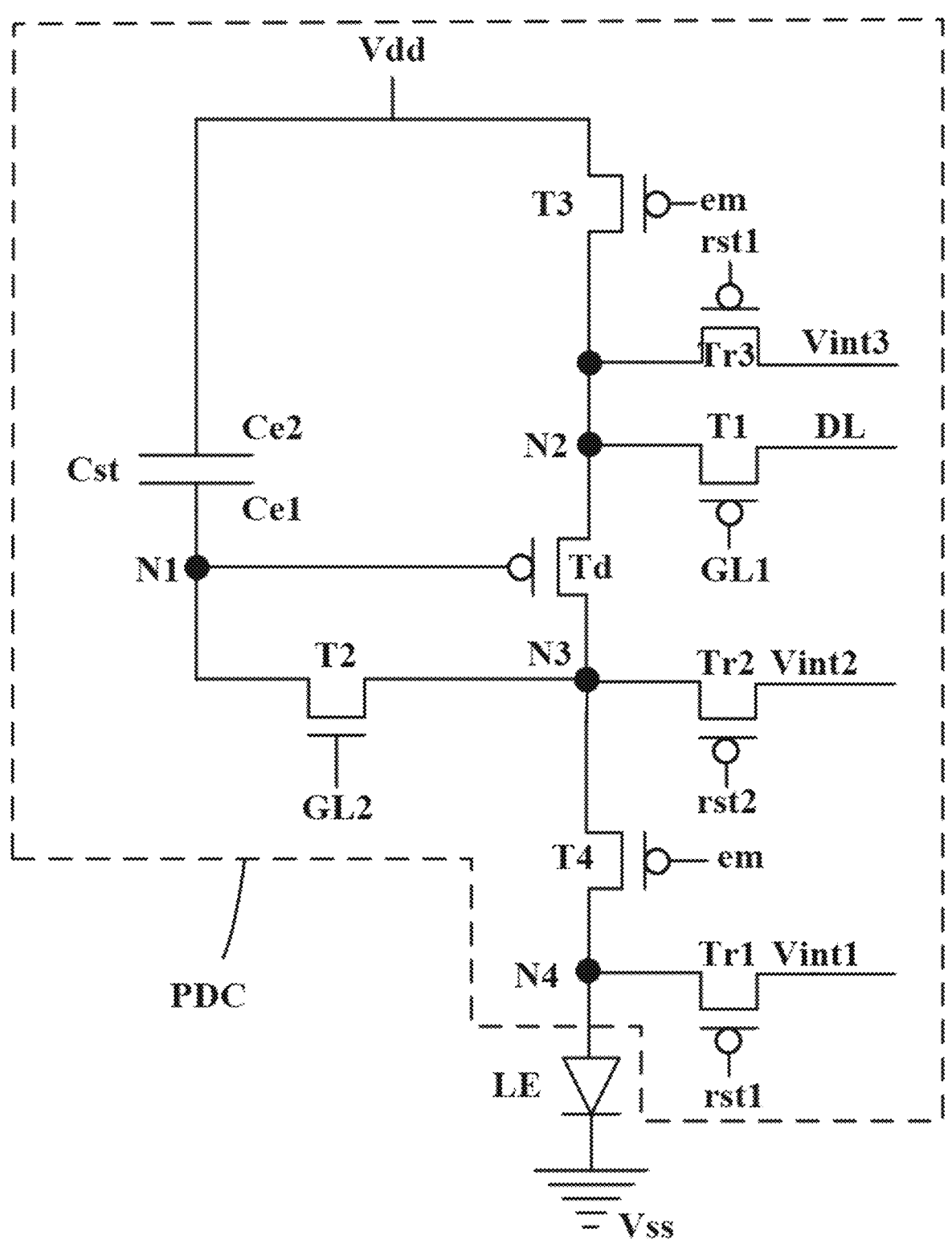
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a respective second reset control signal line rst2 of a plurality of second reset control signal lines, a first electrode connected to a respective second reset signal line Vint2 of a plurality of second reset signal lines, and a second electrode connected to a second electrode of the driving transistor Td; a first transistor T1 having a gate electrode connected to a respective first gate line GL1 of a plurality of first gate lines, a first electrode connected to a respective data line DL of a plurality of data lines, and a second electrode connected to a first electrode of the driving transistor Td; a third reset transistor Tr3 having a gate electrode connected to a respective first reset control signal line rst1 of a plurality of first reset control signal lines, a first electrode connected to a respective third reset signal line Vint3 of a plurality of third reset signal lines, and a second electrode connected to the first electrode of the driving transistor Td; a second transistor T2 having a gate electrode connected to a respective second gate line GL2 of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective light emitting control signal line em of a plurality of light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective light emitting control signal line em of the plurality of light emitting control signal lines, a first electrode connected to second electrodes of the driving transistor Td and the second transistor T2, and a second electrode connected to an anode of a light emitting element LE; and a first reset transistor Tr1 having a gate electrode connected to the respective first reset control signal line rst1 of a plurality of first reset control signal lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit further include a first node N1, a second node N2, a third node N3, and a fourth node N4. The first node N1 is connected to the gate electrode of the driving transistor Td, the first capacitor electrode Ce1, and the first electrode of the second transistor T2. The second node N2 is connected to the second electrode of the third transistor T3, the second electrode of the first transistor T1, the second electrode of the third reset transistor Tr3, and the first electrode of the driving transistor Td. The third node N3 is connected to the second electrode of the driving transistor Td, the second electrode of the second transistor T2, the first electrode of the fourth transistor T4, and the second electrode of the second reset transistor Tr2. The fourth node N4 is connected to the second electrode of the fourth transistor T4, the second electrode of the first reset transistor Tr1, and the anode of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In some embodiments, a minimum repeating unit of the plurality of subpixels of the array substrate includes the respective first subpixel, the respective second subpixel, and the respective third subpixel. Optionally, each of the respective first subpixel, the respective second subpixel, and the respective third subpixel, includes the first transistor T1, the second transistor T2, the third transistor T3, the fourth transistor T4, the first reset transistor Tr1, the second reset transistor Tr2, the third reset transistor Tr3, and the driving transistor Td.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 2A, the second transistor T2 is an n-type transistor such as a metal oxide transistor, and other transistors are p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 2B:
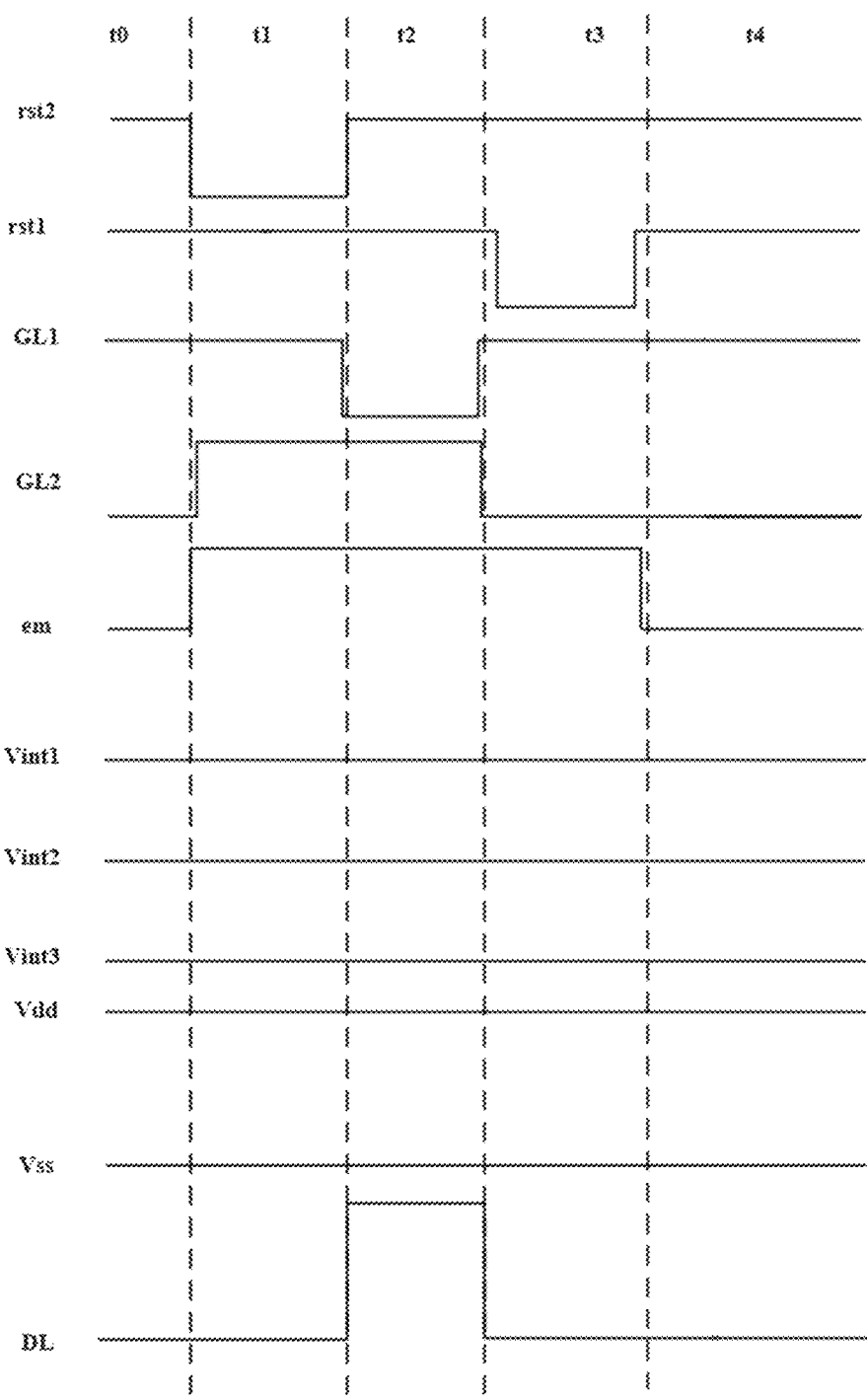
FIG. 2B is a timing diagram illustrating the operation of a pixel driving circuit in some embodiments according to the present disclosure.

FIG. 2B is a timing diagram illustrating the operation of a pixel driving circuit in some embodiments according to the present disclosure. Referring to FIG. 2A and FIG. 2B, during one frame of image, the operation of the pixel driving circuit includes an initial sub-phase to, a first reset sub-phase t1, a data write sub-phase t2, a second reset sub-phase t3, and a light emitting sub-phase t4. In the initial sub-phase t0, a turning-off reset control signal is provided through the respective second reset control signal line rst2 to the gate electrode of the second reset transistor Tr2 to turn off the second reset transistor Tr2. A turning-off reset control signal is provided through the respective first reset control signal line rst1 to the gate electrode of the first reset transistor Tr1 and the gate electrode of the third reset transistor Tr3 to turn off the first reset transistor Tr1 and the third reset transistor Tr3. In the initial sub-phase t0, the respective first gate line GL1 and the respective second gate line GL2 are provided with a turning-off signal, thus the first transistor T1 and the second transistor T2 are turned off.

In the first reset sub-phase t1, a turning-on reset control signal is provided through the second reset control signal line rst2 to the gate electrode of the second reset transistor Tr2 to turn on the second reset transistor Tr2; allowing an initialization voltage signal from the respective second reset signal line Vint2 to pass from a first electrode of the second reset transistor Tr2 to a second electrode of the second reset transistor Tr2, and in turn to the second electrode of the second transistor T2 and the second electrode of the driving transistor Td. The node N3 is initialized. The second capacitor electrode Ce2 receives a high voltage signal from the respective voltage supply line Vdd. The first capacitor electrode Ce1 is charged in the first reset sub-phase t1 due to an increasing voltage difference between the first capacitor electrode Ce1 and the second capacitor electrode Ce2. In the first reset sub-phase t1, the respective first gate line GL1 is provided with a turning-off signal, thus the first transistor T1 is turned off. In the first reset sub-phase t1, the respective second gate line GL2 is provided with a turning-on signal, thus the second transistor T2 is turned on. The respective light emitting control signal line em is provided with a high voltage signal to turn off the third transistor T3 and the fourth transistor T4.

In the data write sub-phase t2, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-on signal, thus the first transistor T1 and the second transistor T2 are turned on. A second electrode of the driving transistor Td is connected with the second electrode of the second transistor T2. A gate electrode of the driving transistor Td is electrically connected with the first electrode of the second transistor T2. Because the second transistor T2 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The first transistor T1 is turned on in the data write sub-phase t2. The data voltage signal transmitted through the respective data line DL is received by a first electrode of the first transistor T1, and in turn transmitted to the first electrode of the driving transistor Td, which is connected to the second electrode of the first transistor T1. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line em is provided with a high voltage signal to turn off the third transistor T3 and the fourth transistor T4.

In the second reset sub-phase t3, a turning-on reset control signal is provided through the respective first reset control signal line rst1 to the gate electrode of the first reset transistor Tr1 to turn on the first reset transistor Tr1; allowing an initialization voltage signal from the respective first reset signal line Vint1 to pass from a first electrode of the first reset transistor Tr1 to a second electrode of the first reset transistor Tr1; and in turn to the node N4. The anode of the light emitting element LE is initialized. A turning-on reset control signal is provided through the respective first reset control signal line rst1 to the gate electrode of the third reset transistor Tr3 to turn on the third reset transistor Tr3; allowing an initialization voltage signal from the respective third reset signal line Vint3 to pass from a first electrode of the third reset transistor Tr3 to a second electrode of the third reset transistor Tr3; and in turn to the node N2. The node N2 is initialized.

In the second reset sub-phase t3, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-off signal, the first transistor T1 and the second transistor T2 are turned off.

In the light emitting sub-phase t4, the respective light emitting control signal line em is provided with a low voltage signal to turn on the third transistor T3 and the fourth transistor T4. The voltage level at the node N1 in the light emitting sub-phase t4 is maintained at (Vdata+Vth), the driving transistor Td is turned on by the voltage level, and working in the saturation area. A path is formed through the third transistor T3, the driving transistor Td, the fourth transistor T4, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 3A:
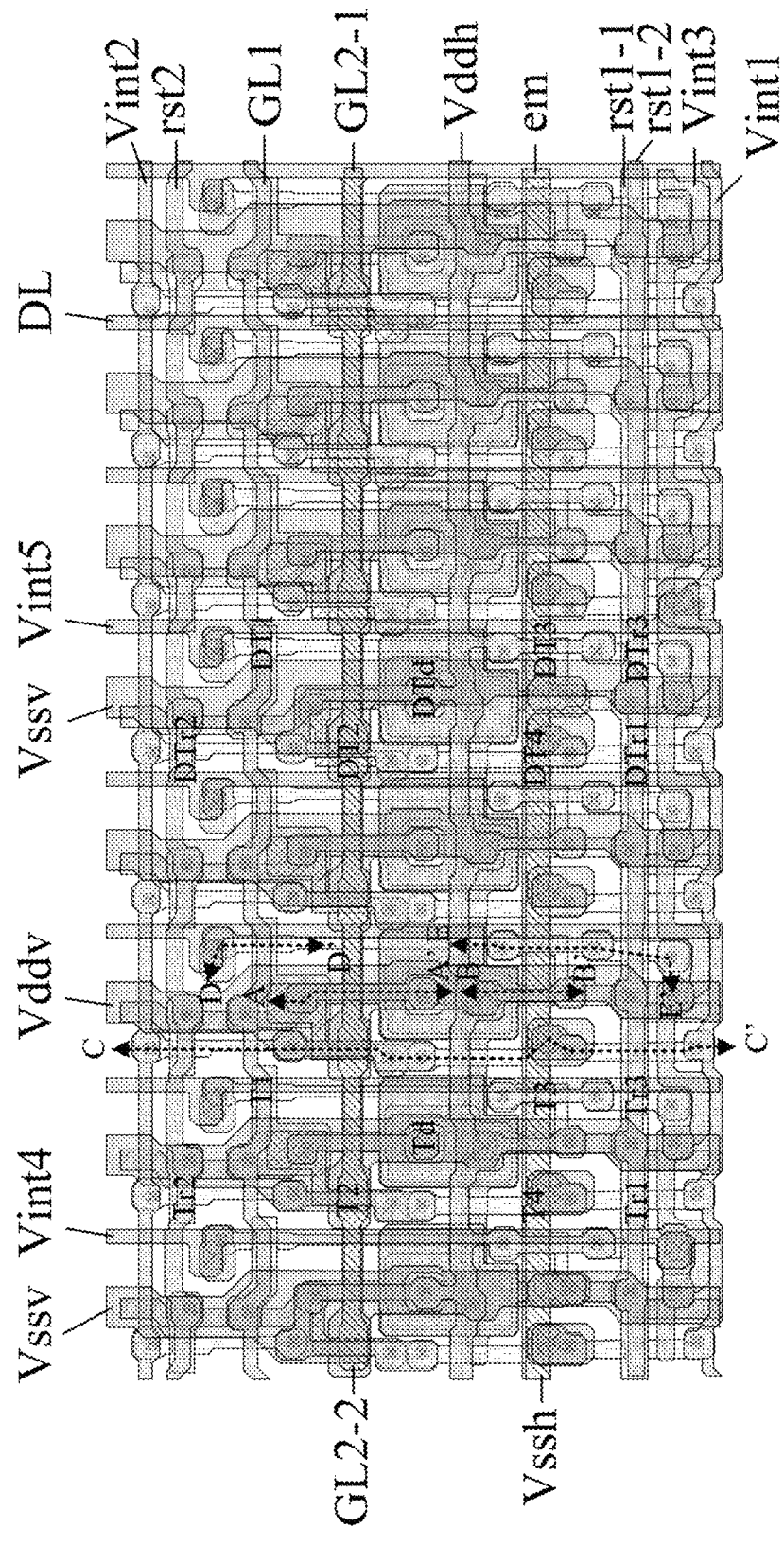
FIG. 3A is a diagram illustrating the structure of pixel driving circuits and dummy circuits in an array substrate in some embodiments according to the present disclosure.
Figure 3B:
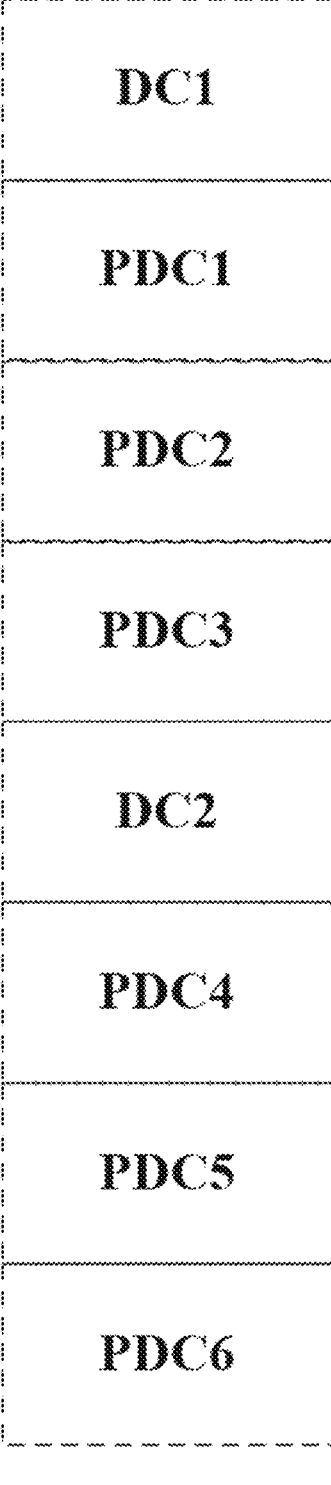
FIG. 3B is a schematic diagram illustrating an arrangement of pixel driving circuits and dummy circuits in the array substrate depicted in FIG. 3A.

FIG. 3A is a diagram illustrating the structure of pixel driving circuits and dummy circuits in an array substrate in some embodiments according to the present disclosure, FIG. 3B is a schematic diagram illustrating an arrangement of pixel driving circuits and dummy circuits in an array substrate depicted in FIG. 3A. FIG. 3A and FIG. 3B depicts a portion of the array substrate having six pixel driving circuits, including PDC1, PDC2, PDC3, PDC4, PDC5, and PDC6, and two dummy circuits, include DC1 and DC2. As used herein, the term "dummy circuit" refers to a circuit which is incapable of driving light emission in a display substrate. A dummy circuit may have a structure similar to that of a pixel driving circuit, but not identical. For example, components in a pixel driving circuit may be connected but corresponding components in the dummy circuits may be disconnected. In another example, components in a pixel driving circuit may be disconnected from each other but corresponding components in the dummy circuits may be connected.

Figure 3C:
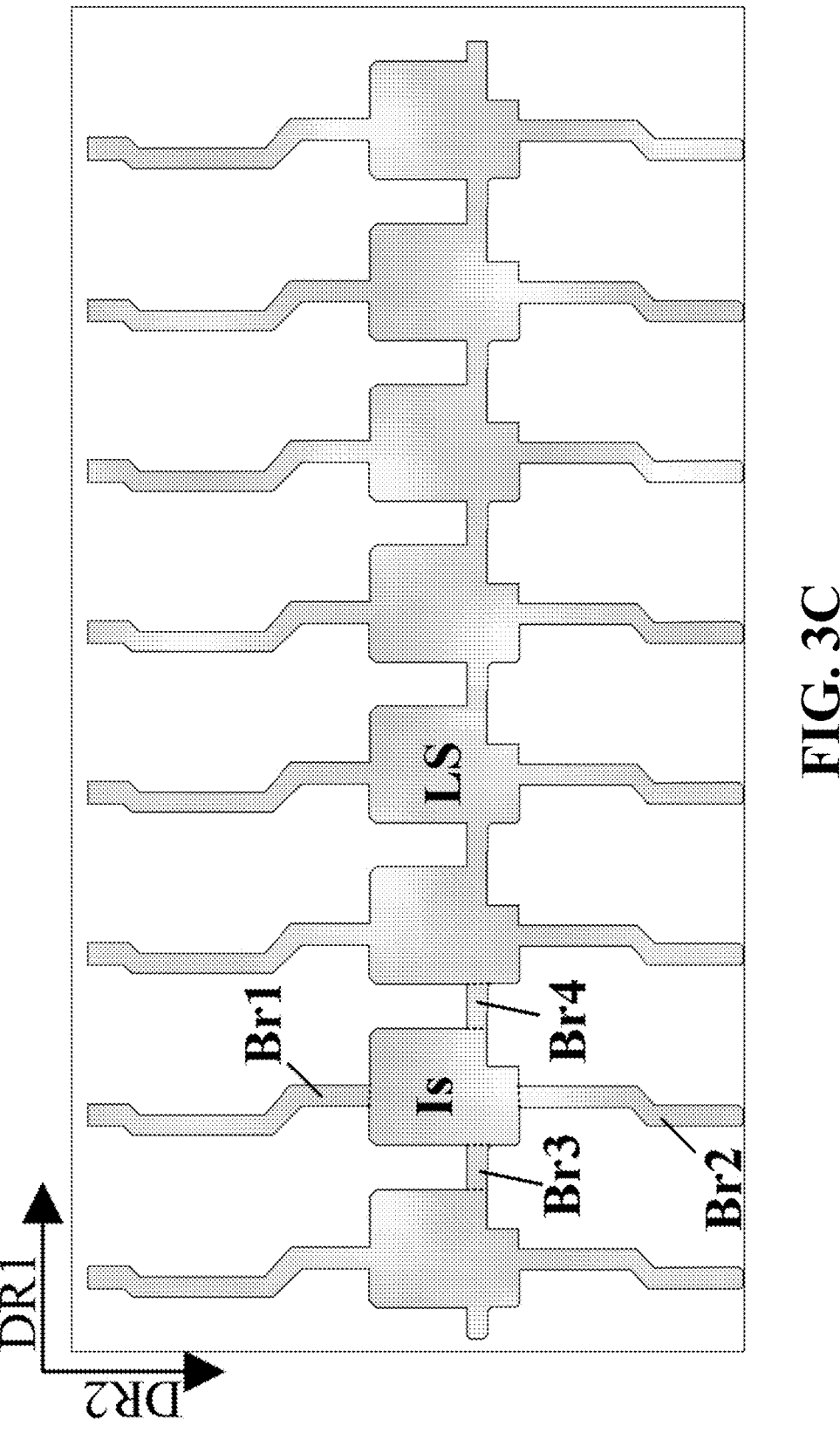
FIG. 3C is a diagram illustrating the structure of a light shielding layer in the array substrate depicted in FIG. 3A.
Figure 3D:
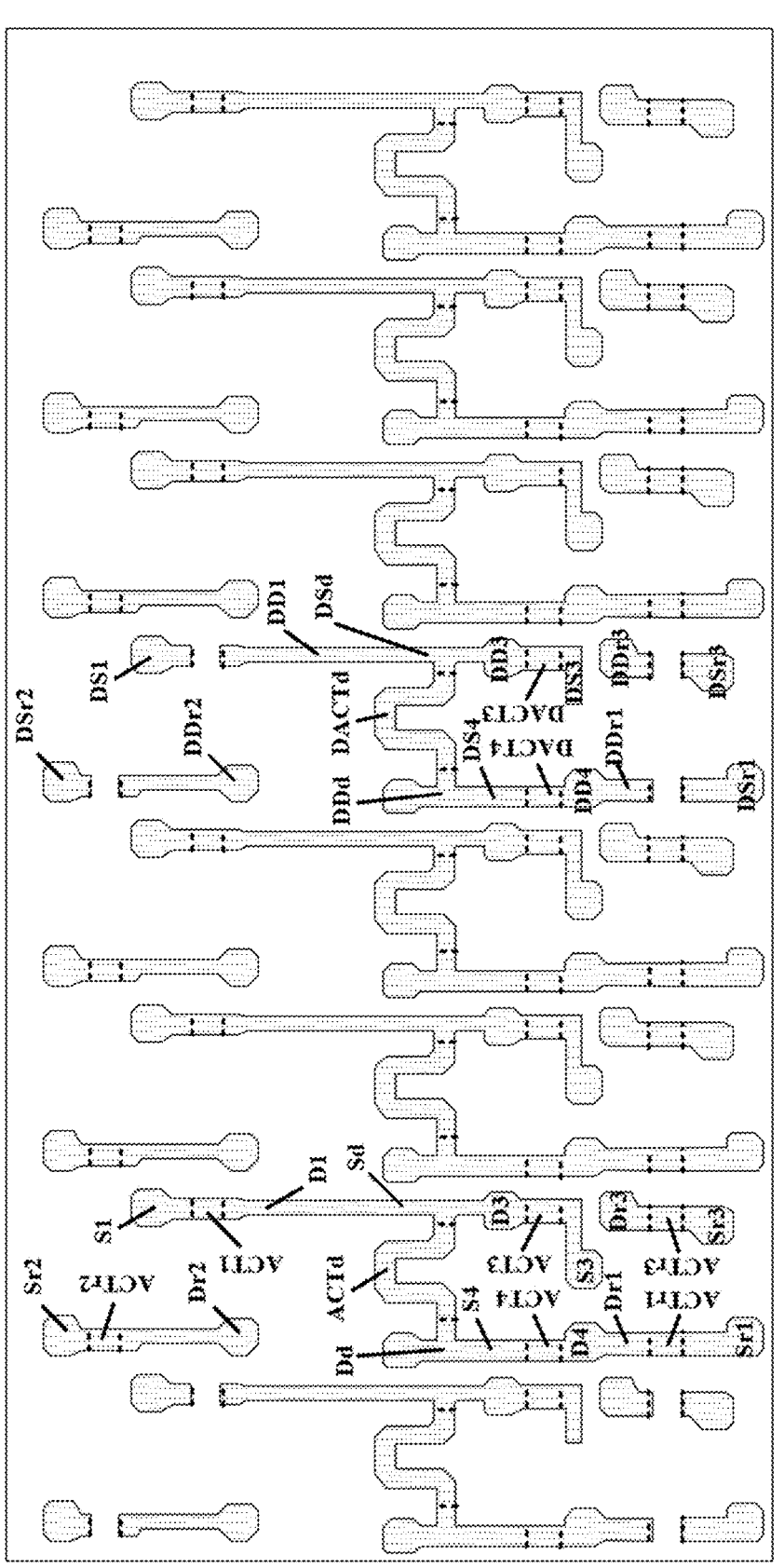
FIG. 3D is a diagram illustrating the structure of a first semiconductor material layer in the array substrate depicted in FIG. 3A.
Figure 3E:
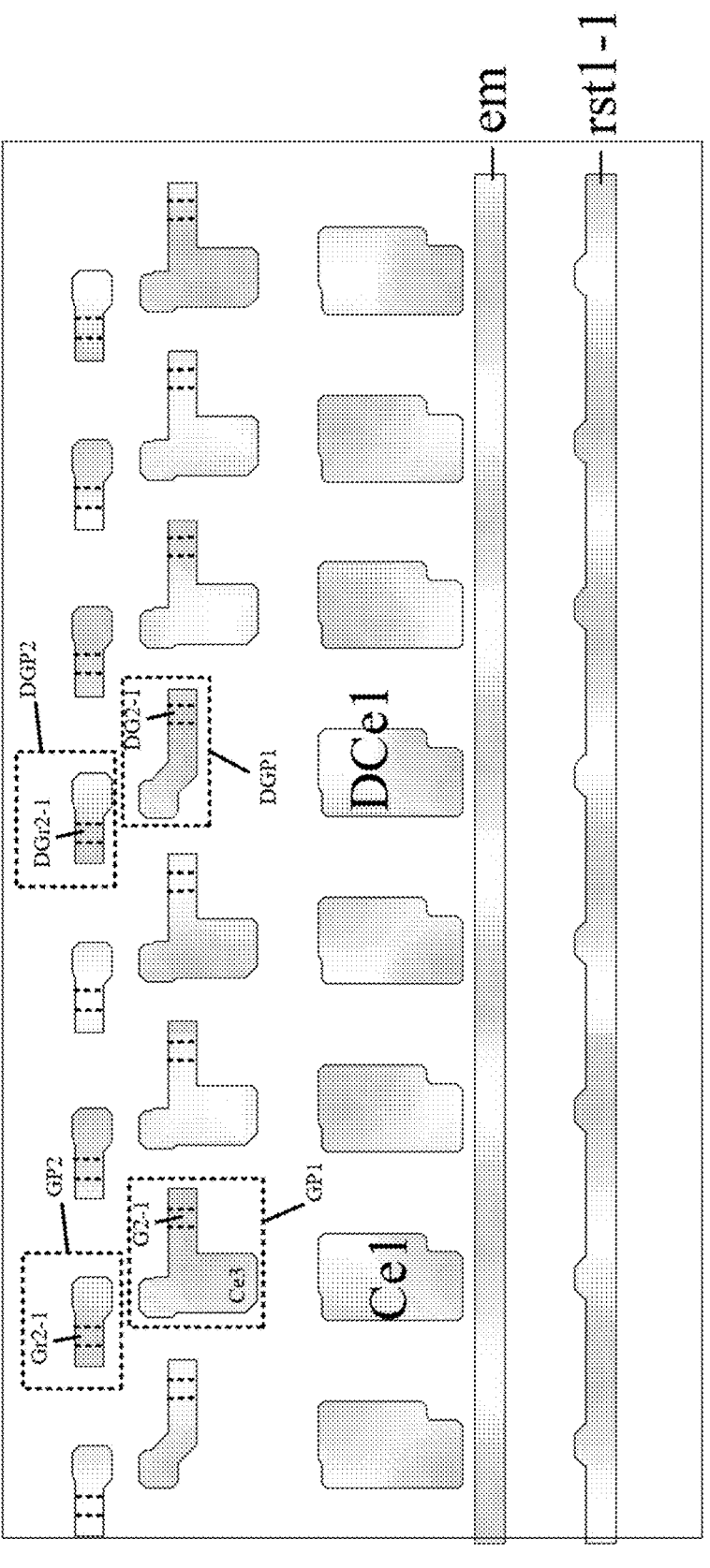
FIG. 3E is a diagram illustrating the structure of a first gate metal layer in the array substrate depicted in FIG. 3A.
Figure 3F:
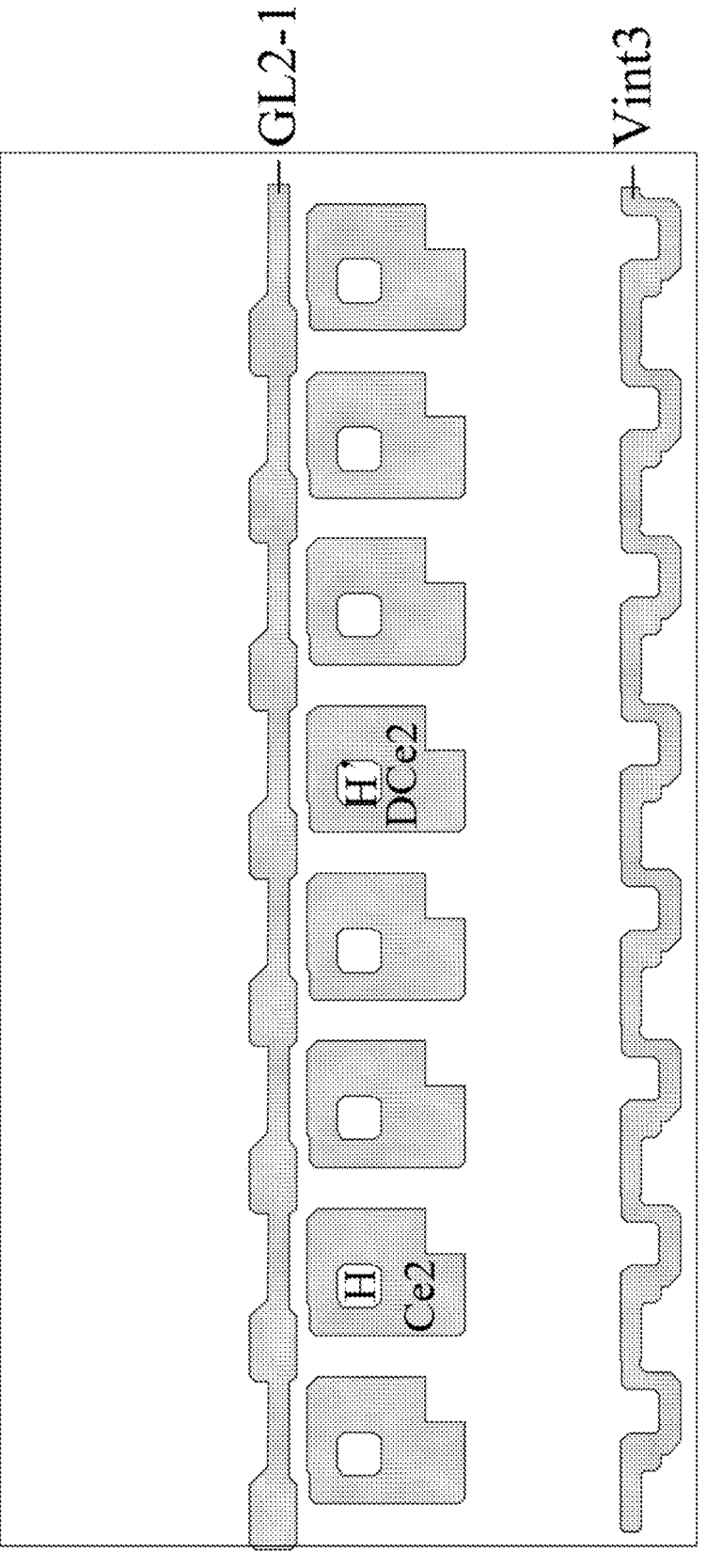
FIG. 3F is a diagram illustrating the structure of a second gate metal layer in the array substrate depicted in FIG. 3A.
Figure 3G:
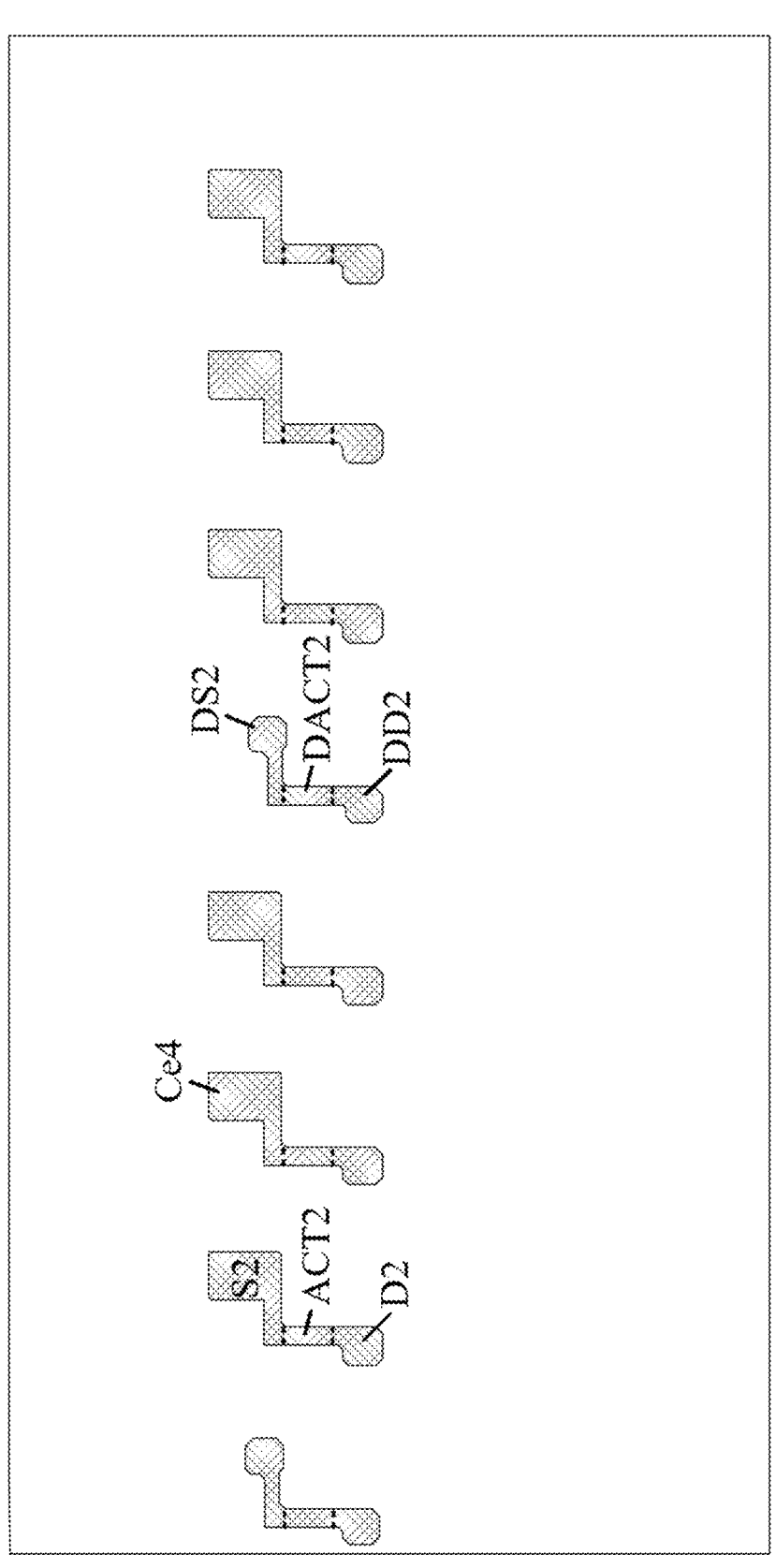
FIG. 3G is a diagram illustrating the structure of a second semiconductor material layer in the array substrate depicted in FIG. 3A.
Figure 3H:
FIG. 3H is a diagram illustrating the structure of a third gate metal layer in the array substrate depicted in FIG. 3A.
Figure 3I:
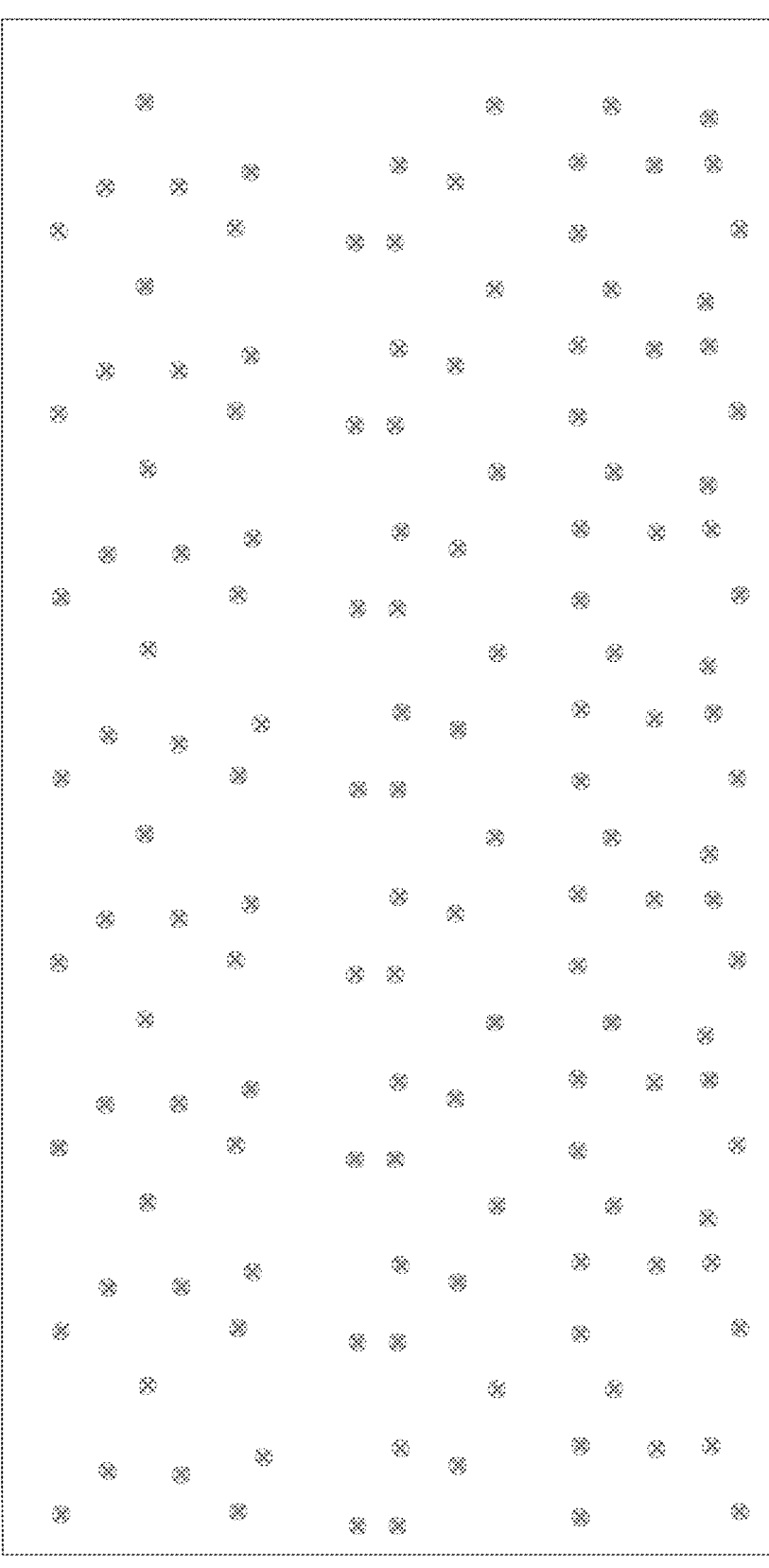
FIG. 3I is a diagram illustrating vias extending through a passivation layer in the array substrate depicted in FIG. 3A.
Figure 3J:
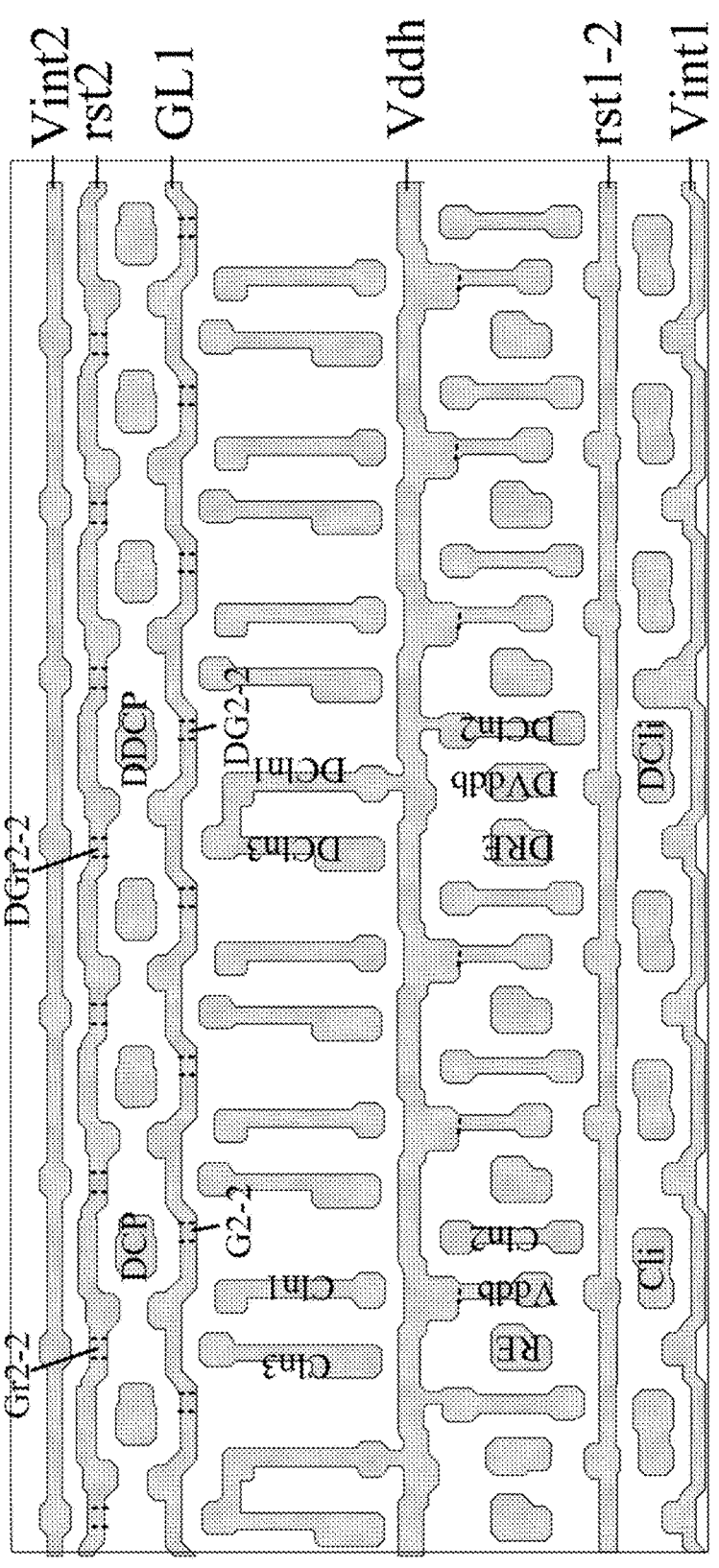
FIG. 3J is a diagram illustrating the structure of a first signal line layer in the array substrate depicted in FIG. 3A.
Figure 3K:
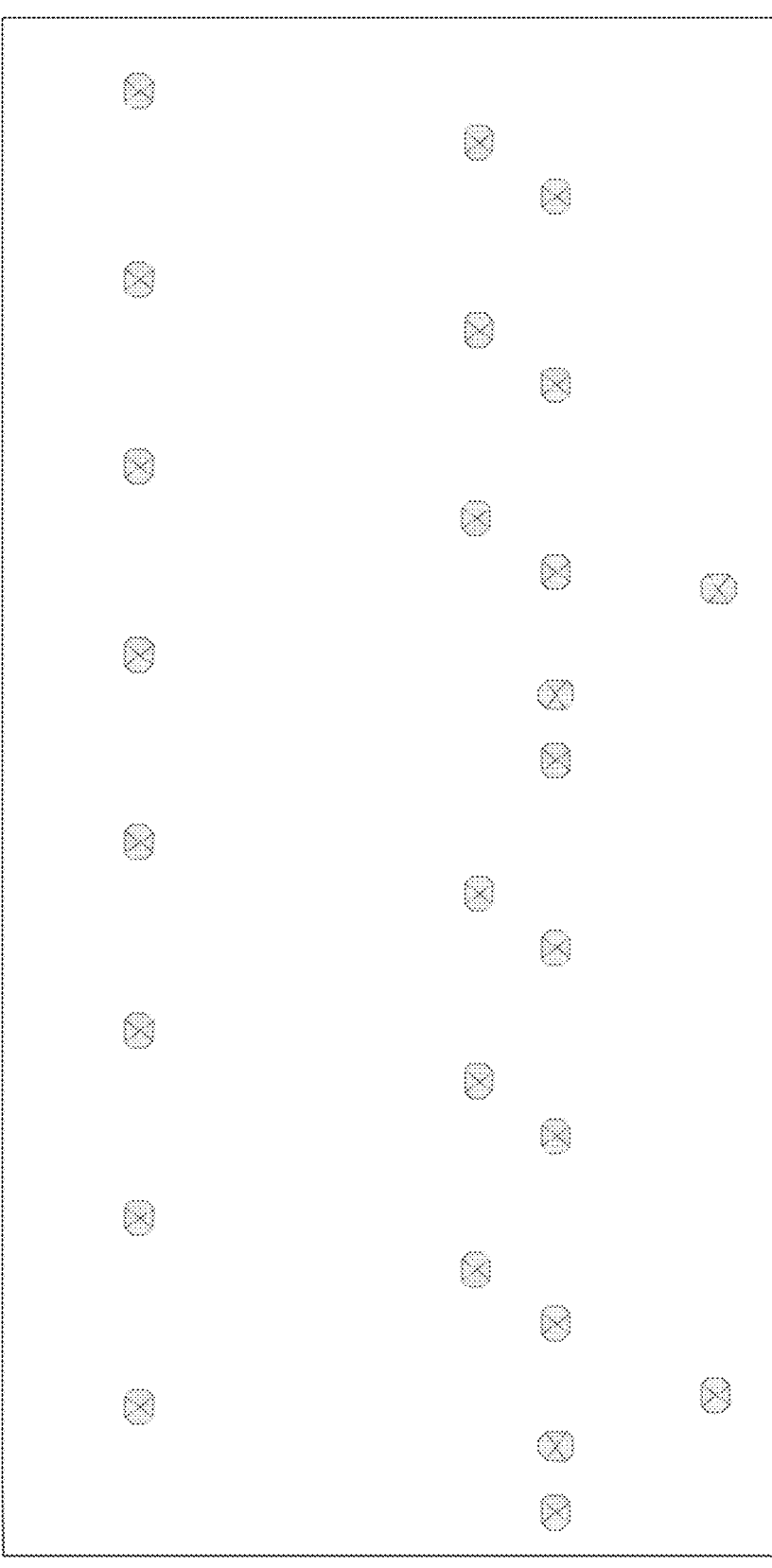
FIG. 3K is a diagram illustrating vias extending through a first planarization layer in the array substrate depicted in FIG. 3A.
Figure 3L:
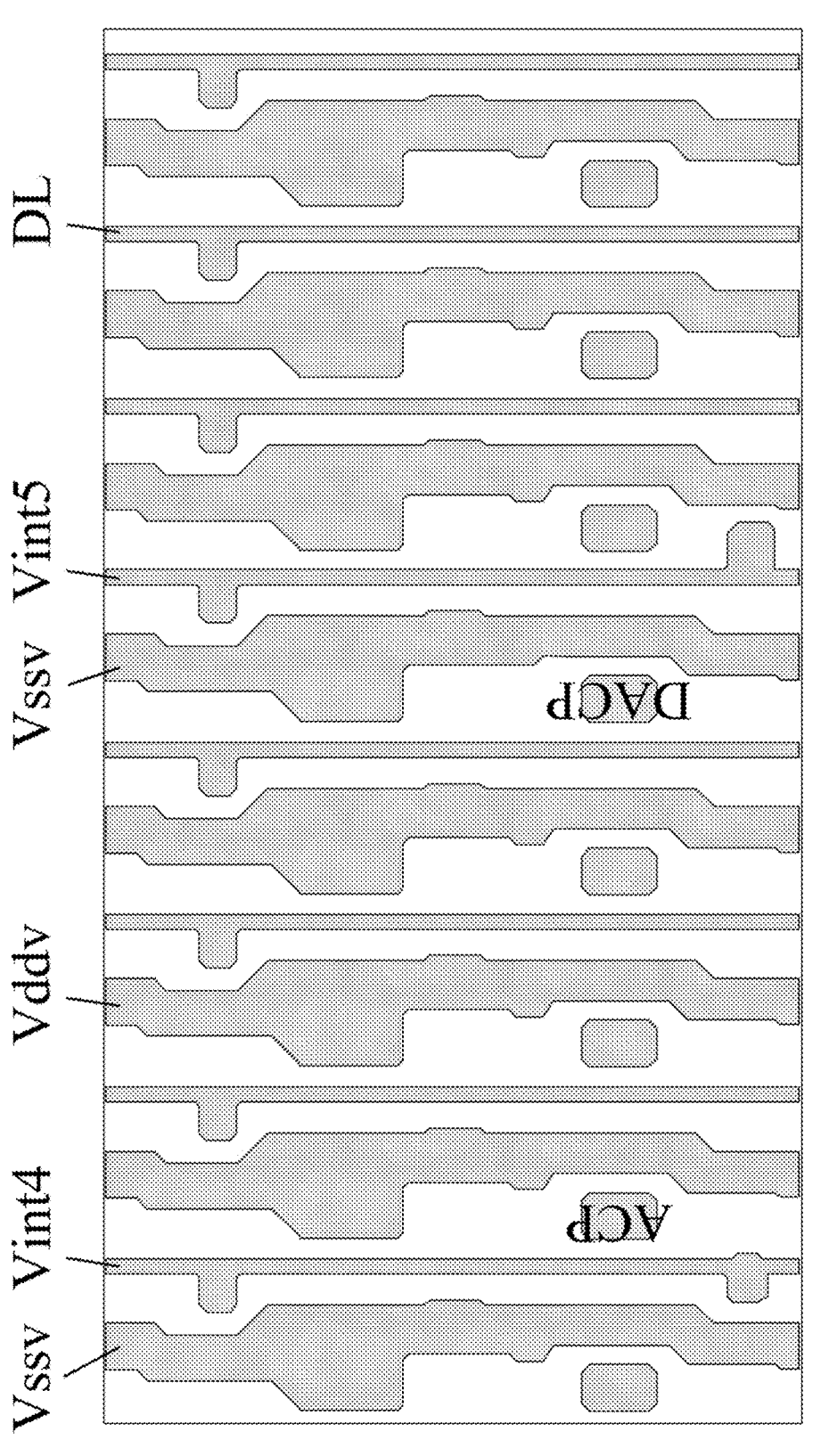
FIG. 3L is a diagram illustrating the structure of a second signal line layer in the array substrate depicted in FIG. 3A.

FIG. 3C is a diagram illustrating the structure of a light shielding layer in the array substrate depicted in FIG. 3A. FIG. 3D is a diagram illustrating the structure of a first semiconductor material layer in the array substrate depicted in FIG. 3A, FIG. 3E is a diagram illustrating the structure of a first gate metal layer in the array substrate depicted in FIG. 3A. FIG. 3F is a diagram illustrating the structure of a second gate metal layer in the array substrate depicted in FIG. 3A. FIG. 3G is a diagram illustrating the structure of a second semiconductor material layer in the array substrate depicted in FIG. 3A. FIG. 3H is a diagram illustrating the structure of a third gate metal layer in the array substrate depicted in FIG. 3A. FIG. 3I is a diagram illustrating vias extending through a passivation layer in the array substrate depicted in FIG. 3A. FIG. 3J is a diagram illustrating the structure of a first signal line layer in the array substrate depicted in FIG. 3A. FIG. 3K is a diagram illustrating vias extending through a first planarization layer in the array substrate depicted in FIG. 3A. FIG. 3L is a diagram illustrating the structure of a second signal line layer in the array substrate depicted in FIG. 3A.

Figure 4A:
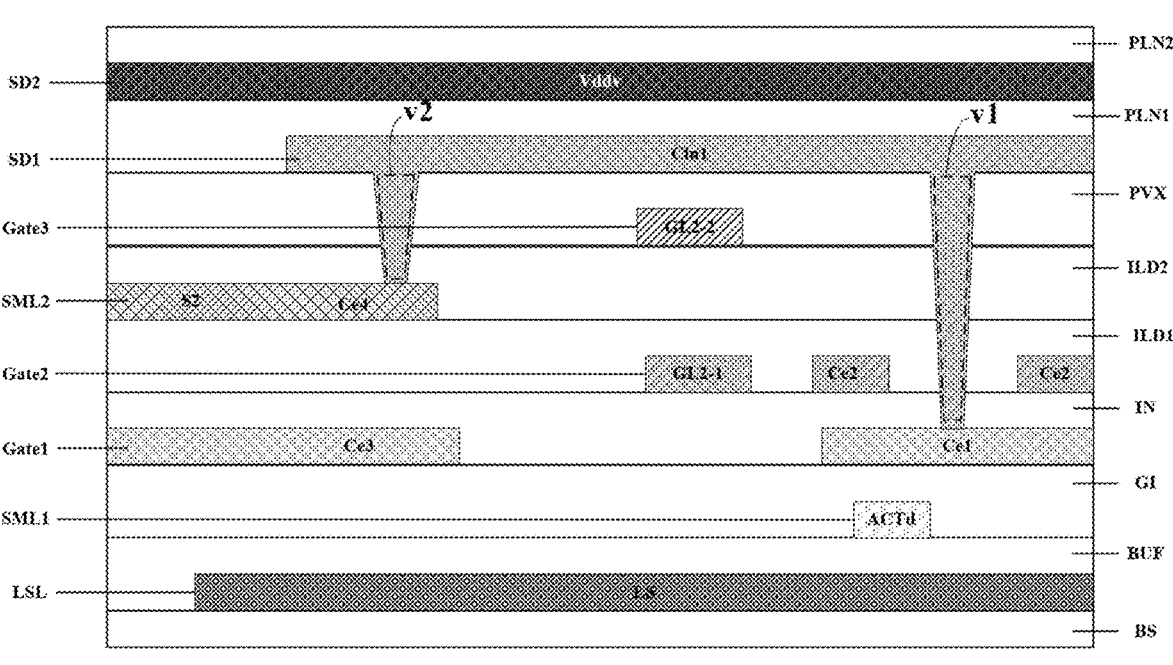
FIG. 4A is a cross-sectional view along an A-A line in FIG. 3A.
Figure 4B:
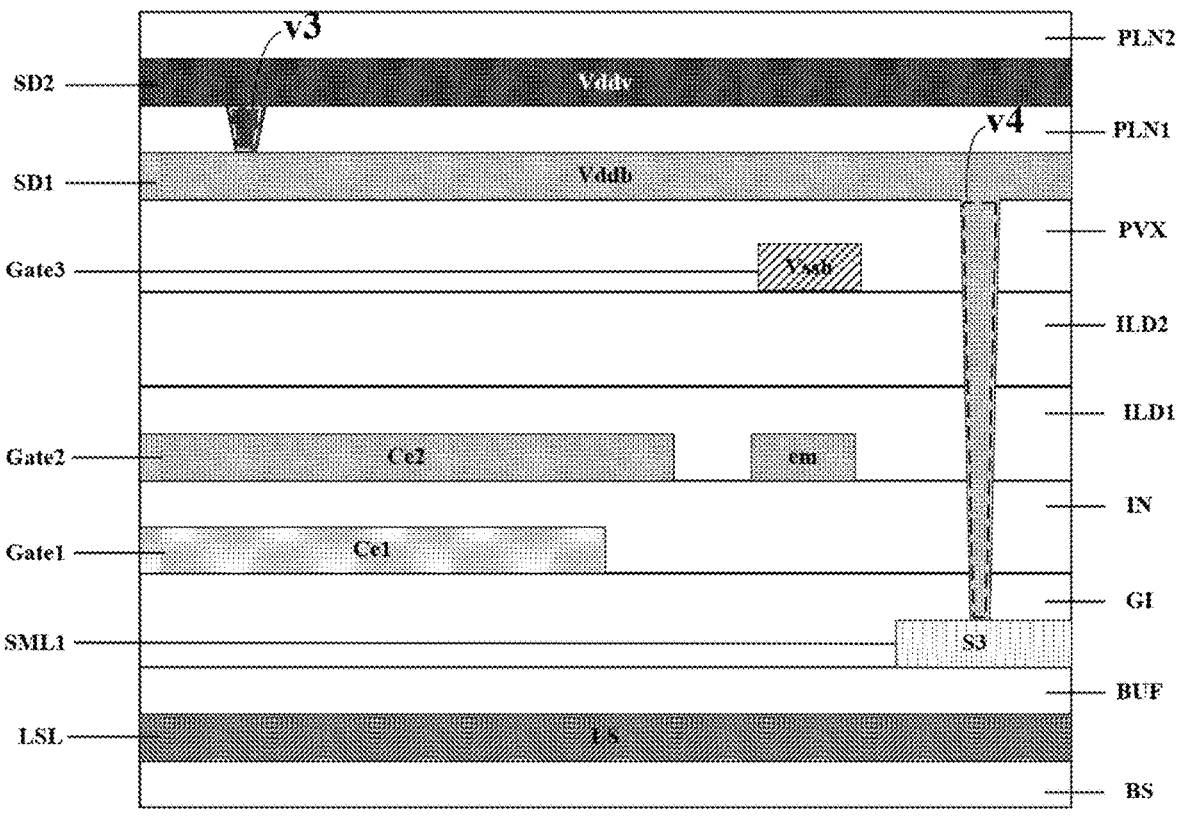
FIG. 4B is a cross-sectional view along a B-B' line in FIG. 3A.
Figure 4C:
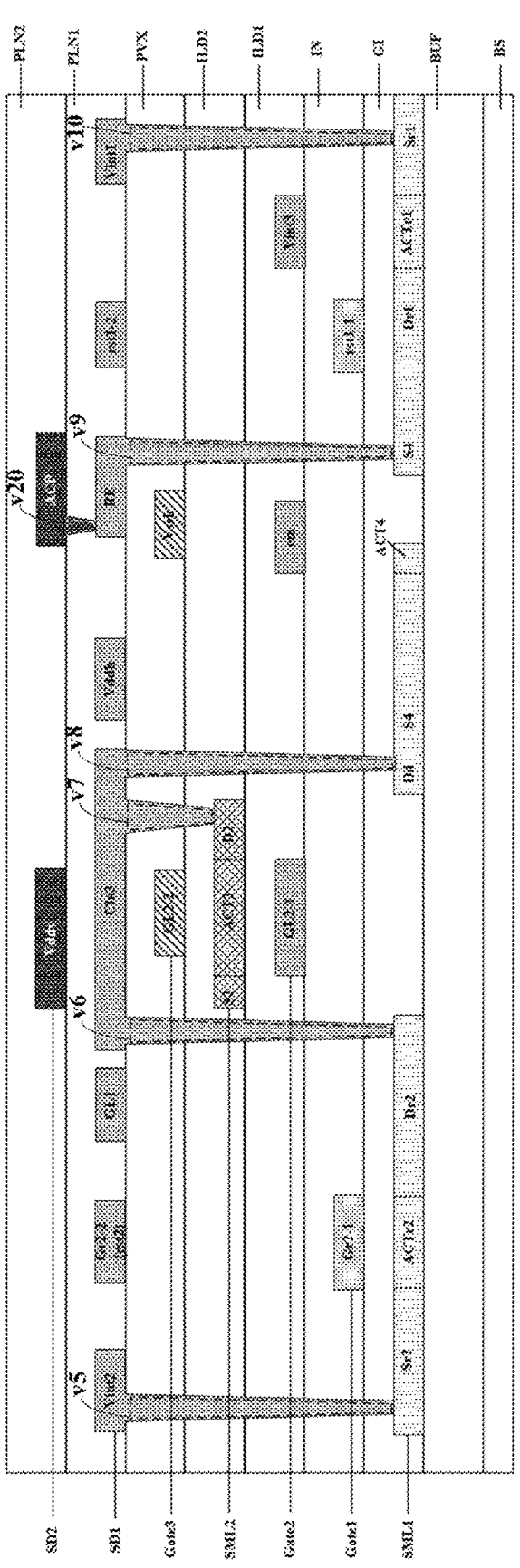
FIG. 4C is a cross-sectional view along a C-C' line in FIG. 3A.
Figure 4D:
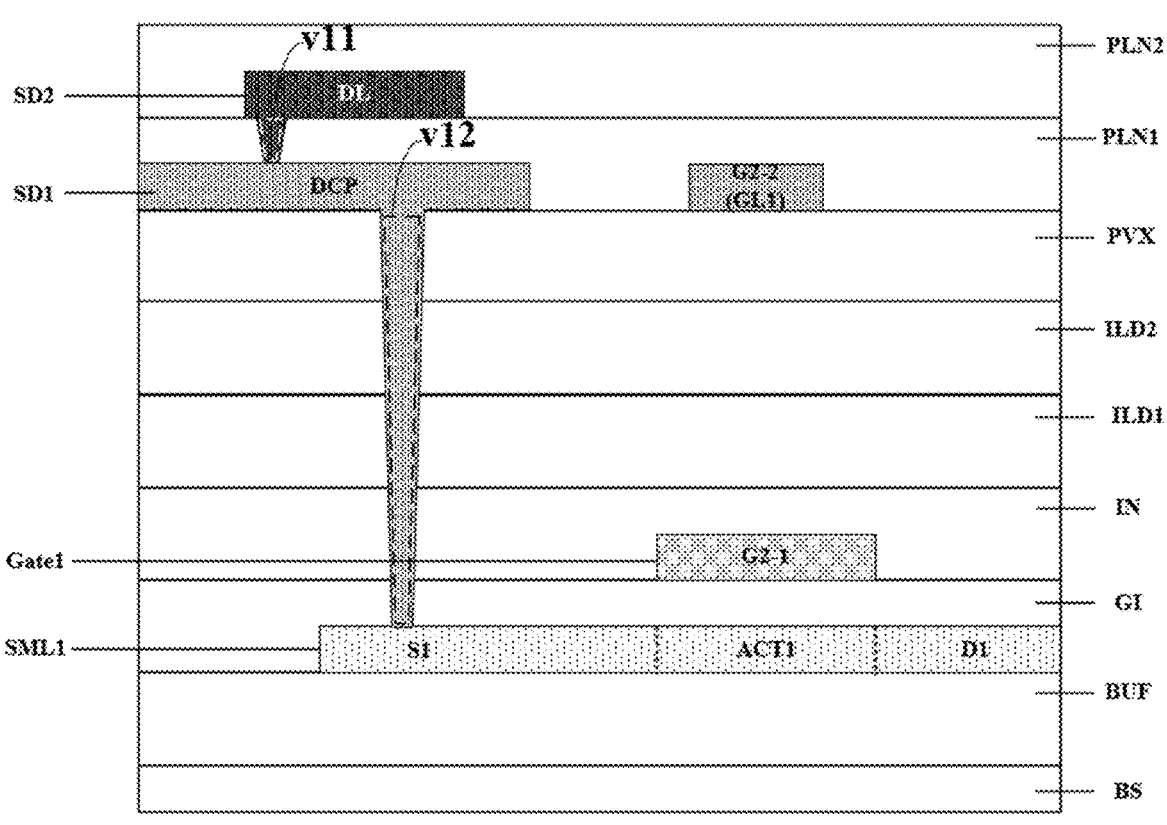
FIG. 4D is a cross-sectional view along a D-D' line in FIG. 3A.
Figure 4E:
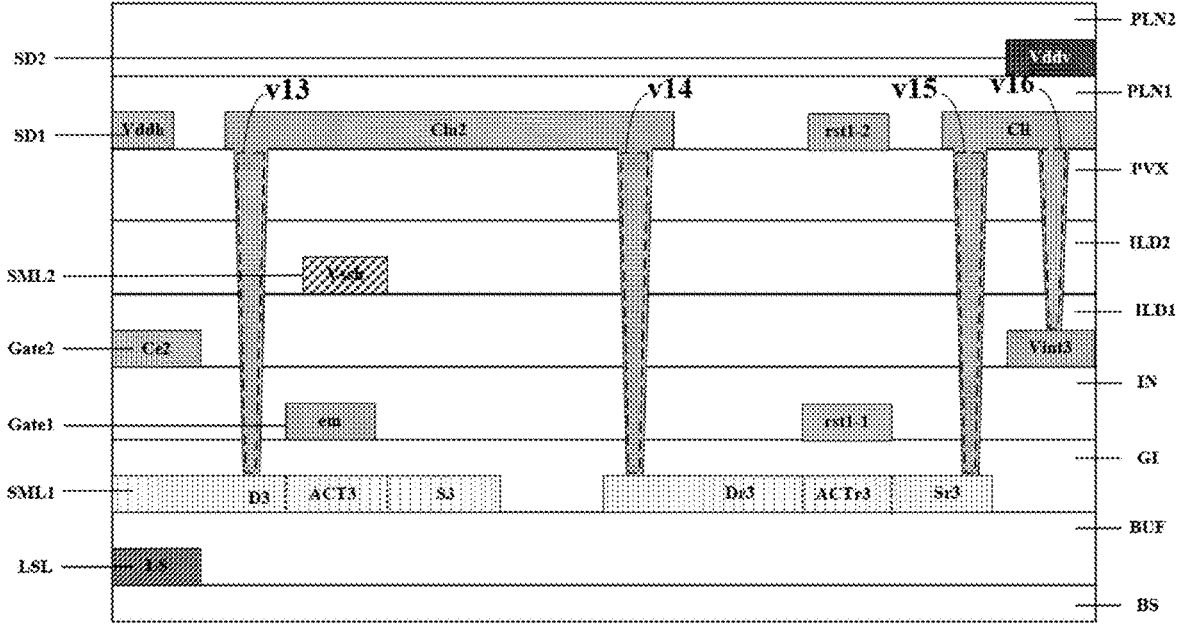
FIG. 4E is a cross-sectional view along a E-E' line in FIG. 3A.

FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A.

Figure 5:
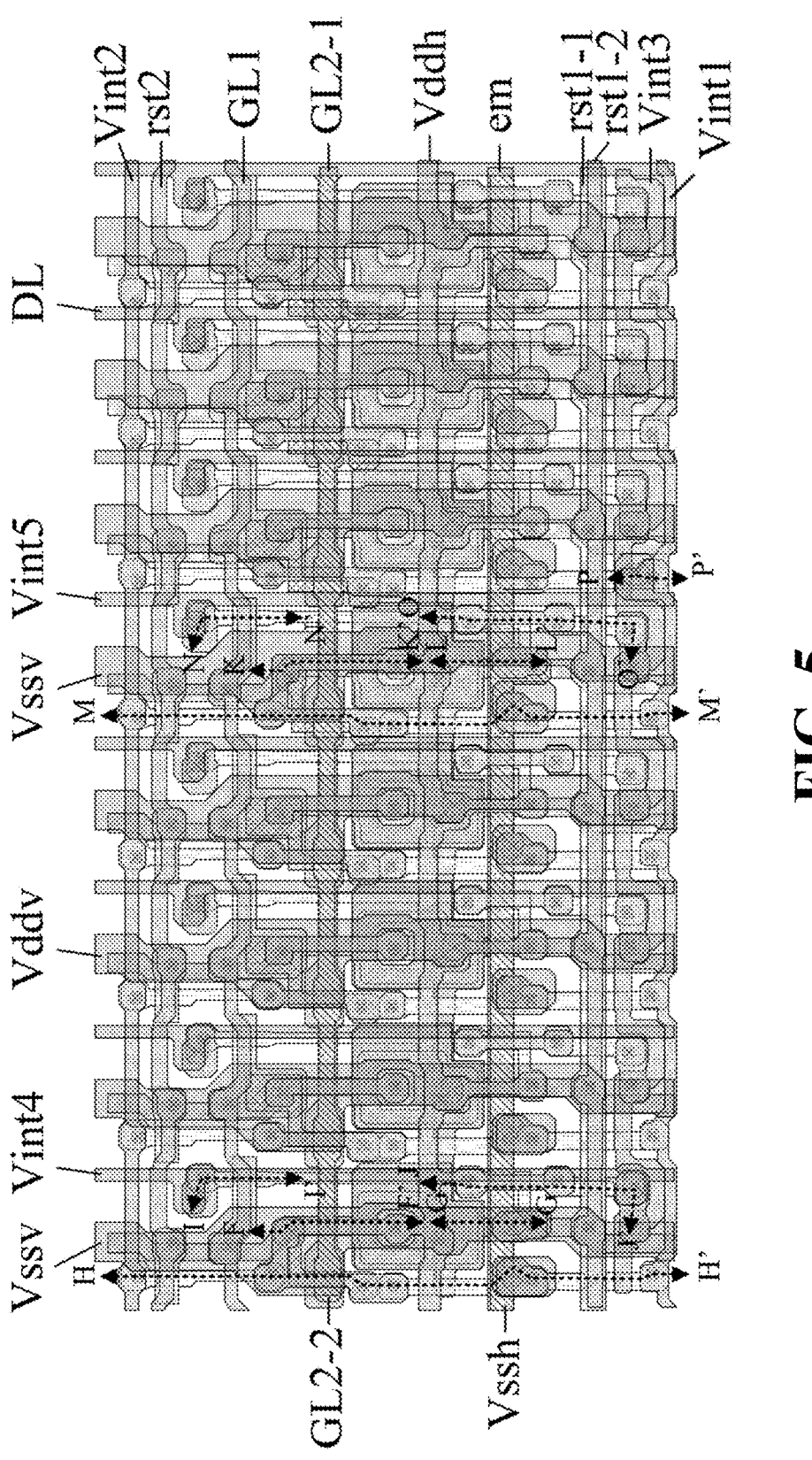
FIG. 5 is a diagram illustrating the structure of pixel driving circuits and dummy circuits in an array substrate in some embodiments according to the present disclosure.
Figure 6A:
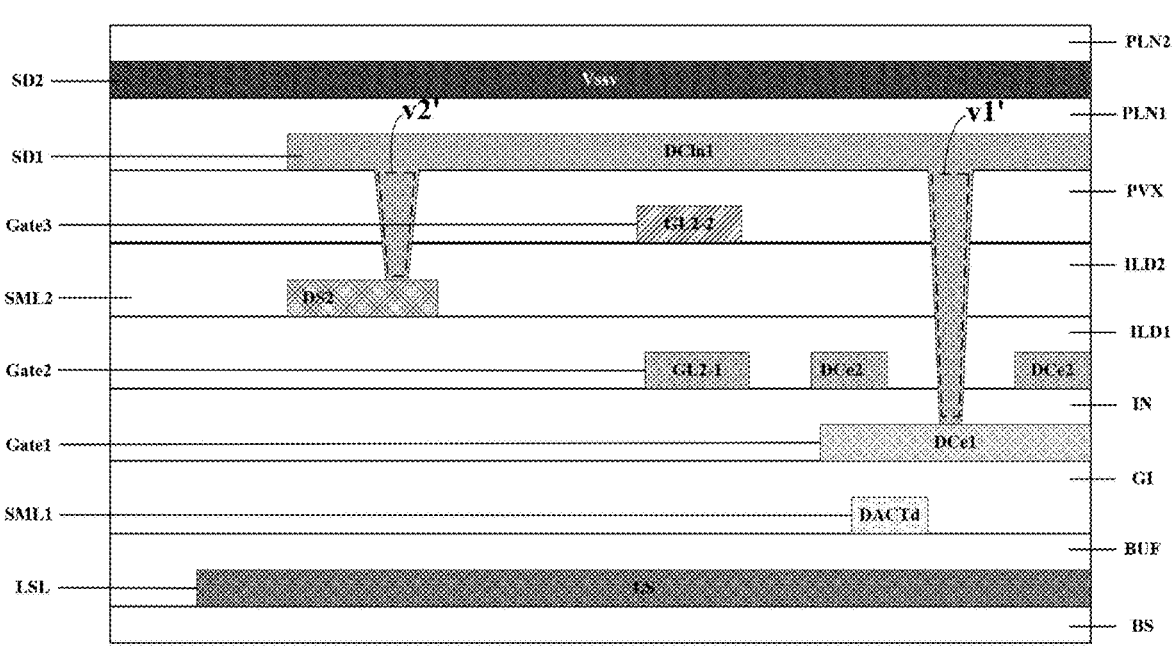
FIG. 6A is a cross-sectional view along an F-F' line in FIG. 5.
Figure 6B:
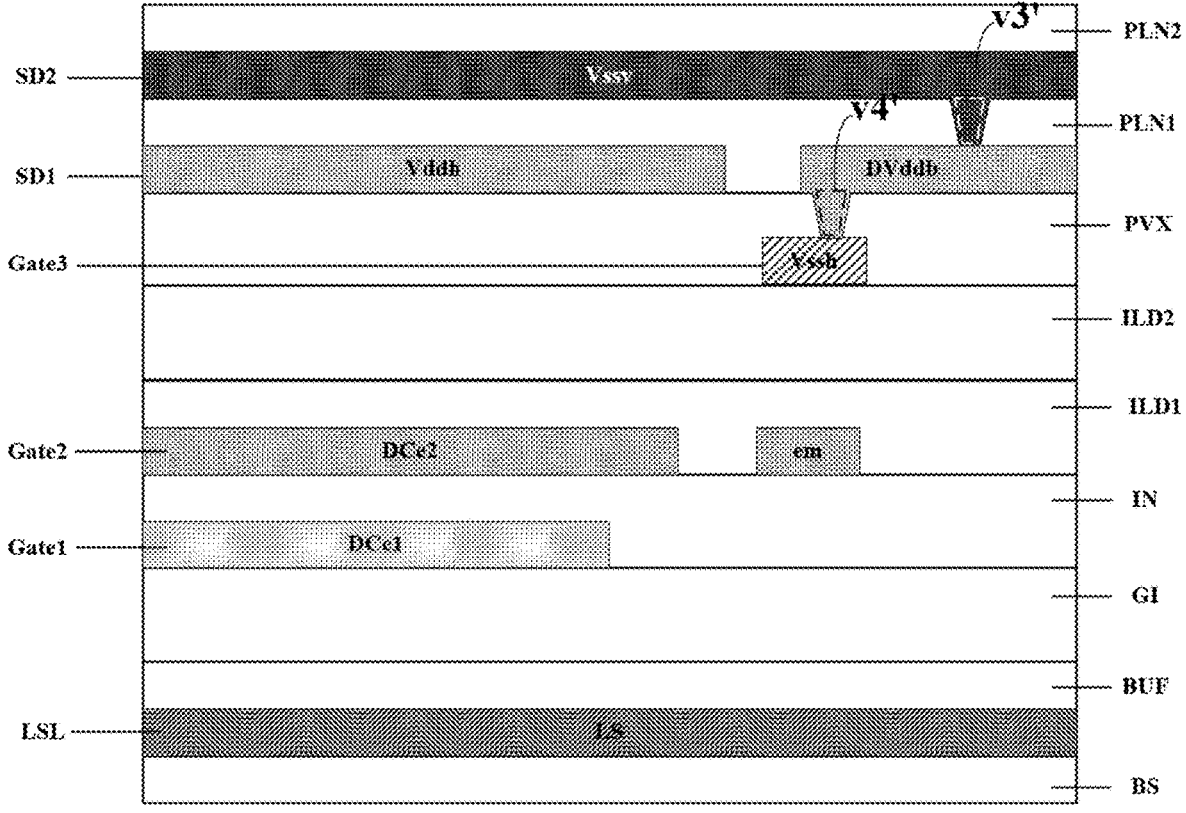
FIG. 6B is a cross-sectional view along a G-G' line in FIG. 5.
Figure 6C:
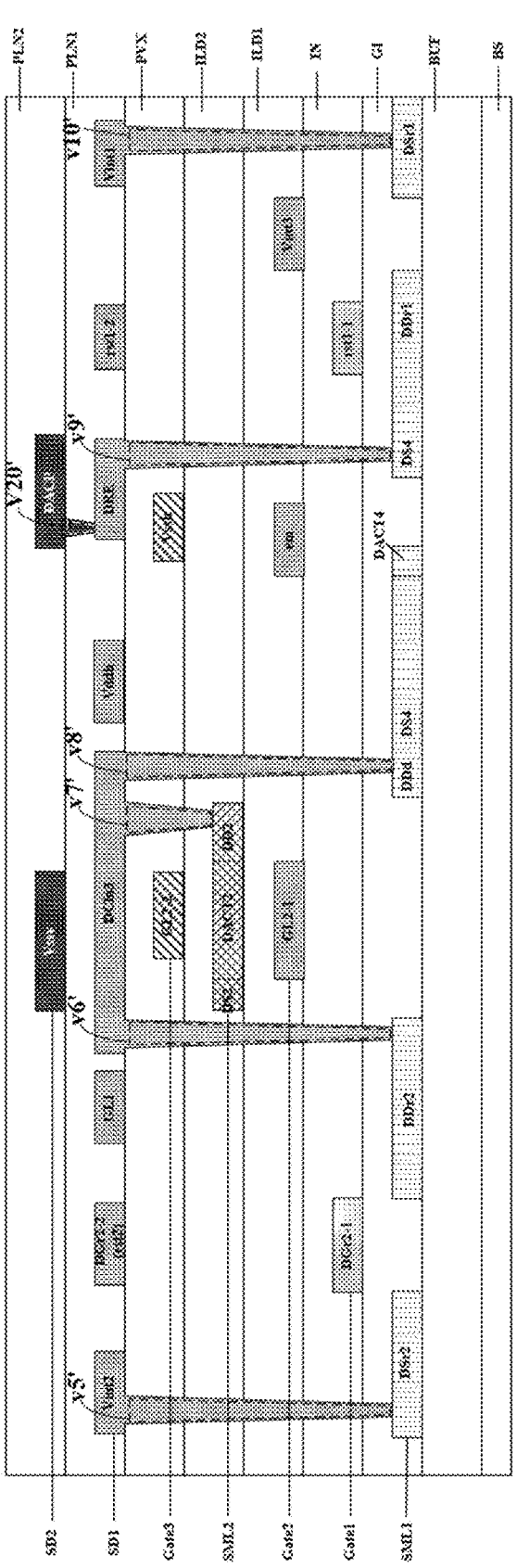
FIG. 6C is a cross-sectional view along an H-H' line in FIG. 5.
Figure 6D:
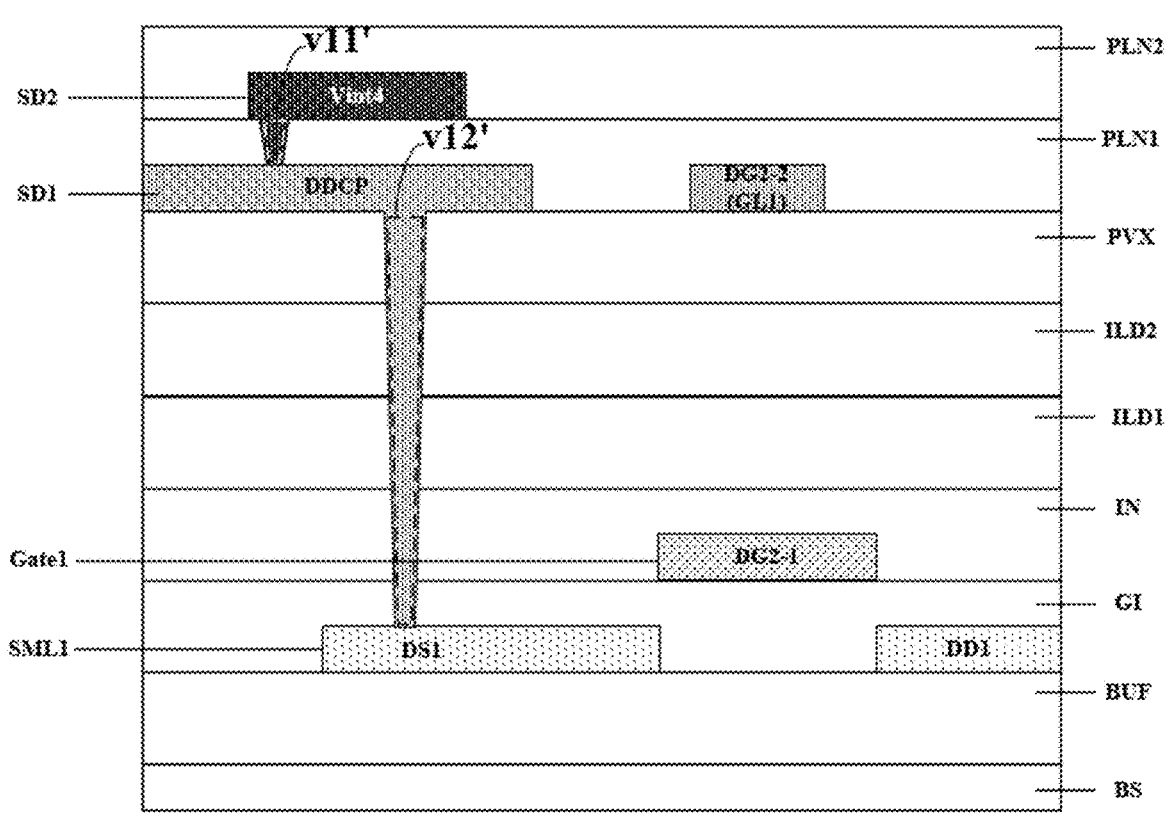
FIG. 6D is a cross-sectional view along an I-I' line in FIG. 5.
Figure 6E:
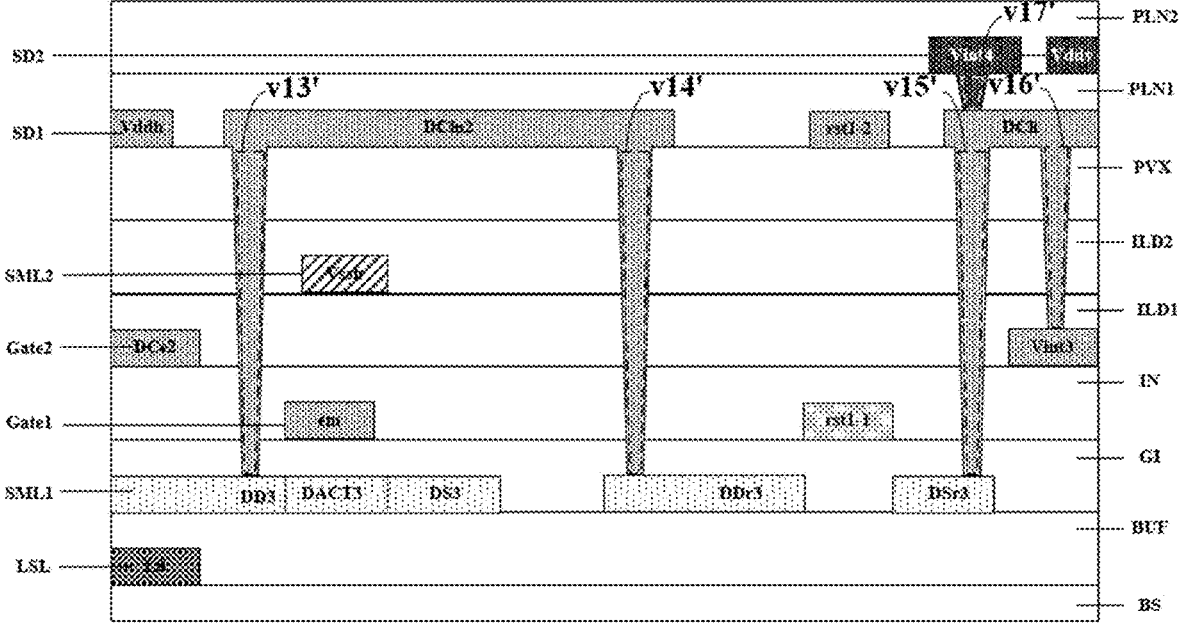
FIG. 6E is a cross-sectional view along a J-J' line in FIG. 5.

FIG. 5 is a diagram illustrating the structure of pixel driving circuits and dummy circuits in an array substrate in some embodiments according to the present disclosure. FIG. 6A is a cross-sectional view along an F-F' line in FIG. 5. FIG. 6B is a cross-sectional view along a G-G' line in FIG. 5. FIG. 6C is a cross-sectional view along an H-H' line in FIG. 5. FIG. 6D is a cross-sectional view along an I-I' line in FIG. 5. FIG. 6E is a cross-sectional view along a J-J line in FIG. 5.

Figure 7A:
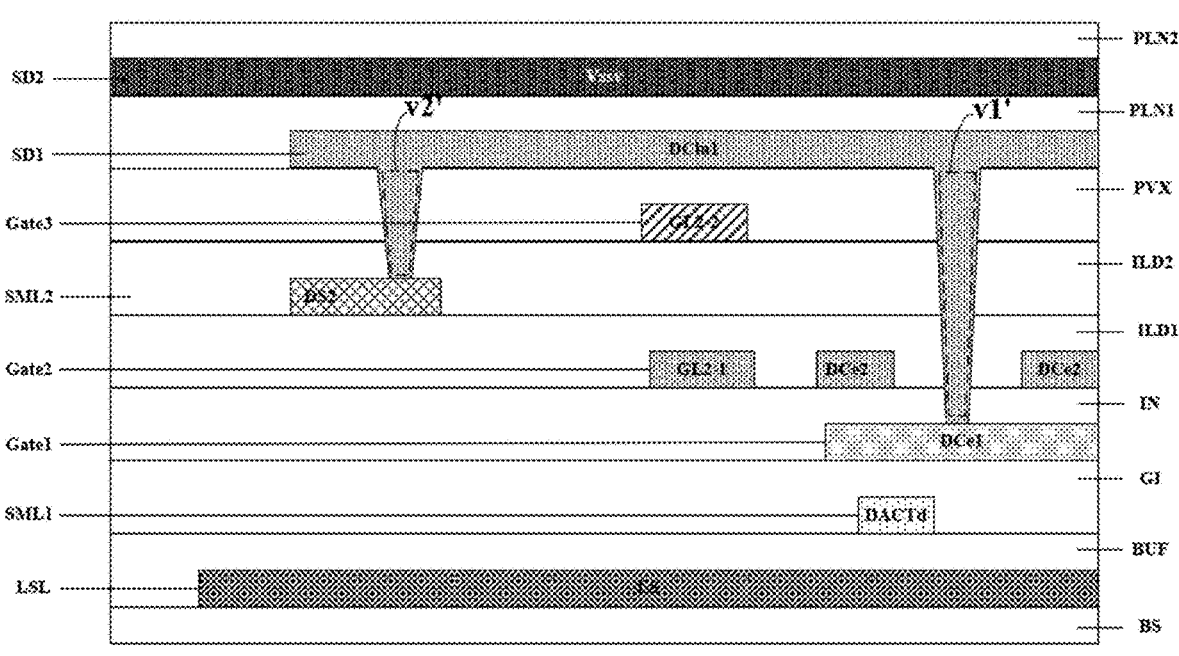
FIG. 7A is a cross-sectional view along a K-K' line in FIG. 5.
Figure 7B:
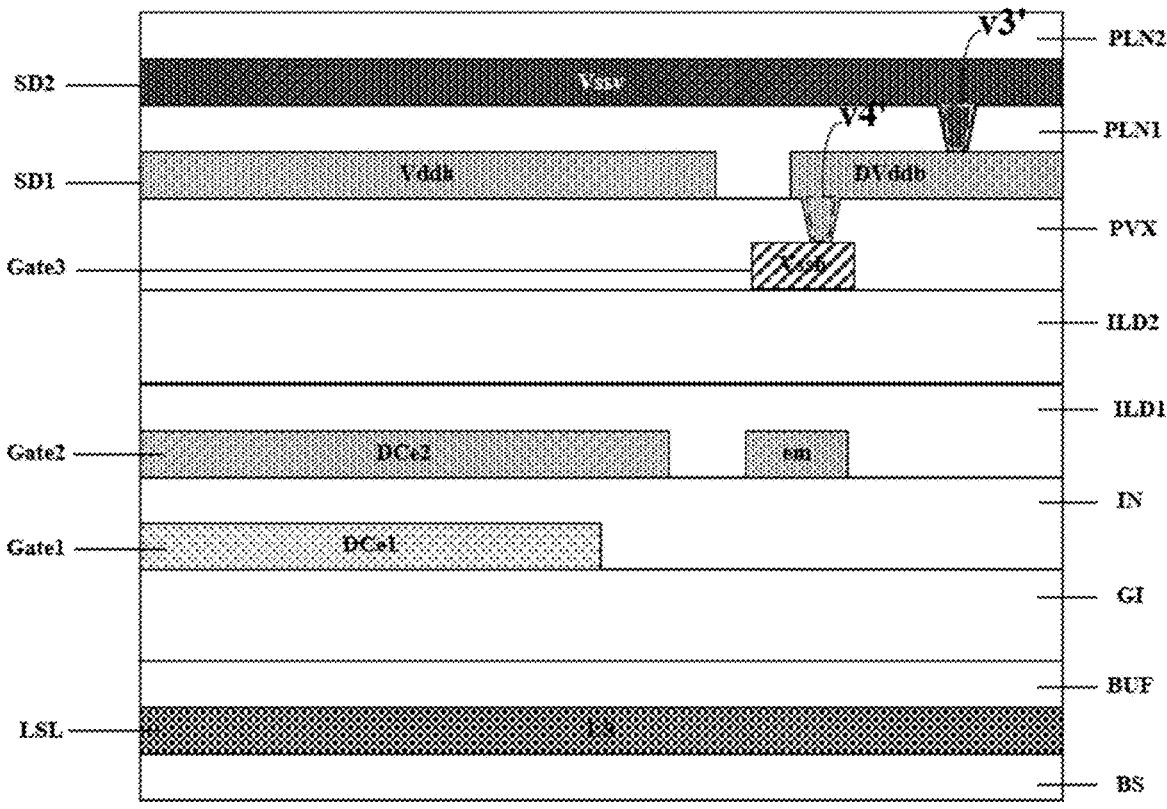
FIG. 7B is a cross-sectional view along an L-L' line in FIG. 5.
Figure 7C:
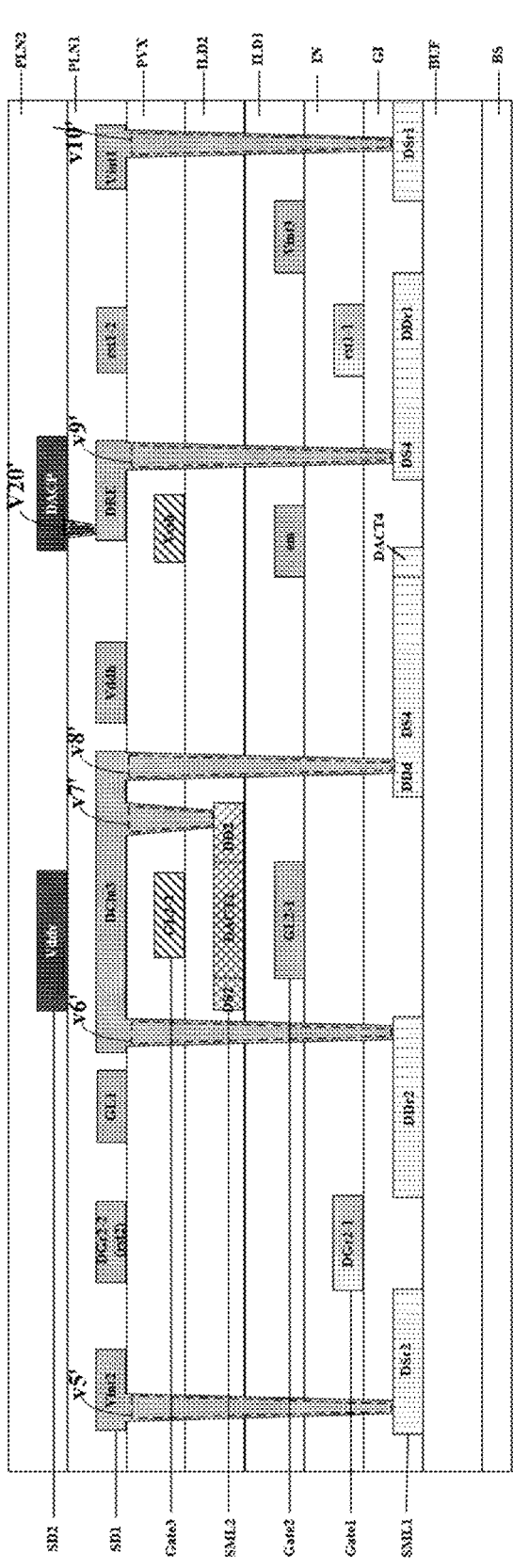
FIG. 7C is a cross-sectional view along an M-M' line in FIG. 5.
Figure 7D:
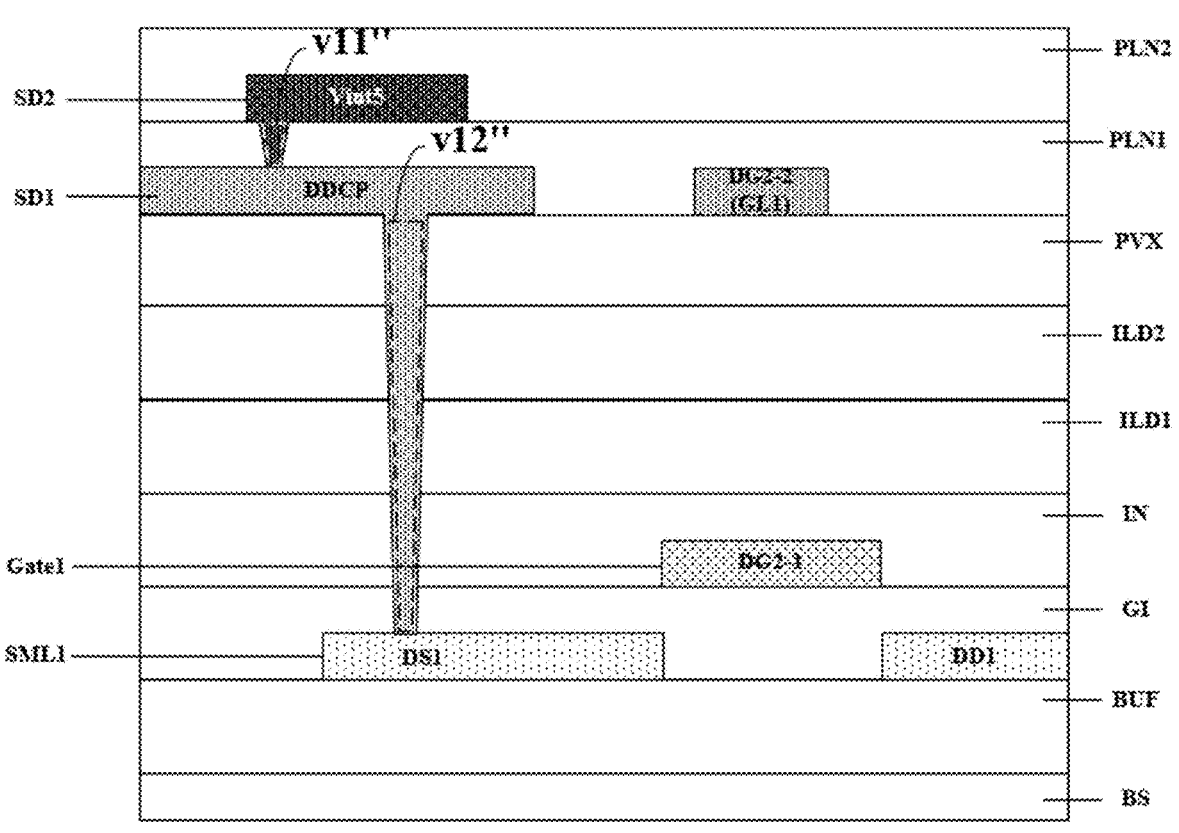
FIG. 7D is a cross-sectional view along an N-N' line in FIG. 5.
Figure 7E:
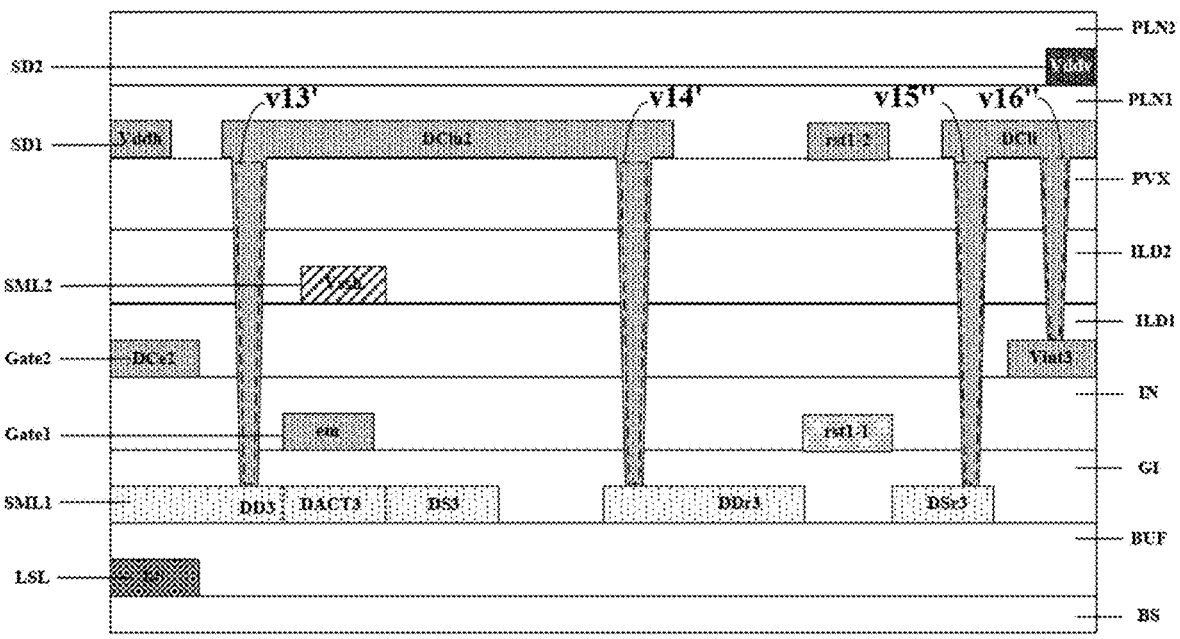
FIG. 7E is a cross-sectional view along an O-O' line in FIG. 5.
Figure 7F:
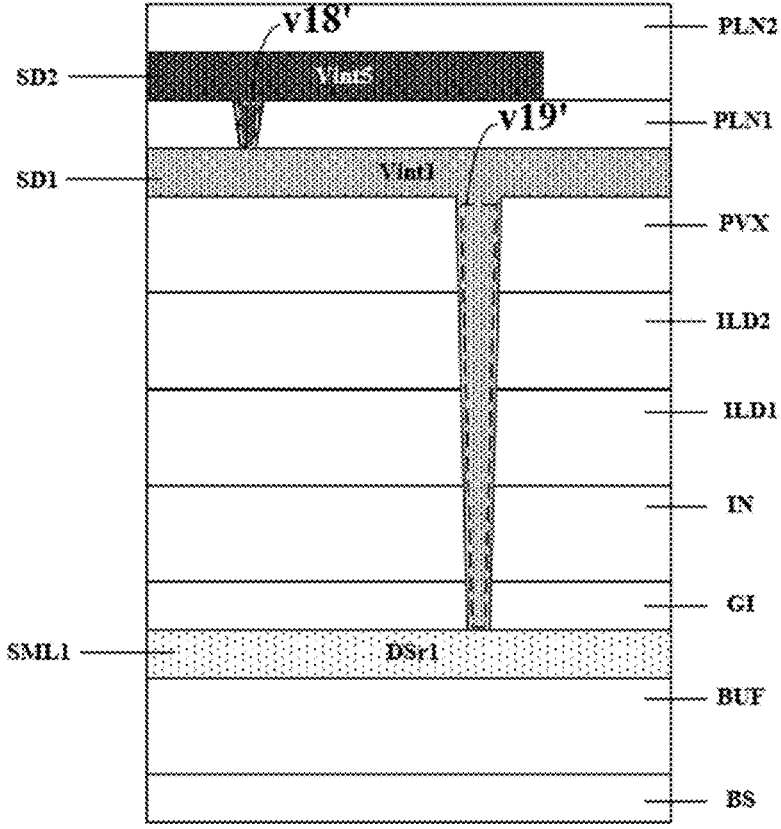
FIG. 7F is a cross-sectional view along a P-P' line in FIG. 5.

FIG. 7A is a cross-sectional view along a K-K' line in FIG. 5. FIG. 7B is a cross-sectional view along an L-L' line in FIG. 5. FIG. 7C is a cross-sectional view along an M-M' line in FIG. 5. FIG. 7D is a cross-sectional view along an N-N' line in FIG. 5. FIG. 7E is a cross-sectional view along an O-O' line in FIG. 5. FIG. 7F is a cross-sectional view along a P-P' line in FIG. 5.

Referring to FIG. 3A to FIG. 3L, FIG. 4A to FIG. 4E, FIG. 5, FIG. 6A to FIG. 6E, and FIG. 7A to FIG. 7F, the array substrate in some embodiments includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer GI on a side of the first semiconductor material layer SML1 away from the base substrate BS, a first gate metal layer Gate1 on a side of the gate insulating layer GI away from the first semiconductor material layer SML1, an insulating layer IN on a side of the first gate metal layer Gate1 away from the gate insulating layer GI, a second gate metal layer Gate2 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate3 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the third gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, and a second planarization layer PLN2 on a side of the second signal line layer SD2 away from the first planarization layer PLN1.

Referring to FIG. 2A, FIG. 3A, FIG. 3C, FIG. 4A, FIG. 4B, and FIG. 4E, FIG. 5, FIG. 6A, FIG. 6B, FIG. 6E, FIG. 7A, FIG. 7B, and FIG. 7E, in some embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum, chromium, tungsten, titanium, tantalum, molybdenum, copper, and alloys or laminates containing the same.

Referring to FIG. 2A, FIG. 3A, FIG. 3D, FIG. 4A to FIG. 4E, the first semiconductor material layer SML1 in some embodiments includes at least active layers of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of first electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 includes active layers, first electrodes, and second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

Referring to FIG. 2A, FIG. 3A, FIG. 3D, FIG. 5, FIG. 6A to FIG. 6E, and FIG. 7A to FIG. 7F, the first semiconductor material layer SML1 in some embodiments includes at least dummy active layers of multiple dummy transistors of the dummy circuit, including the dummy third transistor DT3, the dummy fourth transistor DT4, and the dummy driving transistor DTd. In some embodiments, a dummy first electrode and a dummy second electrode in each of the dummy first transistor DT1, the dummy first reset transistor DTr1, the dummy second reset transistor DTr2, and the dummy third reset transistor DTr3 are insulated from each other without a semiconductive material connecting them. In one particular example, each of the dummy first transistor DT1, the dummy first reset transistor DTr1, the dummy second reset transistor DTr2, and the dummy third reset transistor DTr3 lacks a dummy active layer. Optionally, the first semiconductor material layer SML1 further includes at least respective portions of dummy first electrodes of multiple dummy transistors of the dummy circuit, including the dummy first transistor DT1, the dummy third transistor DT3, the dummy fourth transistor DT4, the dummy first reset transistor DTr1, the dummy second reset transistor DTr2, the dummy third reset transistor DTr3, and the dummy driving transistor DTd. Optionally, the first semiconductor material layer SML1 further includes at least respective portions of dummy second electrodes of multiple dummy transistors of the dummy circuit, including the dummy first transistor DT1, the dummy third transistor DT3, the dummy fourth transistor DT4, the dummy first reset transistor DTr1, the dummy second reset transistor DTr2, the dummy third reset transistor DTr3, and the dummy driving transistor DTd.

In FIG. 3D, a pixel driving circuit corresponding to PDC1 in FIG. 3B is annotated with labels indicating components of each of multiple transistors (T1, T3, T4, Tr1, Tr2, Tr3, and Td) in the pixel driving circuit. For example, the first transistor T1 includes an active layer ACT1, a first electrode S1, and a second electrode D1. The third transistor T3 includes an active layer ACT3, a first electrode S3, and a second electrode D3. The fourth transistor T4 includes an active layer ACT4, a first electrode S4, and a second electrode D4. The first reset transistor Tr1 includes an active layer ACTr1, a first electrode Sr1, and a second electrode Dr1. The second reset transistor Tr2 includes an active layer ACTr2, a first electrode St2, and a second electrode Dr2. The third reset transistor Tr3 includes an active layer ACTr3, a first electrode Sr3, and a second electrode Dr3. The driving transistor Td includes an active layer ACTd, a first electrode Sd, and a second electrode Dd.

Optionally, the active layers (ACT1, ACT3, ACT4, ACTr1, ACTr2, ACTr3, and ACTd), the first electrodes (S1, S3, S4, Sr1, Sr2, Sr3, and Sd), and the second electrodes (D1, D3, D4, Dr1, Dr2, Dr3, and Dd) of the respective transistors (T1, T3, T4, Tr1, Tr2, Tr3, and Td) are in a same layer.

In some embodiments, the active layers (ACT1, ACT3, ACT4, ACTr1, and ACTd), at least portions of the first electrodes (S1, S3, S4, Sr1, and Sd), and at least portions of the second electrodes (D1, D3, D4, Dr1, and Dd) of multiple transistors (T1, T3, T4, Tr1, and Td) in the pixel driving circuit are parts of a unitary structure, Optionally, a part of the second reset transistor Tr2 (ACTr2, Sr2, Dr2) in the first semiconductor material layer is spaced apart from the unitary structure (T1, T3, T4, Tr1, and Td) in a same pixel driving circuit. Optionally, a part of the third reset transistor Tr3 (ACTr3, St3, Dr3) in the first semiconductor material layer is spaced apart from the unitary structure (T1, T3, T4, Tr1, and Td) in a same pixel driving circuit.

In FIG. 3D, a dummy circuit corresponding to DC2 in FIG. 3B is annotated with labels indicating components of each of multiple dummy transistors (DT1, DT3, DT4, DTr1, DTr2, DTr3, and DTd) in the dummy circuit. For example, the dummy first transistor DT1 includes a dummy first electrode DS1 and a dummy second electrode DD1. The dummy third transistor DT3 includes a dummy active layer DACT3, a dummy first electrode DS3, and a dummy second electrode DD3. The dummy fourth transistor DT4 includes a dummy active layer DACT4, a dummy first electrode DS4, and a dummy second electrode DD4. The dummy first reset transistor DTr1 includes a dummy first electrode DSr1 and a dummy second electrode DDr1. The dummy second reset transistor DTr2 includes a dummy first electrode DSr2 and a dummy second electrode DDr2. The dummy third reset transistor DTr3 includes a dummy first electrode DSr3 and a dummy second electrode DDr3. The dummy driving transistor DTd includes a dummy active layer DACTd, a dummy first electrode DSd, and a dummy second electrode DDd.

In some embodiments as shown in FIG. 3D, a dummy first electrode and a dummy second electrode of the dummy first transistor DT1 are insulated from each other without a semiconductive material connecting them; a dummy first electrode and a dummy second electrode in the dummy first reset transistor DTr1 are insulated from each other without a semiconductive material connecting them; a dummy first electrode and a dummy second electrode in the dummy second reset transistor DTr2 are insulated from each other without a semiconductive material connecting them; and a dummy first electrode and a dummy second electrode in the dummy third reset transistor DTr3 are insulated from each other without a semiconductive material connecting them. In one particular example as shown in FIG. 3D, the dummy first transistor DT1 lacks a dummy active layer (e.g., lacks a portion corresponding to ACT1 in the pixel driving circuit); the dummy first reset transistor DTr1 lacks a dummy active layer (e.g., lacks a portion corresponding to ACTr1 in the pixel driving circuit); the dummy second reset transistor DTr2 lacks a dummy active layer (e.g., lacks a portion corresponding to ACTr2 in the pixel driving circuit); and the dummy third reset transistor DTr3 lacks a dummy active layer (e.g., lacks a portion corresponding to ACTr3 in the pixel driving circuit).

By electrically disconnecting the dummy first electrode from the dummy second electrode in the dummy first transistor DT1, electrically disconnecting the dummy first electrode from the dummy second electrode in the dummy first reset transistor DTr1, electrically disconnecting the dummy first electrode from the dummy second electrode in the dummy second reset transistor DTr2, and electrically disconnecting the dummy first electrode from the dummy second electrode in the dummy third reset transistor DTr3, nodes N2, N3, and N4 are electrically isolated from input signals provided by the respective data line DL, the respective first reset signal line Vint1, the respective second reset signal line Vint2, and the respective third reset signal line Vint3. The inventors of the present disclosure discover that this structure of the dummy circuit effectively avoid short circuit and inadvertent signal charging in the array substrate.

Referring to FIG. 2A, FIG. 3A, FIG. 3B, FIG. 4A to FIG. 4B, FIG. 5, FIG. 6A to FIG. 6E, and FIG. 7A to FIG. 7F, the first gate metal layer Gate1 in some embodiments includes at least portions of a plurality of first reset control signal lines (e.g., a respective first reset control signal line first branch rst1-1), a plurality of light emitting control signal lines (e.g. a respective light emitting control signal line em), a first gate pad GP1 in the pixel driving circuit, a second gate pad GP2 in the pixel driving circuit, a dummy first gate pad DGP1 in the dummy circuit, a dummy second gate pad DGP2 in the dummy circuit, a first capacitor electrode Ce1 of the storage capacitor Cst in the pixel driving circuit, and a dummy first capacitor electrode DCe1 of a dummy storage capacitor in a dummy circuit.

In some embodiments, a respective first reset control signal line includes multiple branches respectively in multiple layers. In one example, the respective first reset control signal line includes a respective first reset control signal line first branch rst1-1 in the first gate metal layer Gate1 (as shown in FIG. 3E) and a respective first reset control signal line second branch rst1-2 in the first signal line layer SD1 (as shown in FIG. 3J). Optionally, an orthographic projection of the respective first reset control signal line first branch rst1-1 on a base substrate BS at least partially (e.g., at least 80%, at least 85%, at least 90%, at least 95%, at least 98%, or at least 99%) overlaps with an orthographic projection of the respective first reset control signal line second branch rst1-2 on the base substrate BS.

Various appropriate electrode materials and various appropriate fabricating methods may be used to make the first gate metal layer Gate1. For example, a conductive material may be deposited on the substrate by a plasma-enhanced chemical vapor deposition (PECVD) process and patterned. Examples of appropriate conductive materials for making the first gate metal layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the at least portions of the plurality of first reset control signal lines (e.g., the respective first reset control signal line first branch rst1-1), the plurality of light emitting control signal lines (e.g., the respective light emitting control signal line em), the first gate pad GP1 in the pixel driving circuit, the second gate pad GP2 in the pixel driving circuit, the dummy first gate pad DGP1 in the dummy circuit, the dummy second gate pad DGP2 in the dummy circuit, the first capacitor electrode Ce1 of the storage capacitor Cst in the pixel driving circuit, and the dummy first capacitor electrode DCe1 of a dummy storage capacitor in a dummy circuit are in a same layer.

As used herein, the term "same layer" refers to the relationship between the layers simultaneously formed in the same step. In one example, the plurality of light emitting control signal lines and the first capacitor electrode Ce1 are in a same layer when they are formed as a result of one or more steps of a same patterning process performed in a same layer of material. In another example, the plurality of light emitting control signal lines and the first capacitor electrode Ce1 can be formed in a same layer by simultaneously performing the step of forming the plurality of light emitting control signal lines, and the step of forming the first capacitor electrode Ce1. The term "same layer" does not always mean that the thickness of the layer or the height of the layer in a cross-sectional view is the same.

In some embodiments, the second transistor T2 is a double-gate transistor comprising a first gate electrode portion G2-1 of the second transistor T2 in the first gate metal layer Gate1 (as shown in FIG. 3E) and a second gate electrode portion G2-2 of the second transistor T2 in the first signal line layer SD1 (as shown in FIG. 3J). Optionally, an orthographic projection of the first gate electrode portion G2-1 of the second transistor T2 on a base substrate BS at least partially (e.g., at least 80%, at least 85%, at least 90%, at least 95%, at least 98%, or at least 99%) overlaps with an orthographic projection of the second gate electrode portion G2-2 of the second transistor T2 on the base substrate BS.

In some embodiments, the first gate pad GP1 in the pixel driving circuit includes the first gate electrode portion G2-1 of the second transistor T2 in the pixel driving circuit. Optionally, the first gate electrode portion G2-1 of the second transistor T2 and the second gate electrode portion G2-2 of the second transistor T2 are electrically connected to each other. Optionally, the second gate electrode portion G2-2 of the second transistor T2 is a part of a respective first gate line GL1 of a plurality of first gate lines in the first signal line layer SD1.

In some embodiments, the dummy second transistor DT2 is a dummy double-gate transistor comprising a dummy first gate electrode portion DG2-1 of the dummy second transistor DT2 in the first gate metal layer Gate1 (as shown in FIG.

3E) and a dummy second gate electrode portion DG2-2 of the dummy second transistor DT2 in the first signal line layer SD1 (as shown in FIG. 3J). Optionally, an orthographic projection of the dummy first gate electrode portion DG2-1 of the dummy second transistor DT2 on a base substrate BS at least partially (e.g., at least 80%, at least 85%, at least 90%, at least 95%, at least 98%, or at least 99%) overlaps with an orthographic projection of the dummy second gate electrode portion DG2-2 of the dummy second transistor DT2 on the base substrate BS.

In some embodiments, the dummy first gate pad DGP1 in the dummy circuit includes the dummy first gate electrode portion DG2-1 of the dummy second transistor DT2 in the dummy circuit. Optionally, the dummy first gate electrode portion DG2-1 of the dummy second transistor DT2 and the dummy second gate electrode portion DG2-2 of the dummy second transistor DT2 are electrically connected to each other. Optionally, the dummy second gate electrode portion DG2-2 of the dummy second transistor DT2 is a part of a respective first gate line GL1 of a plurality of first gate lines in the first signal line layer SD1.

In some embodiments, the second reset transistor Tr2 is a double-gate transistor comprising a first gate electrode portion Gr2-1 of the second reset transistor Tr2 in the first gate metal layer Gate1 (as shown in FIG. 3E) and a second gate electrode portion Gr2-2 of the second reset transistor Tr2 in the first signal line layer SD1 (as shown in FIG. 3J). Optionally, an orthographic projection of the first gate electrode portion Gr2-1 of the second reset transistor Tr2 on a base substrate BS at least partially (e.g., at least 80%, at least 85%, at least 90%, at least 95%, at least 98%, or at least 99%) overlaps with an orthographic projection of the second gate electrode portion Gr2-2 of the second reset transistor Tr2 on the base substrate BS.

In some embodiments, the second gate pad GP2 in the pixel driving circuit includes the first gate electrode portion Gr2-1 of the second reset transistor Tr2 in the pixel driving circuit. Optionally, the first gate electrode portion Gr2-1 of the second reset transistor Tr2 and the second gate electrode portion Gr2-2 of the second reset transistor Tr2 are electrically connected to each other. Optionally, the second gate electrode portion Gr2-2 of the second reset transistor Tr2 is a part of a respective second reset control signal line rst2 of a plurality of second reset control signal lines in the first signal line layer SD1.

In some embodiments, the dummy second reset transistor DTr2 is a dummy double-gate transistor comprising a dummy first gate electrode portion DGr2-1 of the dummy second reset transistor DTr2 in the first gate metal layer Gate1 (as shown in FIG. 3E) and a dummy second gate electrode portion DGr2-2 of the dummy second reset transistor DTr2 in the first signal line layer SD1 (as shown in FIG. 3J). Optionally, an orthographic projection of the dummy first gate electrode portion DGr2-1 of the dummy second reset transistor DTr2 on a base substrate BS at least partially (e.g., at least 80%, at least 85%, at least 90%, at least 95%, at least 98%, or at least 99%) overlaps with an orthographic projection of the dummy second gate electrode portion DGr2-2 of the dummy second reset transistor DTr2 on the base substrate BS.

In some embodiments, the dummy second gate pad DGP2 in the dummy circuit includes the dummy first gate electrode portion DGr2-1 of the dummy second reset transistor DT2 in the dummy circuit. Optionally, the dummy first gate electrode portion DGt2-1 of the dummy second reset transistor DTr2 and the dummy second gate electrode portion DGr2-2 of the dummy second reset transistor DTr2 are electrically connected to each other. Optionally, the dummy second gate electrode portion DGr2-2 of the dummy second reset transistor DTr2 is a part of a respective second reset control signal line rst2 of a plurality of second reset control signal lines in the first signal line layer SD1.

In some embodiments, the first gate pad GP1 further includes a third capacitor electrode Ce3. Referring to FIG. 3G, in some embodiments, the second semiconductor material layer SML2 includes a fourth capacitor electrode Ce4. Optionally, the fourth capacitor electrode Ce4 and the active layer ACT2 of the second transistor T2 in the pixel driving circuit are parts of a unitary structure. Optionally, an orthographic projection of the third capacitor electrode Ce3 on a base substrate BS at least partially (e.g., at least 80%, at least 85%, at least 90%, at least 95%, at least 98%, or at least 99%) overlaps with an orthographic projection of the fourth capacitor electrode Ce4 on the base substrate BS.

In some embodiments, the third capacitor electrode Ce3, the fourth capacitor electrode Ce4, and insulating layers (e.g., the insulating layer IN and the first inter-layer dielectric layer ILD1) between the third capacitor electrode Ce3 and the fourth capacitor electrode Ce4 form a capacitor. The inventors of the present disclosure discover that the capacitor stabilizes voltage level when the array substrate is in a dark state.

Referring to FIG. 3A, FIG. 3G, FIG. 3J, FIG. 6A, and FIG. 7A, in the dummy circuit, an orthographic projection of the dummy first gate pad DGP1 on a base substrate BS is substantially non-overlapping (e.g., at least 80% non-overlapping, at least 90% non-overlapping, at least 95% non-overlapping, at least 99% non-overlapping, or completely non-overlapping) with an orthographic projection of the second semiconductor material layer SML2 on the base substrate BS. Optionally, the dummy circuit does not have the third capacitor electrode Ce3 and does not have the fourth capacitor electrode Ce4.

In some embodiments, the dummy second electrode DS2 (e.g., corresponding to the node N1 in FIG. 2A) of the dummy second transistor DT2 is connected to a dummy first node connecting line DCln1 in the first signal line layer SD1 (see, e.g., FIG. 6A and FIG. 7A), the dummy first electrode DD2 of the dummy second transistor DT2 is connected to a dummy third node connecting line DCln3 in the first signal line layer SD1 (see, e.g., FIG. 6C and FIG. 7C). The dummy first node connecting line DCln1 and the dummy third node connecting line DCln3 are parts of a respective first voltage supply line Vddh of a plurality of first voltage supply lines. Thus, the dummy second electrode DS2 (e.g., corresponding to the node N1 in FIG. 2A) is configured to receive a voltage supply signal from the respective first voltage supply line Vddh. The inventors of the present disclosure discover that, by having the dummy circuit absent of the third capacitor electrode Ce3 and does not have the fourth capacitor electrode Ce4, interference of the voltage supply signal from the respective first voltage supply line Vddh to a respective first gate line GL1 of a plurality of first gate lines can be avoided.

Referring to FIG. 2A, FIG. 3A, FIG. 3F, FIG. 4A to FIG. 4E, FIG. 5, FIG. 6A to FIG. 6E, and FIG. 7A to FIG. 7F, the second gate metal layer Gate2 in some embodiments includes at least portions of a plurality of second gate lines (e.g., a respective second gate line first branch GL2-1), a plurality of third reset signal lines (e.g., a respective third reset signal Vint3), a second capacitor electrode Ce2 of the storage capacitor Cst in the pixel driving circuit, and a dummy second capacitor electrode DCe2 of a dummy storage capacitor in the dummy circuit. Various appropriate electrode materials and various appropriate fabricating methods may be used to make the second gate metal layer Gate2. For example, a conductive material may be deposited on the substrate by a plasma-enhanced chemical vapor deposition (PECVD) process and patterned. Examples of appropriate conductive materials for making the second gate metal layer Gate2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the at least portions of the plurality of second gate lines (e.g., a respective second gate line first branch GL2-1), the plurality of third reset signal lines (e.g., the respective third reset signal Vint3), the second capacitor electrode Ce2 of the storage capacitor Cst in the pixel driving circuit, and the dummy second capacitor electrode DCe2 of the dummy storage capacitor in the dummy circuit are in a same layer.

Referring to FIG. 3F, a plurality of second capacitor electrodes in a plurality of pixel driving circuits and a plurality of dummy second capacitor electrodes in a plurality of dummy circuits are spaced apart from each other. The inventors of the present disclosure discover that the structure is conducive in reducing parasitic capacitance between the plurality of second capacitor electrodes and the second electrode Dd of the driving transistor Td (e.g., the node N3), preventing occurrence of short-term residual image when the array substrate is in a display mode. Optionally, referring to FIG. 3A, FIG. 3F, FIG. 4A to FIG. 4E, FIG. 5, FIG. 6A to FIG. 6E, and FIG. 7A to FIG. 7F, an orthographic projection of the second gate metal layer Gate2 (including the second capacitor electrode Ce2) on a base substrate BS is substantially non-overlapping (e.g., at least 80% non-overlapping, at least 90% non-overlapping, at least 95% non-overlapping, at least 99% non-overlapping, or completely non-overlapping) with an orthographic projection of the second electrode Dd of the driving transistor Td on the base substrate BS.

In alternative embodiments, the plurality of second capacitor electrodes in the plurality of pixel driving circuits and the plurality of dummy second capacitor electrodes in the plurality of dummy circuits are connected to each other, and are parts of a unitary structure. By having second capacitor electrodes connected to each other, a resistance of a respective first voltage supply line Vddh can be reduced because the second capacitor electrodes are electrically connected to the respective first voltage supply line Vddh. The inventors of the present disclosure discover that this structure improves display uniformity in the array substrate.

Referring to FIG. 2A, FIG. 3A, FIG. 3G, FIG. 4A to FIG. 4E, FIG. 5, FIG. 6A to FIG. 6E, and FIG. 7A to FIG. 7F, the second semiconductor material layer SML2 in some embodiments includes at least an active layer ACT2 of the second transistor T2 in the pixel driving circuit and at least a dummy active layer DACT2 of the dummy second transistor DT2 in the dummy circuit. Optionally, the second semiconductor material layer SML2 further includes at least a portion of a first electrode S2 of the second transistor T2 in the pixel driving circuit and at least a portion of a dummy first electrode DS2 of the dummy second transistor DT2 in the dummy circuit. Optionally, the second semiconductor material layer SML2 further includes at least a portion of a second electrode D2 of the second transistor T2 in the pixel driving circuit and at least a portion of a dummy second electrode DD2 of the dummy second transistor DT2 in the dummy circuit. Optionally, the second semiconductor material layer SML2 includes the active layer ACT2, the first electrode S2, and the second electrode D2 of the second transistor T2, and the dummy active layer DACT2, the dummy first electrode DS2, and the dummy second electrode DD2 of the dummy second transistor DT2. In the present array substrate, at least the active layer ACT2 of the second transistor T2 are in a layer different from at least the active layers of other transistors of the pixel driving circuit, and at least the dummy active layer DACT2 of the dummy second transistor DT2 are in a layer different from at least the dummy active layers of other dummy transistors of the dummy circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

In FIG. 3G, a pixel driving circuit corresponding to PDC1 in FIG. 3B and a dummy circuit corresponding to DC2 in FIG. 3B are annotated with labels indicating components of the second transistor in the pixel driving circuit and the dummy second transistor DT2 in the dummy circuit. For example, the second transistor T2 includes an active layer ACT2, a first electrode S2, and a second electrode D2; and the dummy second transistor DT2 includes a dummy active layer DACT2, a dummy first electrode DS2, and a dummy second electrode DD2, Optionally, the active layer ACT2, the first electrode S2, and the second electrode D2 of the second transistor T2 are in a same layer. Optionally, the dummy active layer DACT2, the dummy first electrode DS2, and the dummy second electrode DD2 of the dummy second transistor DT2 are in a same layer.

Referring to FIG. 2A, FIG. 3A, FIG. 3H, FIG. 4A to FIG. 4E, FIG. 5, FIG. 6A to FIG. 6E, and FIG. 7A to FIG. 7F, the third gate metal layer Gate3 in some embodiments includes at least portions of a plurality of second gate lines (e.g., a respective second gate line second branch GL2-2), and a plurality of second voltage supply lines (e.g., a respective second voltage supply line Vssh). Various appropriate electrode materials and various appropriate fabricating methods may be used to make the third gate metal layer Gate3. For example, a conductive material may be deposited on the substrate by a plasma-enhanced chemical vapor deposition (PECVD) process and patterned. Examples of appropriate conductive materials for making the third gate metal layer Gate3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the respective first voltage supply line Vddh is configured to provide a first reference voltage signal (e.g., a high reference voltage signal); and the respective second voltage supply line Vssh is configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Vias extending through the passivation layer PVX are depicted in FIG. 3I.

Referring to FIG. 2A, FIG. 3A, FIG. 3J, FIG. 4A to FIG. 4B, FIG. 5, FIG. 6A to FIG. 6E, and FIG. 7A to FIG. 7F, the first signal line layer SD1 in some embodiments includes a plurality of second reset signal lines (e.g., a respective second reset signal line Vint2); a plurality of second reset control signal lines (e.g., a respective second reset control signal line rst2); a plurality of first gate lines (e.g., a respective first gate line GL1); a plurality of first voltage supply lines (e.g., a respective first voltage supply line Vddh); at least portions of a plurality of first reset control signal lines (e.g., a respective first reset control signal line second branch rst1-2); a plurality of first reset signal lines (e.g., a respective first reset signal line Vint1); a signal connecting pad DCP in the pixel driving circuit; a dummy signal connecting pad DDCP in the dummy circuit; a first node connecting line Cln1 in the pixel driving circuit; a dummy first node connecting line DCln1 in the dummy circuit; a second node connecting line Cln2 in the pixel driving circuit; a dummy second node connecting line DCln2 in the dummy circuit; a third node connecting line Cln3 in the pixel driving circuit; a dummy third node connecting line DCln3 in the dummy circuit; a relay electrode RE in the pixel driving circuit; a dummy relay electrode DRE in the dummy circuit; a reset signal connecting line Cli in the pixel driving circuit; a dummy reset signal connecting line DCli in the dummy circuit; a voltage supply branch Vddb in the pixel driving circuit; and a dummy voltage supply branch DVddb in the dummy circuit.

Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Optionally, the plurality of second reset signal lines (e.g., the respective second reset signal line Vint2); the plurality of second reset control signal lines (e.g., the respective second reset control signal line rst2); the plurality of first gate lines (e.g., the respective first gate line GL1); the plurality of first voltage supply lines (e.g., the respective first voltage supply line Vddh); the at least portions of the plurality of first reset control signal lines (e.g., the respective first reset control signal line second branch rst1-2); the plurality of first reset signal lines (e.g., the respective first reset signal line Vint1); the signal connecting pad DCP in the pixel driving circuit; the dummy signal connecting pad DDCP in the dummy circuit; the first node connecting line Cln1 in the pixel driving circuit; the dummy first node connecting line DCln1 in the dummy circuit; the second node connecting line Cln2 in the pixel driving circuit; the dummy second node connecting line DCln2 in the dummy circuit; the third node connecting line Cln3 in the pixel driving circuit; the dummy third node connecting line DCln3 in the dummy circuit; the relay electrode RE in the pixel driving circuit; the dummy relay electrode DRE in the dummy circuit; the reset signal connecting line Cli in the pixel driving circuit; the dummy reset signal connecting line DCli in the dummy circuit; the voltage supply branch Vddb in the pixel driving circuit; and the dummy voltage supply branch DVddb in the dummy circuit are in a same layer.

In some embodiments, the first node connecting line Cln1 in the pixel driving circuit connects multiple components of the pixel driving circuit to the node N1. Referring to FIG. 4A, the first node connecting line Cln1 is connected to the first capacitor electrode Ce1 through a first via v1, and connected to the second transistor T2 (e.g., to the first electrode S2 of the second transistor T2) through a second via v2. Optionally, the first node connecting line Cln1 corresponds to the node N1 depicted in FIG. 2A.

In some embodiments, the dummy first node connecting line DCln1 in the dummy circuit connects multiple components of the dummy circuit together, Referring to FIG. 6A and FIG. 7A, the dummy first node connecting line DCln1 is connected to the dummy first capacitor electrode DCe1 through a dummy first via v1', and connected to the dummy second transistor DT2 (e.g., to the dummy first electrode DS2 of the dummy second transistor DT2) through a dummy second via v2'.

Referring to FIG. 2A, FIG. 3A, FIG. 3D, FIG. 3F, and FIG. 4A, in some embodiments, in a hole region H, a portion of the second capacitor electrode Ce2 is absent. Optionally, an orthographic projection of the second capacitor electrode Ce2 on a base substrate BS substantially (e.g., at least 80%, at least 85%, at least 90%, at least 95%, at least 98%, at least 99%, or 100%) covers, with a margin, an orthographic projection of the first capacitor electrode Ce1 on the base substrate BS except for the hole region H in which a portion of the second capacitor electrode Ce2 is absent. Optionally, the first via v1 extends through the passivation layer PVX, the second inter-layer dielectric layer ILD2, the first inter-layer dielectric layer ILD1, the hole region H, and the insulating layer IN.

Referring to FIG. 2A, FIG. 3A, FIG. 3D, FIG. 3F, FIG. 6A, and FIG. 7A, in some embodiments, in a dummy hole region H', a portion of the dummy second capacitor electrode DCe2 is absent. Optionally, an orthographic projection of the dummy second capacitor electrode DCe2 on a base substrate BS substantially (e.g., at least 80%, at least 85%, at least 90%, at least 95%, at least 98%, at least 99%, or 100%) covers, with a margin, an orthographic projection of the dummy first capacitor electrode DCe1 on the base substrate BS except for the dummy hole region H' in which a portion of the dummy second capacitor electrode DCe2 is absent. Optionally, the dummy first via v1' extends through the passivation layer PVX, the second inter-layer dielectric layer ILD2, the first inter-layer dielectric layer ILD1, the dummy hole region H', and the insulating layer IN.

In some embodiments, the first node connecting line Cln1 crosses over a respective second gate line of the plurality of second gate lines. As shown in FIG. 3A and FIG. 4A, the first node connecting line Cln1 crosses over the respective second gate line first branch GL2-1 in the second gate metal layer Gate2, and the respective second gate line second branch GL2-2 in the third gate metal layer Gate3.

In some embodiments, the dummy first node connecting line DCln1 crosses over a respective second gate line of the plurality of second gate lines. As shown in FIG. 3A, FIG. 6A, and FIG. 7A, the dummy first node connecting line DCln1 crosses over the respective second gate line first branch GL2-1 in the second gate metal layer Gate2, and the respective second gate line second branch GL2-2 in the third gate metal layer Gate3.

In some embodiments, the respective first gate line GL1 of the plurality of first gate lines includes the second gate electrode portion G2-2 of the second transistor T2 in the pixel driving circuit and the dummy second gate electrode portion DG2-2 of the dummy second transistor DT2 in the dummy circuit.

In some embodiments, the respective second reset control signal line rst2 of the plurality of second reset control signal lines includes the second gate electrode portion Gr2-2 of the second reset transistor Tr2 in the pixel driving circuit and the dummy second gate electrode portion DGr2-2 of the dummy second reset transistor DTr2 in the dummy circuit.

Referring to FIG. 3A, FIG. 3D, FIG. 3J, FIG. 3L, FIG. 4D, FIG. 6D, and FIG. 7D, the signal connecting pad DCP in the pixel driving circuit connects the respective data line DL to the first electrode S1 of the first transistor T1, data signals provided by the respective data line DL is transmitted to the first electrode S1 of the first transistor T1 through the signal connecting pad DCP.

Referring to FIG. 2A, FIG. 3A to FIG. 3L, FIG. 4A to FIG. 4E, FIG. 5, FIG. 6A to FIG. 6E, and FIG. 7A to FIG. 7F, in some embodiments, corresponding layers of the pixel driving circuit and corresponding layers of the dummy circuit have a substantial, but not necessarily identical, translational symmetry with respect to each other. A particular component in the pixel driving circuit and a corresponding component in the dummy circuit may have different structure features but the general layouts of the pixel driving circuit and the dummy circuit are the same. Optionally, by an operation of the substantial translational symmetry to move the pixel driving circuit to a position having the dummy circuit, the corresponding layers of the pixel driving circuit moved to the position having the dummy circuit substantially (at least 80%, at least 85%, at least 90%, at least 95%, or at least 99%) overlaps with the corresponding layers of the dummy circuit.

As used herein, the term "corresponding layers of the pixel driving circuit and corresponding layers of the dummy circuit" is not intended to include layers that are not parts of the pixel driving circuit or the dummy circuit. For example, the "corresponding layers of the pixel driving circuit and corresponding layers of the dummy circuit" do not include an anode layer or a pixel definition layer. In one example, the "corresponding layers of the pixel driving circuit and corresponding layers of the dummy circuit" refers to conductive layers of the pixel driving circuit and conductive layers of the dummy circuit. In one specific example, "corresponding layers" includes at least one of a first semiconductor material layer SML, a first gate metal layer Gate1, a second gate metal layer Gate2, a first signal line layer SD1, or a second signal line layer SD2. In another specific example, "corresponding layers" further includes at least one of a gate insulating layer GI, an insulating layer IN, an inter-layer dielectric layer ILD, a first planarization layer PLN1, or a second planarization layer PLN2.

In some embodiments, the signal connecting pad DCP in the pixel driving circuit and the dummy signal connecting pad DDCP in the dummy circuit are related by a same substantial translational symmetry as the substantial translational symmetry relating the pixel driving circuit and the dummy circuit. The signal connecting pad DCP and the dummy signal connecting pad DDCP are in a same layer (e.g., the first signal line layer SD1), and are respectively disposed at corresponding positions in the pixel driving circuit and the dummy circuit, respectively. Referring to FIG. 3J, FIG. 3L, and FIG. 4D, the respective data line DL is connected to the signal connecting pad DCP in the pixel driving circuit through an eleventh via v11, the signal connecting pad DCP is connected to a first electrode S1 of the first transistor T1 through a twelfth via v12. In one example, the eleventh via v11 extends through the first planarization layer PLN1; the twelfth via v12 extends through the passivation layer PVX, the second inter-layer dielectric layer ILD2, the first inter-layer dielectric layer ILD1, the insulating layer IN, and the gate insulating layer GI. The respective data line DL is configured to provide data signals to the first electrode S1 of the first transistor T1 through the signal connecting pad DCP.

Referring to FIG. 3J, FIG. 3L, and FIG. 6D, a respective fourth reset signal line Vint4 of a plurality of fourth reset signal lines is connected to the dummy signal connecting pad DDCP in a first dummy circuit (e.g., DC1 in FIG. 3B) through a first dummy eleventh via v11', the dummy signal connecting pad DDCP in the first dummy circuit is connected to a dummy first electrode DS1 of the dummy first transistor DT1 in the first dummy circuit through a first dummy twelfth via v12'. The dummy first electrode DS1 of the dummy first transistor DT1 in the first dummy circuit is electrically disconnected from a dummy second electrode DD1 of the dummy first transistor DT1 in the first dummy circuit. A reset signal provided by the respective fourth reset signal line Vint4 is not transmitted to the dummy second electrode DD1 of the dummy first transistor DT1 in the first dummy circuit.

Referring to FIG. 3J, FIG. 3L, and FIG. 7D, a respective filth reset signal line Vint5 of a plurality of fifth reset signal lines is connected to the dummy signal connecting pad DDCP in a second dummy circuit (e.g., DC2 in FIG. 3B) through a second dummy eleventh via v11", the dummy signal connecting pad DDCP in the second dummy circuit is connected to a dummy first electrode DS1 of the dummy first transistor DT1 in the second dummy circuit through a second dummy twelfth via v12". The dummy first electrode DS1 of the dummy first transistor DT1 in the second dummy circuit is electrically disconnected from a dummy second electrode DD1 of the dummy first transistor DT1 In the second dummy circuit. A reset signal provided by the respective fifth reset signal line Vint5 is not transmitted to the dummy second electrode DD1 of the dummy first transistor DT1 in the second dummy circuit.

Referring to FIG. 2A, FIG. 3A, FIG. 3J, FIG. 4A to FIG. 4E, FIG. 5, FIG. 6A to FIG. 6E, and FIG. 7A to FIG. 7F, in the pixel driving circuit, the first node connecting line Cln1 is disconnected from the respective first voltage supply line Vddh. In the dummy circuit (e.g., DC1 or DC2 in FIG. 3B), the dummy first node connecting line DCln1 is connected to the respective first voltage supply line Vddh. Optionally, the dummy first node connecting line DCln1 and the respective first voltage supply line Vddh are parts of a unitary structure.

In the pixel driving circuit, the second node connecting line Cln2 is disconnected from the respective first voltage supply line Vddh. In the dummy circuit (e.g., DC1 or DC2 in FIG. 3B), the dummy second node connecting line DCln2 is connected to the respective first voltage supply line Vddh. Optionally, the dummy second node connecting line DCln2 and the respective first voltage supply line Vddh are parts of a unitary structure. The second node connecting line Cln2 in the pixel driving circuit is connected to a second electrode D3 of the third transistor T3 in the pixel driving circuit through a thirteenth via v13, and connected to a second electrode Dr3 of the third reset transistor Tr3 in the pixel driving circuit through a fourteenth via v14. The dummy second node connecting line DCln2 in the dummy circuit is connected to a dummy second electrode DD3 of the dummy third transistor DT3 in the dummy circuit through a dummy thirteenth via v13", and connected to a dummy second electrode DDr3 of the dummy third reset transistor DTr3 in the dummy circuit.

In the pixel driving circuit, the third node connecting line Cln3 is disconnected from the first node connecting line Cln1. In the dummy circuit (e.g., DC1 or DC2 in FIG. 3B), the dummy third node connecting line DCln3 is connected to the dummy first node connecting line DCln1, and the dummy first node connecting line DCln1 is connected to the respective first voltage supply line Vddh. The dummy first node connecting line DCln1 connects the dummy third node connecting line DCln3 with the respective first voltage supply line Vddh. Optionally, the dummy first node connecting line DCln1, the dummy third node connecting line DCln3, and the respective first voltage supply line Vddh are parts of a unitary structure. The third node connecting line Cln3 in the pixel driving circuit is connected to a second electrode Dr2 of the second reset transistor Tr2 in the pixel driving circuit through a sixth via v6, connected to a second electrode D2 of the second transistor T2 in the pixel driving circuit through a seventh via v7, and connected to a second electrode Dd of the driving transistor Td and a first electrode S4 of the fourth transistor T4 in the pixel driving circuit through an eighth via v8. The dummy third node connecting line DCln3 in the dummy circuit is connected to a dummy second electrode DDr2 of the dummy second reset transistor DTr2 in the dummy circuit through a dummy sixth via v6", connected to a dummy second electrode DD2 of the dummy second transistor DT2 in the dummy circuit through a dummy seventh via v7', and connected to a dummy second electrode DDd of the dummy driving transistor DTd and a dummy first electrode DS4 of the dummy fourth transistor DT4 in the dummy circuit through a dummy eighth via v8'.

In the dummy circuit, by connecting the dummy first node connecting line DCln1 to respective first voltage supply line Vddh, the dummy second node connecting line DCln2 to respective first voltage supply line Vddh, the dummy third node connecting line DCln3 to the dummy first node connecting line DCln1, at least portions of the first signal line layer SD1 and at least portion of the first semiconductor material layer SML1 in the dummy circuit are provided with the first reference voltage signal (e.g., a high reference voltage signal). The inventors of the present disclosure discover that this structure prevents electrostatic discharge issue due to charge accumulation in a floating structure.

Referring to FIG. 2A, FIG. 3A, FIG. 3L, and FIG. 4A to FIG. 4E, an anode connecting pad ACP in the pixel driving circuit is connected to the relay electrode RE in the pixel driving circuit through a twentieth via v20, and the relay electrode RE in the pixel driving circuit is connected to a first electrode S4 of the fourth transistor T4 in the pixel driving circuit through a ninth via v9. The relay electrode RE in the pixel driving circuit connects the anode connecting pad ACP in the second signal line layer SD2 with the first electrode S4 of the fourth transistor T4 in the pixel driving circuit. Optionally, the anode connecting pad ACP is further connected to an anode of a light emitting element connected to the pixel driving circuit.

Referring to FIG. 2A, FIG. 3A, FIG. 3L, FIG. 6A to FIG. 6E, and FIG. 7A to FIG. 7F, a dummy anode connecting pad DACP in the dummy circuit is connected to the dummy relay electrode DRE in the dummy circuit through a dummy twentieth via v20', and the dummy relay electrode DRE in the dummy circuit is connected to a dummy first electrode DS4 of the dummy fourth transistor DT4 in the dummy circuit through a dummy ninth via v9'. The dummy relay electrode DRE in the dummy circuit connects the dummy anode connecting pad DACP in the second signal line layer SD2 with the dummy first electrode DS4 of the dummy fourth transistor DT4 in the dummy circuit.

Referring to FIG. 3J, in the pixel driving circuit, the voltage supply branch Vddb is connected to the respective first voltage supply line Vddh. Optionally, the voltage supply branch Vddb and the respective first voltage supply line Vddh are parts of a unitary structure. Referring to FIG. 4B, a respective third voltage supply line Vddv of a plurality of third voltage supply lines is connected to the voltage supply branch Vddb in the pixel driving circuit through a third via v3, and the voltage supply branch Vddb in the pixel driving circuit is connected to a first electrode S3 of the third transistor T3 in the pixel driving circuit through a fourth via v4, thereby providing a first reference voltage signal to the first electrode S3 of the third transistor T3. In one example, the third via v3 extends through the first planarization layer PLN1, and the fourth via v4 extends through the passivation layer PVX, the second inter-layer dielectric layer ILD2, the first inter-layer dielectric layer ILD1, the insulating layer IN, and the gate insulating layer GL.

In some embodiments, as discussed above, the respective third voltage supply line Vddv is connected to the voltage supply branch Vddb in the pixel driving circuit, and the voltage supply branch Vddb in the pixel driving circuit is connected to the respective first voltage supply line Vddh. The respective first voltage supply line Vddh and the respective third voltage supply line Vddv are parts of a first voltage supply network.

In some embodiments, the respective first voltage supply line Vddh and the respective third voltage supply line Vddv are configured to provide a first reference voltage signal (e.g., a high reference voltage signal); and the respective second voltage supply line Vssh is configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Referring to FIG. 3J, in the dummy circuit, the dummy voltage supply branch DVddb is disconnected from the respective first voltage supply line Vddh. Referring to FIG. 6B and FIG. 7B, in the dummy circuit, the respective first voltage supply line Vddh is disconnected from the dummy voltage supply branch DVddb in the dummy circuit. The dummy voltage supply branch DVddb in the dummy circuit is disconnected from the dummy first electrode DS3 of the dummy third transistor DT3 in the dummy circuit. In some embodiments, a respective fourth voltage supply line Vssv of a plurality of fourth voltage supply lines is connected to the dummy voltage supply branch DVddb in the dummy circuit through a dummy third via v3', and the dummy voltage supply branch DVddb in the dummy circuit is connected to the respective second voltage supply line Vssh through a dummy fourth via v4'. In one example, the dummy third via v3' extends through the first planarization layer PLN1, and the dummy fourth via v4' extends through the passivation layer PVX. The respective second voltage supply line Vssh and the respective fourth voltage supply line Vssv are parts of a second voltage supply network.

In some embodiments, the respective first voltage supply line Vddh and the respective third voltage supply line Vddv are configured to provide a first reference voltage signal (e.g., a high reference voltage signal); and the respective second voltage supply line Vssh and the respective fourth voltage supply line Vssv are configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Referring to FIG. 3D, as compared to the first electrode S3 of the third transistor T3 in the pixel driving circuit, the dummy first electrode DS3 of the dummy third transistor DT3 in the dummy circuit is truncated, so that the dummy first electrode DS3 of the dummy third transistor DT3 in the dummy circuit is disconnected from the dummy voltage supply branch DVddb in the dummy circuit.

Referring to FIG. 3A, FIG. 3J, and FIG. 4E, in the pixel driving circuit, the reset signal connecting line Cli is connected to a first electrode Sr3 of the third reset transistor Tr3 in the pixel driving circuit through a fifteenth via v15, and is connected to the respective third reset signal line Vint3 through a sixteenth via v16. The reset signal connecting line Cli connects the respective third reset signal line Vint3 with the first electrode Sr3 of the third reset transistor Tr3 in the pixel driving circuit, thereby providing a reset signal to the first electrode Sr3 of the third reset transistor Tr3 in the pixel driving circuit.

Referring to FIG. 3A, FIG. 3J, and FIG. 6E, in a first dummy circuit (e.g., DC1 in FIG. 3B), a respective fourth reset signal line Vint4 of a plurality of fourth reset signal lines is connected to the dummy reset signal connecting line DCli in the first dummy circuit through a dummy seventeenth via v17', the dummy reset signal connecting line DCli in the first dummy circuit is connected to a dummy first electrode DSr3 of the dummy third reset transistor DTr3 in the first dummy circuit through a first dummy fifteenth via v15', and is connected to the respective third reset signal line Vint3 through a first dummy sixteenth via v16'. The respective fourth reset signal line Vint4 and the respective third reset signal line Vint3 are parts of a second interconnected reset signal line network.

Referring to FIG. 3A, FIG. 3J, and FIG. 7E, in a second dummy circuit, the dummy reset signal connecting line DCli in the second dummy circuit is connected to a dummy first electrode DSr3 of the dummy third reset transistor Tr3 in the second dummy circuit through a second dummy fifteenth via v15", and is connected to the respective third reset signal line Vint3 through a second dummy sixteenth via v16". The dummy reset signal connecting line DCli in the second dummy circuit connects the respective third reset signal line Vint3 with the dummy first electrode DSr3 of the dummy third reset transistor Tr3 in the second dummy circuit.

Referring to FIG. 3A, FIG. 3J, and FIG. 7F, in the second dummy circuit, a respective fifth reset signal line Vint5 of a plurality of fifth reset signal lines is connected to the respective first reset signal line Vint1 through a dummy eighteenth via v18', and the respective first reset signal line Vint1 is connected to a dummy second electrode DSr1 of the dummy first reset transistor DTr1 through a dummy nineteenth via v19'. The respective fifth reset signal line Vint5 and the respective first reset signal line Vint1 are parts of a first interconnected reset signal line network.

Referring to FIG. 3A, FIG. 3J, and FIG. 4C, in the pixel driving circuit, the respective second reset signal line Vint2 is connected to a first electrode Sr2 of the second reset transistor Tr2 in the pixel driving circuit through a fifth via v5, thereby providing a reset signal to the first electrode Sr2 of the second reset transistor Tr2 in the pixel driving circuit. In the pixel driving circuit, the respective first reset signal line Vint1 is connected to a first electrode Sr1 of the first reset transistor Tr1 in the pixel driving circuit through a tenth via v10, thereby providing a reset signal to the first electrode Sr1 of the first reset transistor Tr1 in the pixel driving circuit.

Referring to FIG. 3A, FIG. 3J, FIG. 6C, and FIG. 7C, in the dummy circuit, the respective second reset signal line Vint2 is connected to a dummy first electrode DSr2 of the dummy second reset transistor DTr2 in the dummy circuit through a dummy fifth via v5' in the dummy circuit. In the dummy circuit, the respective first reset signal line Vint1 is connected to a dummy first electrode DSr1 of the dummy first reset transistor DTr1 in the dummy circuit through a dummy tenth via v10'.

Vias extending through the first planarization layer PLN1 are depicted in FIG. 3K.

Referring to FIG. 2A, FIG. 3A, FIG. 3L, FIG. 4A to FIG. 4E, FIG. 5, FIG. 6A to FIG. 6E, and FIG. 7A to FIG. 7F, the second signal line layer SD2 in some embodiments includes a plurality of third voltage supply lines (e.g., the respective third voltage supply line Vddv), a plurality of data lines (e.g., the respective data line DL), a plurality of fourth voltage supply lines (e.g., the respective fourth voltage supply line Vssv), a plurality of fourth reset signal lines (e.g., the respective fourth reset signal line Vint4), a plurality of fifth reset signal lines (e.g., the respective fifth reset signal line Vint5), an anode contact pad ACP, and a dummy anode contact pad DACP, Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of third voltage supply lines (e.g., the respective third voltage supply line Vddv), the plurality of data lines (e.g., the respective data line DL), the plurality of fourth voltage supply lines (e.g., the respective fourth voltage supply line Vssv), the plurality of fourth reset signal lines (e.g., the respective fourth reset signal line Vint4), the plurality of fifth reset signal lines (e.g., the respective fifth reset signal line Vint5), the anode contact pad ACP, and the dummy anode contact pad DACP are in a same layer.

In some embodiments, an orthographic projection of the respective third voltage supply line Vddv on a base substrate BS at least partially (e.g., at least 80%, at least 85%, at least 90%, at least 95%, or at least 99%) covers an orthographic projection of the first node connecting line Cln1 in the pixel driving circuit on the base substrate BS. Optionally, the orthographic projection of the respective third voltage supply line Vddv on the base substrate BS at least partially (e.g., at least 80%, at least 85%, at least 90%, at least 95%, or at least 99%) covers an orthographic projection of a first electrode S2 of the second transistor T2 in the pixel driving circuit on the base substrate BS. By having this particular structure, the inventors of the present disclosure discover that the node N1 can be shielded from interference by other signals in the array substrate.

In some embodiments, an orthographic projection of the respective third voltage supply line Vddv on a base substrate BS at least partially (e.g., at least 80%, at least 85%, at least 90%, at least 95%, or at least 99%) covers an orthographic projection of the active layer ACT2 of the second transistor T2 in the pixel driving circuit on the base substrate BS. By having this particular structure, the inventors of the present disclosure discover that the active layer ACT2 of the second transistor T2 in the pixel driving circuit can be shielded from irradiation, enhancing the performance of the second transistor T2 in the pixel driving circuit.

In some embodiments, an orthographic projection of the respective third voltage supply line Vddv on a base substrate BS at least partially (e.g., at least 20%, at least 30%, at least 40%, at least 50%, or at least 60%) covers an orthographic projection of the third node connecting line Cln3 in the pixel driving circuit on the base substrate BS.

In some embodiments, an orthographic projection of the respective fourth voltage supply line Vssv on a base substrate BS at least partially (e.g., at least 80%, at least 85%, at least 90%, at least 95%, or at least 99%) covers an orthographic projection of the dummy first node connecting line DCln1 in the dummy circuit on the base substrate BS. Optionally, the orthographic projection of the respective fourth voltage supply line Vssv on the base substrate BS at least partially (e.g., at least 80%, at least 85%, at least 90%, at least 95%, or at least 99%) covers an orthographic projection of a dummy first electrode DS2 of the dummy second transistor DT2 in the dummy circuit on the base substrate BS.

In some embodiments, an orthographic projection of the respective fourth voltage supply line Vssv on a base substrate BS at least partially (e.g., at least 80%, at least 85%, at least 90%, at least 95%, or at least 99%) covers an orthographic projection of the dummy active layer DACT2 of the dummy second transistor DT2 in the dummy circuit on the base substrate BS.

In some embodiments, an orthographic projection of the respective fourth voltage supply line Vssv on a base substrate BS at least partially (e.g., at least 20%, at least 30%, at least 40%, at least 50%, or at least 60%) covers an orthographic projection of the dummy third node connecting line DCln3 in the dummy circuit on the base substrate BS.

In some embodiments, referring to FIG. 2A, FIG. 3A to FIG. 3L, FIG. 4A to FIG. 4E, FIG. 5, FIG. 6A to FIG. 6E, and FIG. 7A to FIG. 7F, the respective second gate line includes the respective second gate line first branch GL2-1 and the respective second gate line second branch GL2-2 in two different layers. Optionally, the respective second gate line first branch GL2-1 is in the second gate metal layer Gate2, and the respective second gate line second branch GL2-2 is in the third gate metal layer Gate3. Optionally, an orthographic projection of the respective second gate line first branch GL2-1 on a base substrate BS at least partially (e.g., at least 80%, at least 85%, at least 90%, at least 95%, at least 98%, or at least 99%) overlaps with an orthographic projection of the respective second gate line second branch GL2-2 on the base substrate BS. Optionally, the respective second gate line first branch GL2-1 and the respective second gate line second branch GL2-2 are configured to be provided with a same gate scanning signal.

In some embodiments, referring to FIG. 2A, FIG. 3A to FIG. 3L, FIG. 4A to FIG. 4E, FIG. 5, FIG. 6A to FIG. 6E, and FIG. 7A to FIG. 7F, the respective first reset control signal line includes the respective first reset control signal line first branch rst1-1 and the respective first reset control signal line second branch rst1-2. Optionally, the respective first reset control signal line first branch rst1-1 is in the first gate metal layer Gate1, and the respective first reset control signal line second branch rst1-2 is in the first signal line layer SD1. Optionally, an orthographic projection of the respective first reset control signal line first branch rst1-1 on a base substrate BS at least partially (e.g., at least 80%, at least 85%, at least 90%, at least 95%, at least 98%, or at least 99%) overlaps with an orthographic projection of the respective first reset control signal line second branch rst1-2 on the base substrate BS. Optionally, the respective first reset control signal line first branch rst1-1 and the respective first reset control signal line second branch rst1-2 are configured to be provided with a same reset control signal.

Figure 8A:
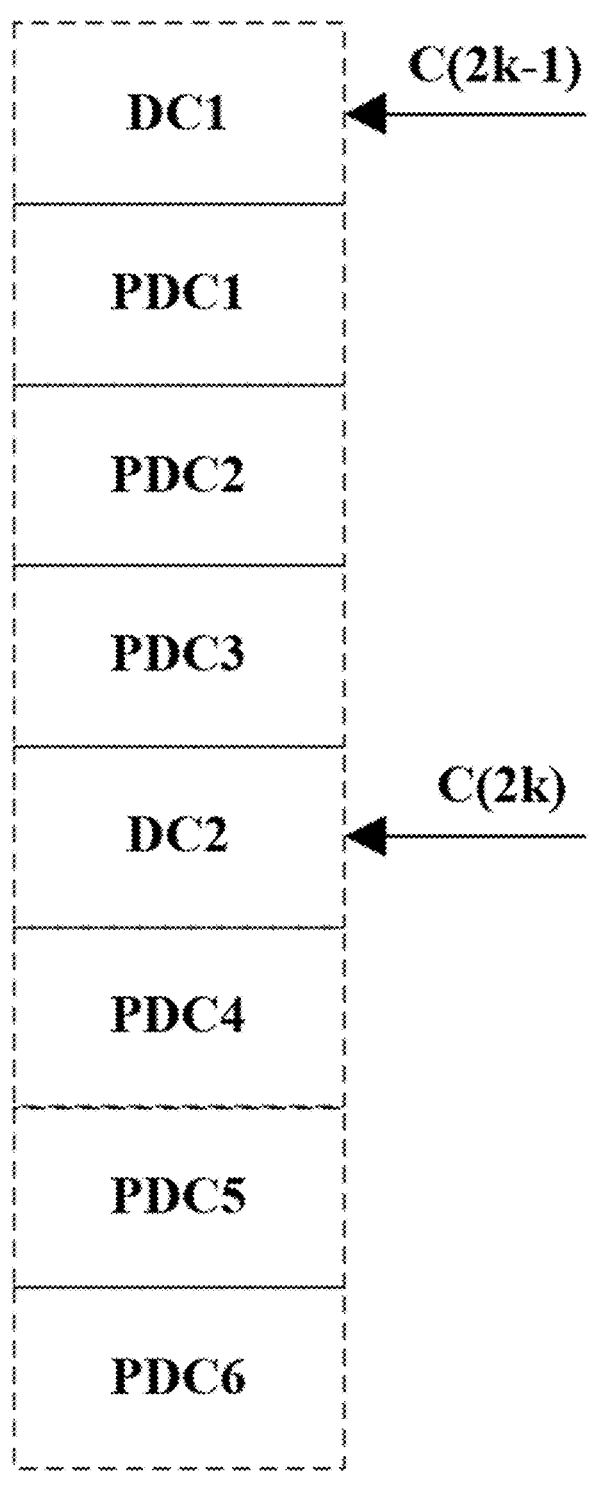
FIG. 8A is a schematic diagram illustrating an arrangement of pixel driving circuits in the array substrate in the array substrate depicted in FIG. 3A.

FIG. 8A is a schematic diagram illustrating an arrangement of pixel driving circuits in the array substrate in the array substrate depicted in FIG. 3A. Referring to FIG. 8A, the dummy circuits are arranged in columns, including (2k-1)-th column C(2k-1), and (2k)-th column C(2k) of K columns, K and k being positive integers, 1≤k≤(K/2).

As used herein, the terms "(2k-1)-th column" and "(2k)-th column" are used in the context of the K columns. The array substrate may or may not include additional column(s) before the first column of the K columns and/or additional columns after the last column of the K columns. In the context of the array substrate, the term "(2k-1)-th column" does not necessarily denote an odd-numbered column, and the term "(2k)-th column does not necessarily denote an even-numbered column. In one example, the (2k-1)-th column is an odd-numbered column in the context of the K columns, but may be an even-numbered column in the context of the array substrate. In another example, the (2k-1)-th column is an odd-numbered column in the context of the K columns, and also an odd-numbered column in the context of the army substrate. In one example, the (2k)-th column is an even-numbered column in the context of the K columns, but may be an odd-numbered column in the context of the array substrate. In another example, the (2k)-th column is an even-numbered column in the context of the K columns, and also an even-numbered column in the context of the array substrate.

In some embodiments, the (2k-1)-th column C(2k-1) includes a (2k-1)-th dummy circuit, and the (2k)-th column C(2k) includes a (2k)-th dummy circuit. The (2k-1)-th dummy circuit and the (2k)-th dummy circuit are in a same row.

In some embodiments, the (2k-1)-th column C(2k-1) includes a (2k-1)-th fourth voltage supply line of the plurality of fourth voltage supply lines and a k-th fourth reset signal line of the plurality of fourth reset signal lines; the (2k)-th column C(2k) includes a (2k)-th fourth voltage supply line of the plurality of fourth voltage supply lines and a k-th fifth reset signal line of the plurality of fifth reset signal lines.

Figure 8B:
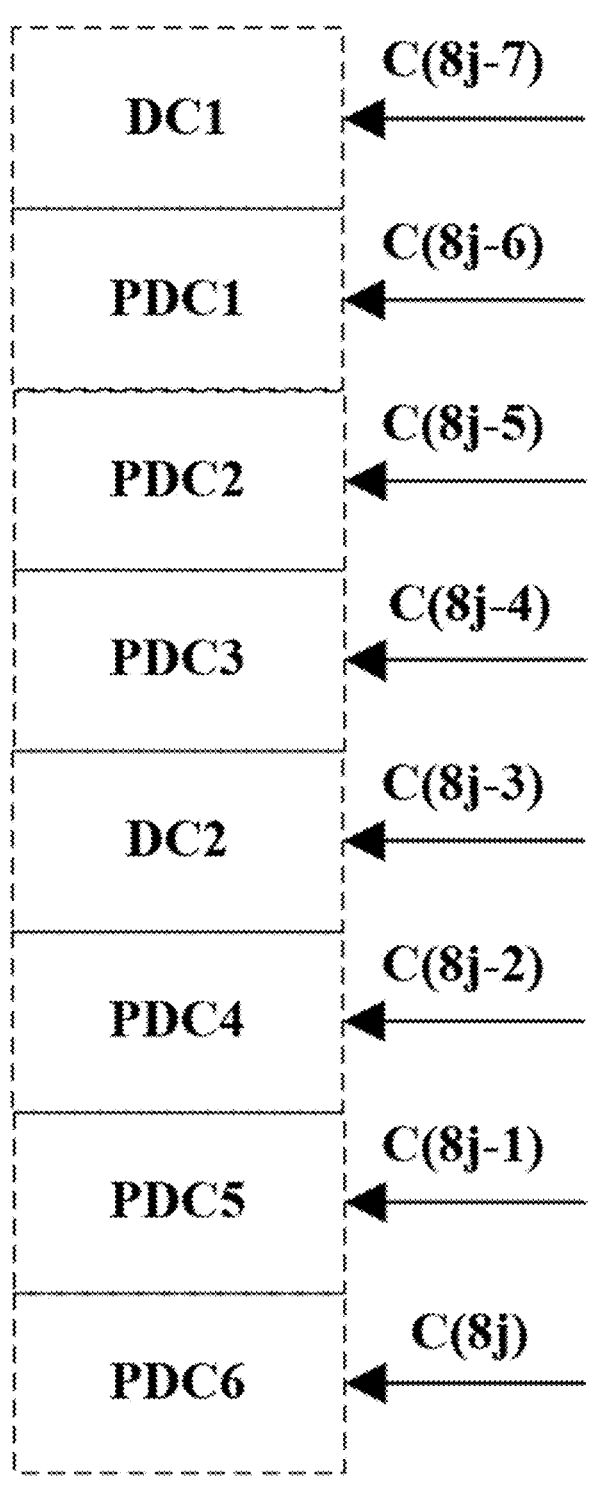
FIG. 8B is a schematic diagram illustrating an arrangement of pixel driving circuits in the array substrate in the array substrate depicted in FIG. 3A.

FIG. 8B is a schematic diagram illustrating an arrangement of pixel driving circuits in the array substrate in the array substrate depicted in FIG. 3A. Referring to FIG. 8B, the pixel driving circuits and the dummy circuits are arranged in columns, including (8j-7)-th column C(8j-7), (8j-6)-th column C(8j-6), (8j-5)-th column C(8j-5), and (8j-4)-th column C(8j-4), (8j-3)-th column C(8j-3), (8j-2)-th column C(8j-2), (8j-1)-th column C(8j-1), and (8j)-th column C(8j) of J columns, J and j being positive integers, 1≤j≤(J/8).

In some embodiments, the (8j-7)-th column C(8j-7) includes a (2k-1)-th dummy circuit, and the (8j-3)-th column C(8j-3) includes a (2k)-th dummy circuit. Optionally, each of the (8j-6)-th column C(8j-6), the (8j-5)-th column C(8j-5), the (8j-4)-th column C(8j-4), the (8j-2)-th column C(8j-2), the (8j-1)-th column C(8j-1), and the (8j)-th column C(8j) includes an individual pixel driving circuit.

In some embodiments, the (8j-7)-th column C(8j-7) includes a (2k-1)-th respective fourth voltage supply line of the plurality of fourth voltage supply lines and a k-th fourth reset signal line Vint4 of the plurality of fourth reset signal lines; the (8j-3)-th column C(8j-3) includes a (2k)-th respective fourth voltage supply line of the plurality of fourth voltage supply lines and a k-th fifth reset signal line Vint5 of the plurality of fifth reset signal lines.

As used herein, the terms "(8j-7)-th column", "(8j-6)-th column", "(8j-5)-th column", "(8j-4)-th column", "(8j-3)-th column", "(8j-2)-th column", "(8j-1)-th column", and "(8j)-th column" are used in the context of the J columns. The array substrate may or may not include additional column(s) before the first column of the J columns and/or additional columns after the last column of the J columns. In the context of the array substrate, the terms "(8j-7)-th column", "(8j-5)-th column"; "(8j-3)-th column", and "(8j-1)-th column" does not necessarily denote an odd-numbered column, and the term "(8j-6)-th column", "(8j-4)-th column", "(8j-2)-th column" and "(8j)-th column does not necessarily denote an even-numbered column. In one example, the (8j-7)-th column is an odd-numbered column in the context of the J columns, but may be an even-numbered column in the context of the array substrate. In another example, the (8j-7)-th column is an odd-numbered column in the context of the J columns, and also an odd-numbered column in the context of the array substrate. In one example, the (8j-6)-th column is an even-numbered column in the context of the J columns, but may be an odd-numbered column in the context of the array substrate. In another example, the (8j-6)-th column is an even-numbered column in the context of the J columns, and also an even-numbered column in the context of the array substrate. In one example, the (8j-5)-th column is an odd-numbered column in the context of the J columns, but may be an even-numbered column in the context of the array substrate. In another example, the (8j-5)-th column is an odd-numbered column in the context of the J columns, and also an odd-numbered column in the context of the array substrate. In one example, the (8j-4)-th column is an even-numbered column in the context of the J columns, but may be an odd-numbered column in the context of the array substrate. In another example, the (8j-4)-th column is an even-numbered column in the context of the J columns, and also an even-numbered column in the context of the array substrate. In one example, the (8j-3)-th column is an odd-numbered column in the context of the J columns, but may be an even-numbered column in the context of the array substrate. In another example, the (8j-3)-th column is an odd-numbered column in the context of the J columns, and also an odd-numbered column in the context of the array substrate. In one example, the (8j-2)-th column is an even-numbered column in the context of the J columns, but may be an odd-numbered column in the context of the array substrate. In another example, the (8j-2)-th column is an even-numbered column in the context of the J columns, and also an even-numbered column in the context of the array substrate. In one example, the (8j-1)-th column is an odd-numbered column in the context of the J columns, but may be an even-numbered column in the context of the array substrate. In another example, the (8j-1)-th column is an odd-numbered column in the context of the J columns, and also an odd-numbered column in the context of the array substrate. In one example, the (8j)-th column is an even-numbered column in the context of the J columns, but may be an odd-numbered column in the context of the array substrate. In another example, the (8j)-th column is an even-numbered column in the context of the J columns, and also an even-numbered column in the context of the array substrate.

Figure 9:
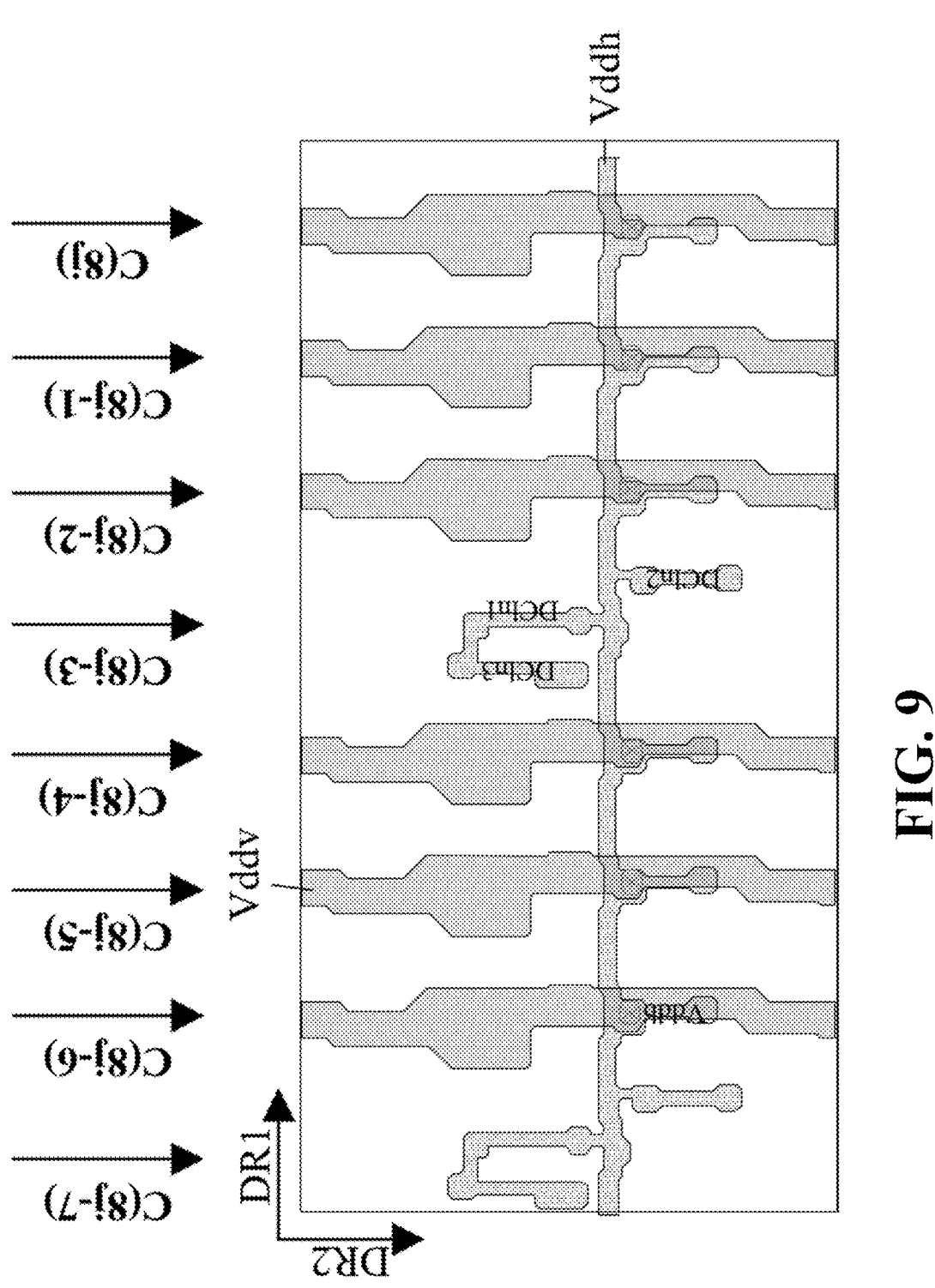
FIG. 9 illustrates a first voltage supply network in some embodiments according to the present disclosure.

FIG. 9 illustrates a first voltage supply network in some embodiments according to the present disclosure, Referring to FIG. 9, the array substrate in some embodiments includes a first interconnected voltage supply network configured to provide a first reference voltage signal to a plurality of pixel driving circuits. In some embodiments, the first interconnected voltage supply network includes a plurality of first voltage supply lines respectively along a first direction DR1;

and a plurality of third voltage supply lines respectively along a second direction DR2; wherein the plurality of first voltage supply lines respectively cross over the plurality of third voltage supply lines.

Optionally, a respective first voltage supply line Vddh of the plurality of first voltage supply lines is connected to at least multiple ones of the plurality of third voltage supply lines; and a respective third voltage supply line Vddv of the plurality of third voltage supply lines is connected to at least multiple ones of the plurality of first voltage supply lines.

Optionally, the plurality of first voltage supply lines are in a first signal line layer. Optionally, the plurality of third voltage supply lines are in a second signal line layer on a side of the first signal line layer away from a base substrate.

Optionally, the first interconnected voltage supply network further includes a plurality of voltage supply branches connected to the respective first voltage supply line Vddh. Optionally, the plurality of voltage supply branches and the respective first voltage supply line Vddh are in a same layer. Optionally, the plurality of voltage supply branches and the respective first voltage supply line Vddh are parts of a unitary structure, Optionally, the plurality of voltage supply branches protrude away from the respective first voltage supply line Vddh along the second direction DR2.

Optionally, the respective third voltage supply line Vddv is connected to a voltage supply branch Vddb in the pixel driving circuit, and the voltage supply branch Vddb in the pixel driving circuit is connected to the respective first voltage supply line Vddh.

Optionally, the plurality of third voltage supply lines and the plurality of first voltage supply lines interconnect through third vias respectively extending through a first planarization layer. Optionally, the respective third voltage supply line Vddv is connected to at least multiple ones of the plurality of first voltage supply lines respectively through multiple third vias extending through the first planarization layer. Optionally, the respective first voltage supply line Vddh is connected to at least multiple ones of the plurality of third voltage supply lines respectively through multiple third vias extending through the first planarization layer.

Optionally, the first interconnected voltage supply network further includes a plurality of dummy first node connecting lines connected to the respective first voltage supply line Vddh. Optionally, the plurality of dummy first node connecting lines and the respective first voltage supply line Vddh are in a same layer. Optionally, the plurality of dummy first node connecting lines and the respective first voltage supply line Vddh are parts of a unitary structure.

Optionally, the first interconnected voltage supply network further includes a plurality of dummy third node connecting lines connected to the plurality of dummy first node connecting lines, respectively. Optionally, the plurality of dummy first node connecting lines, the plurality of dummy third node connecting lines, and the respective first voltage supply line Vddh are in a same layer. Optionally, the plurality of dummy first node connecting lines, the plurality of dummy third node connecting lines, and the respective first voltage supply line Vddh are parts of a unitary structure.

Optionally, the first interconnected voltage supply network further includes a plurality of dummy second node connecting lines connected to the respective first voltage supply line Vddh. Optionally, the plurality of dummy second node connecting lines and the respective first voltage supply line Vddh are in a same layer. Optionally, the plurality of dummy second node connecting lines and the respective first voltage supply line Vddh are parts of a unitary structure.

Optionally, a dummy first node connecting line DCln1 and a dummy second node connecting line DCln2 are on two opposite sides with respect to the respective first voltage supply line Vddh. Optionally, a dummy third node connecting line DCln3 and a dummy second node connecting line DCln2 are on two opposite sides with respect to the respective first voltage supply line Vddh.

Optionally, the plurality of third voltage supply lines are in the (8*j*-6)-th column C(8*j*-6), the (8*j*-5)-th column C(8*j*-5), the (8*j*-4)-th column C(8*j*-4), the (8*j*-2)-th column C(8*j*-2), the (8*j*-1)-th column C(8*j*-1), and the (8*j*)-th column C(8*j*). Optionally, the plurality of dummy first node connecting lines, the plurality of dummy second node connecting lines, or the plurality of dummy third node connecting lines are in the (8*j*-7)-th column C(8*j*-7) and the (8*j*-3)-th column C(8*j*-3).

Figure 10:
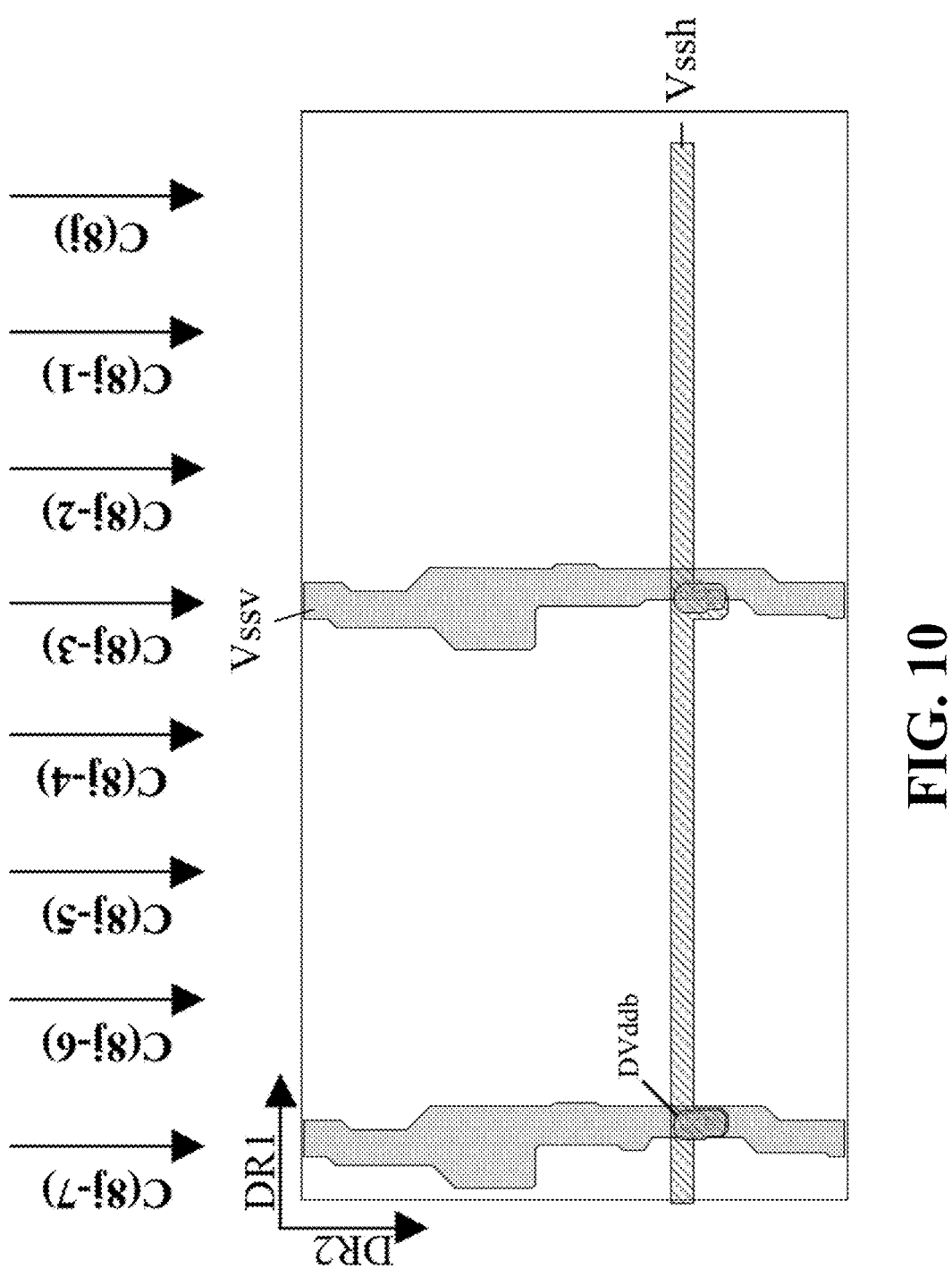
FIG. 10 illustrates a second voltage supply network in some embodiments according to the present disclosure.

FIG. 10 illustrates a second voltage supply network in some embodiments according to the present disclosure. Referring to FIG. 10, the array substrate in some embodiments includes a second interconnected voltage supply network configured to provide a second reference voltage signal to cathodes of a plurality of light emitting elements in a plurality of pixel driving circuits. In some embodiments, the second interconnected voltage supply network includes a plurality of second voltage supply lines respectively along a first direction DR1; and a plurality of fourth voltage supply lines respectively along a second direction DR2; wherein the plurality of second voltage supply lines respectively cross over the plurality of fourth voltage supply lines.

Optionally, a respective second voltage supply line Vssh of the plurality of second voltage supply lines is connected to at least multiple ones of the plurality of fourth voltage supply lines; and a respective fourth voltage supply line Vssv of the plurality of fourth voltage supply lines is connected to at least multiple ones of the plurality of second voltage supply lines.

Optionally, the plurality of second voltage supply lines are in a third gate metal layer. Optionally, the plurality of fourth voltage supply lines are in a second signal line layer on a side of the third gate metal layer away from a base substrate.

Optionally, the second interconnected voltage supply network further includes a plurality of dummy voltage supply branches. A dummy voltage supply branch DVddb is connected to a respective second voltage supply line Vssh, and is connected to a respective fourth voltage supply line Vssv. Optionally, the plurality of dummy voltage supply branches are in a first signal line layer between the third gate metal layer and the second signal line layer.

Optionally, the respective fourth voltage supply line Vssv is connected to a dummy voltage supply branch DVddb in the dummy circuit, and the dummy voltage supply branch DVddb in the dummy circuit is connected to the respective second voltage supply line Vssh.

Optionally, the plurality of fourth voltage supply lines and the plurality of dummy voltage supply branches interconnect through dummy third vias respectively extending through a first planarization layer. Optionally, the respective fourth voltage supply line Vssv is connected to at least multiple ones of the plurality of dummy voltage supply branches respectively through multiple third vias extending through the first planarization layer.

Optionally, the plurality of dummy voltage supply branches and the plurality of fourth voltage supply lines interconnect through dummy fourth vias respectively extending through a passivation layer, a second inter-layer dielectric layer, a first inter-layer dielectric layer, an insulating layer, and a gate insulating layer. Optionally, the respective fourth voltage supply line is connected to at least multiple ones of the plurality of dummy voltage supply branches respectively through multiple fourth vias extending through the passivation layer, the second inter-layer dielectric layer, the first inter-layer dielectric layer, the insulating layer, and the gate insulating layer.

Optionally, the plurality of fourth voltage supply lines are in the (8*j*-7)-th column C(8*j*-7) and the (8*j*-3)-th column C(8*j*-3). Optionally, the plurality of dummy voltage supply branches are in the (8*j*-7)-th column C(8*j*-7) and the (8*j*-3)-th column C(8*j*-3).

The inventors of the present disclosure discover that, by having the second interconnected voltage supply network, the power consumption of the array substrate can be reduced, and the display uniformity of the array substrate can be enhanced.

Optionally, an orthographic projection of the respective second voltage supply line Vssh on a base substrate at least partially (e.g., at least 80%, at least 85%, at least 90%, at least 95%, at least 98%, or at least 99%) overlaps with an orthographic projection of the respective light emitting control signal line em on the base substrate.

Optionally, an orthographic projection of the respective second voltage supply line Vssh on a base substrate is non-overlapping with an orthographic projection of the respective first gate line GL1 on the base substrate. Optionally, an orthographic projection of the respective second voltage supply line Vssh on a base substrate is non-overlapping with an orthographic projection of the respective second gate line first branch GL2-1 on the base substrate. Optionally, an orthographic projection of the respective second voltage supply line Vssh on a base substrate is non-overlapping with an orthographic projection of the respective second gate line second branch GL2-2 on the base substrate. By having this layout, the interference between gate signals and second reference signals can be minimized.

Figure 11:
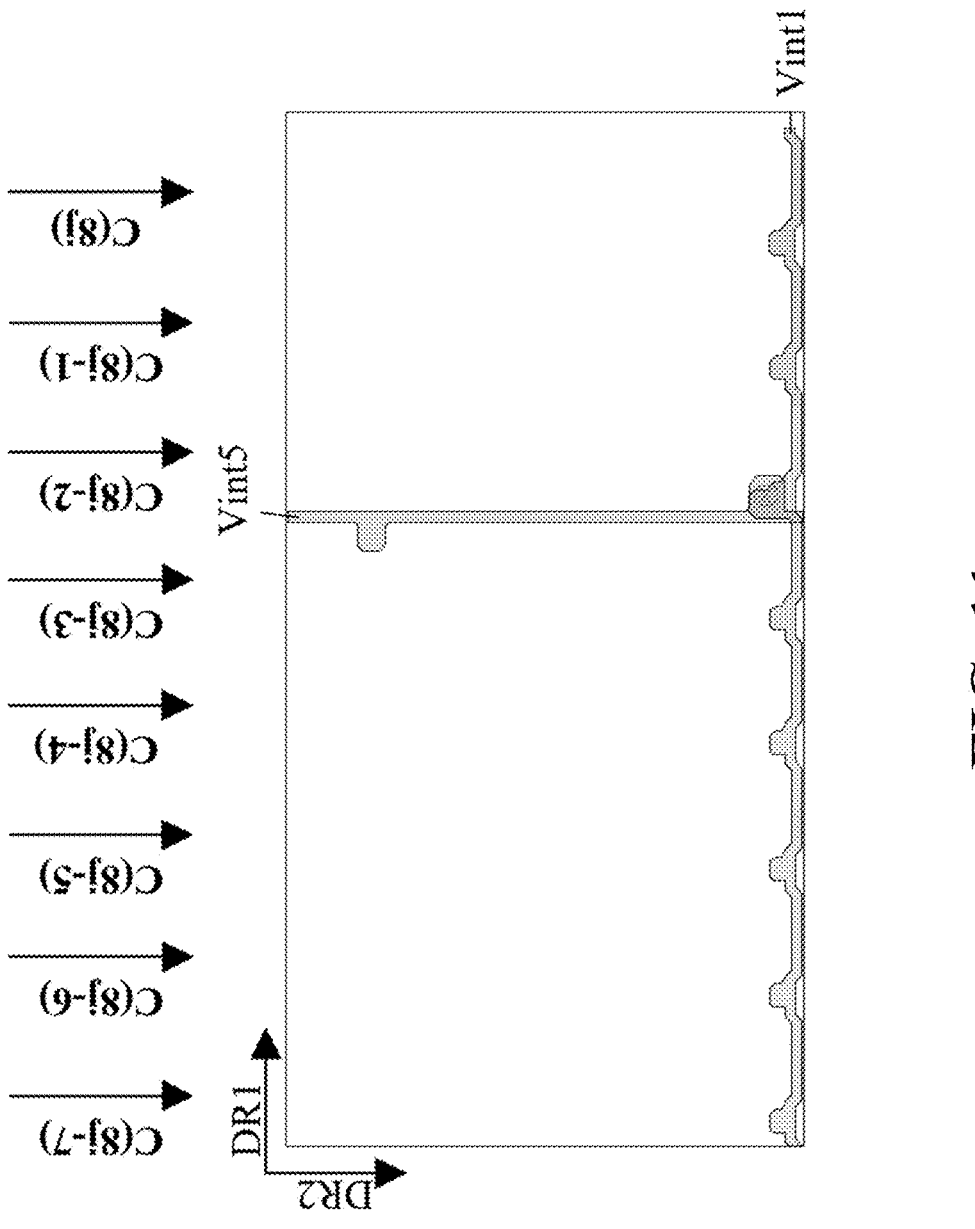
FIG. 11 illustrates a first interconnected reset signal line network in some embodiments according to the present disclosure.

FIG. 11 illustrates a first interconnected reset signal line network in some embodiments according to the present disclosure. Referring to FIG. 11, the array substrate in some embodiments includes a first interconnected reset signal line network configured to provide a first reset signal to a plurality of pixel driving circuits. In some embodiments, the first interconnected reset signal line network includes a plurality of first reset signal lines respectively along a first direction DR1; and a plurality of fifth reset signal lines respectively along a second direction DR2; wherein the plurality of first reset signal lines respectively cross over the plurality of fifth reset signal lines.

Optionally, a respective first reset signal line Vint1 of the plurality of first reset signal lines is connected to at least multiple ones of the plurality of fifth reset signal lines; and a respective fifth reset signal line Vint5 of the plurality of fifth reset signal lines is connected to at least multiple ones of the plurality of first reset signal lines.

Optionally, the plurality of first reset signal lines are in a first signal line layer. Optionally, the plurality of fifth reset signal lines are in a second signal line layer on a side of the first signal line layer away from a base substrate.

Optionally, the plurality of first reset signal lines and the plurality of fifth reset signal lines interconnect through dummy eighteenth vias respectively extending through a first planarization layer. Optionally, the respective first reset signal line Vint1 is connected to at least multiple ones of the plurality of fifth reset signal lines respectively through multiple dummy eighteenth vias extending through the first planarization layer. Optionally, the respective fifth reset signal line Vint5 is connected to at least multiple ones of the plurality of first reset signal lines respectively through multiple dummy eighteenth vias extending through the first planarization layer.

Optionally, the plurality of fifth reset signal lines are in the (8*j*-3)-th column C(8*j*-3).

The inventors of the present disclosure discover that, by having the first interconnected reset signal line network, the loading in the reset signal lines can be reduced, enhancing display quality (particularly display quality at a low grayscale).

Figure 12:
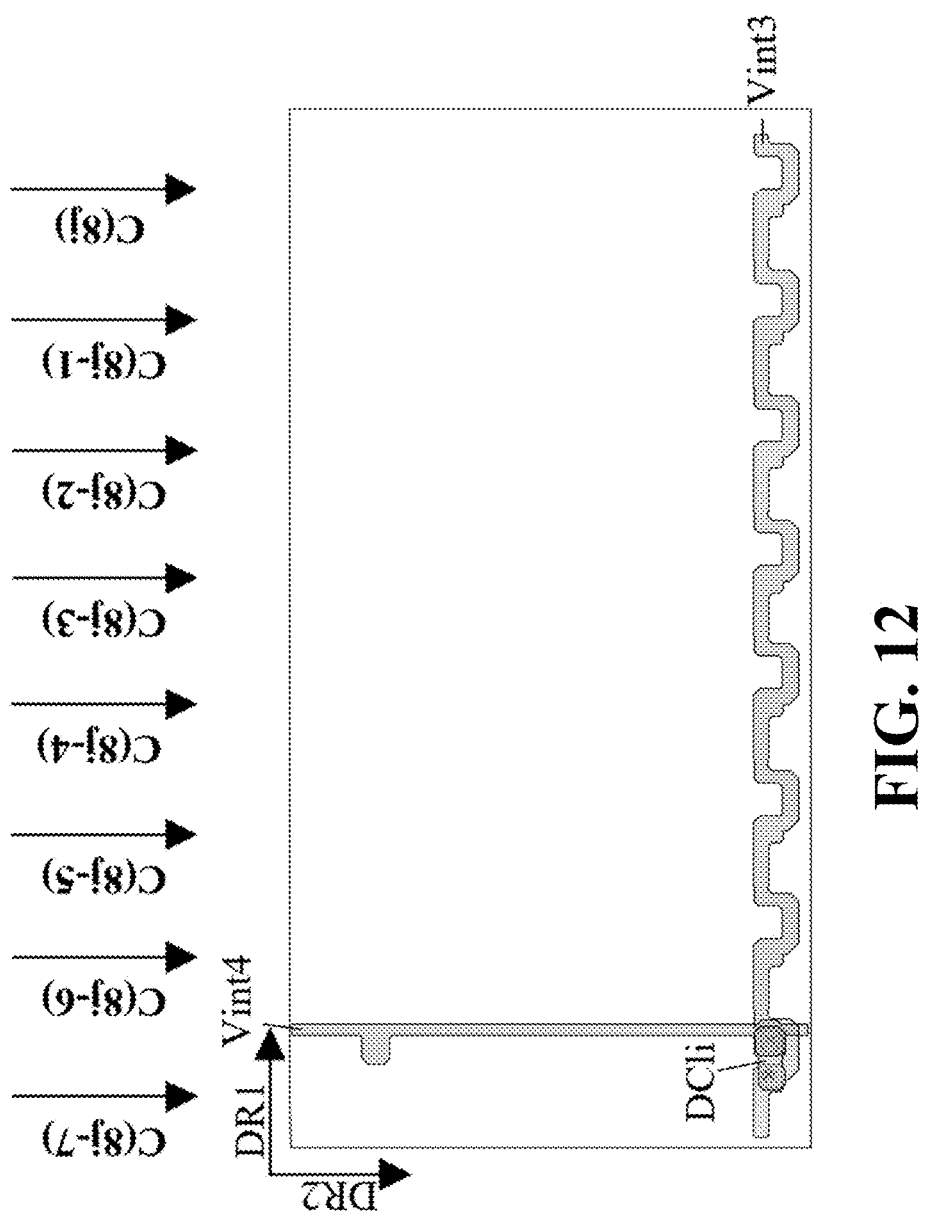
FIG. 12 illustrates a second interconnected reset signal line network in some embodiments according to the present disclosure.

FIG. 12 illustrates a second interconnected reset signal line network in some embodiments according to the present disclosure. Referring to FIG. 12, the array substrate in some embodiments includes a second interconnected reset signal line network configured to provide a third reset signal to a plurality of pixel driving circuits. In some embodiments, the second interconnected reset signal line network includes a plurality of third reset signal lines respectively along a first direction DR1; and a plurality of fourth reset signal lines respectively along a second direction DR2; wherein the plurality of third reset signal lines respectively cross over the plurality of fourth reset signal lines.

Optionally, a respective third reset signal line Vint3 of the plurality of third reset signal lines is connected to at least multiple ones of the plurality of fourth reset signal lines; and a respective fourth reset signal line Vint4 of the plurality of fourth reset signal lines is connected to at least multiple ones of the plurality of third reset signal lines.

Optionally, the plurality of third reset signal lines are in a second gate metal layer. Optionally, the plurality of fourth reset signal lines are in a second signal line layer on a side of the second gate metal layer away from a base substrate.

Optionally, the second interconnected reset signal line network further includes a plurality of dummy reset signal connecting lines connected to the respective third reset signal line Vint3. Optionally, the plurality of dummy reset signal connecting lines are in a first signal line layer between the second gate metal layer and the second signal line layer. A dummy reset signal connecting line DCli is connected to the respective third reset signal line Vint3, and is connected to the respective fourth reset signal line Vint4.

Optionally, the respective fourth reset signal line Vint4 is connected to a dummy reset signal connecting line DCli in the first dummy circuit, and the dummy reset signal connecting line DCli in the first dummy circuit is connected to the respective third reset signal line Vint3.

Optionally, the plurality of fourth reset signal lines and the plurality of dummy reset signal connecting lines interconnect through dummy seventeenth vias respectively extending through a first planarization layer. Optionally, the respective fourth reset signal line Vint4 is connected to at least multiple ones of the plurality of dummy reset signal connecting lines respectively through multiple dummy seventeenth vias extending through the first planarization layer.

Optionally, the plurality of dummy reset signal connecting lines and the plurality of third reset signal lines interconnect through dummy sixteenth vias respectively extending through a passivation layer, a second inter-layer dielectric layer, and a first inter-layer dielectric layer. Optionally, the respective third reset signal lines Vint3 is connected to at least multiple ones of the plurality of dummy reset signal connecting lines respectively through multiple dummy sixteenth vias extending through the passivation layer, the second inter-layer dielectric layer, and the first inter-layer dielectric layer.

Optionally, the plurality of fourth reset signal lines are in the (8*j*-7)-th column C(8*j*-7).

The inventors of the present disclosure discover that, by having the second interconnected reset signal line network, the loading in the reset signal lines can be reduced, enhancing display quality (particularly display quality at a low grayscale).

Figure 13:
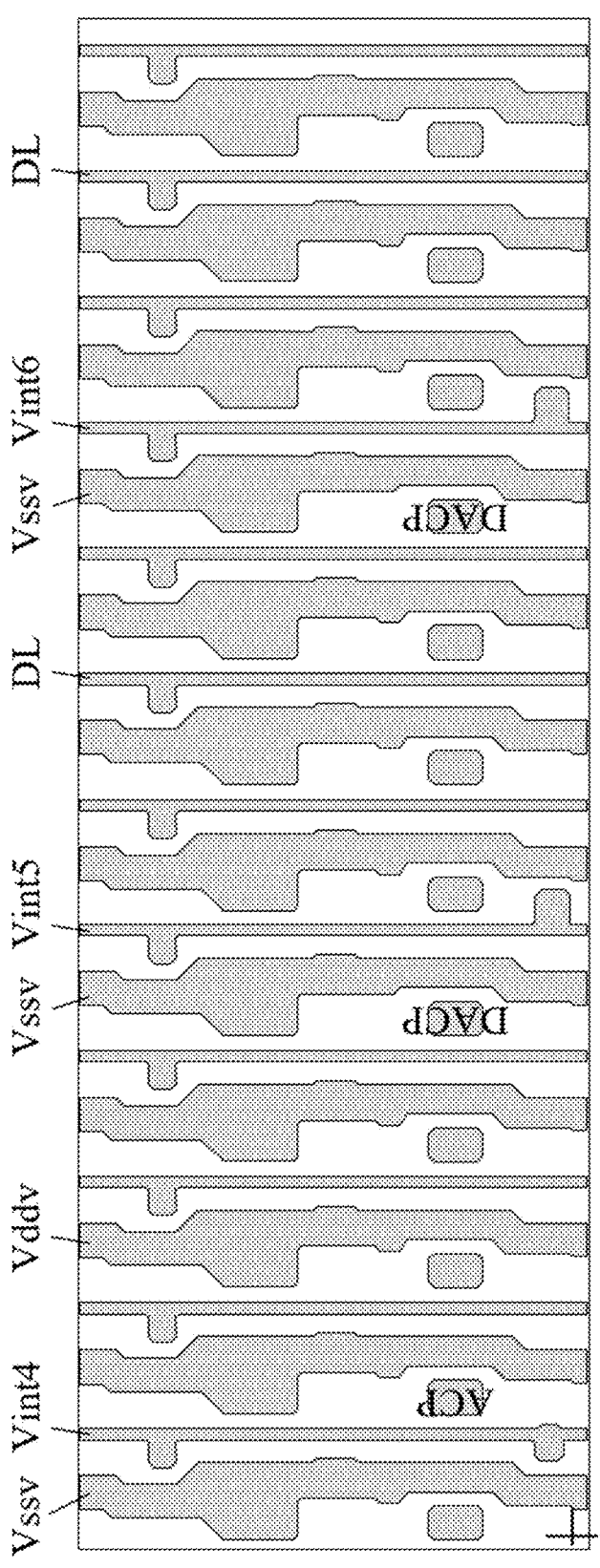
FIG. 13 is a diagram illustrating the structure of a second signal line layer in an array substrate in some embodiments according to the present disclosure.

FIG. 13 is a diagram illustrating the structure of a second signal line layer in an array substrate in some embodiments according to the present disclosure. Referring to FIG. 13, the second signal line layer SD2 in some embodiments includes a plurality of third voltage supply lines (e.g., the respective third voltage supply line Vddv), a plurality of data lines (e.g., the respective data line DL), a plurality of fourth voltage supply lines (e.g., the respective fourth voltage supply line Vssv), a plurality of fourth reset signal lines (e.g., the respective fourth reset signal line Vint4), a plurality of fifth reset signal lines (e.g., the respective fifth reset signal line Vint5), a plurality of sixth reset signal lines (e.g., the respective sixth reset signal line Vint6), an anode contact pad ACP, and a dummy anode contact pad DACP.

Figure 14:
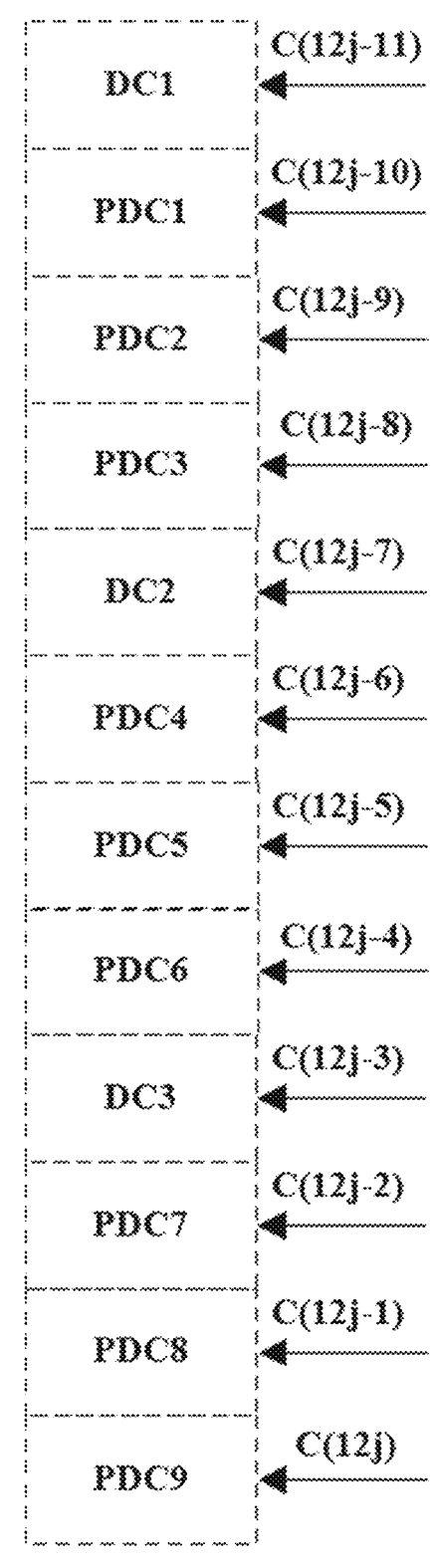
FIG. 14A is a schematic diagram illustrating an arrangement of pixel driving circuits in an array substrate in some embodiments according to the present disclosure.
FIG. 14B is a schematic diagram illustrating an arrangement of pixel driving circuits in an array substrate in some embodiments according to the present disclosure.

FIG. 14A is a schematic diagram illustrating an arrangement of pixel driving circuits in an array substrate in some embodiments according to the present disclosure. Referring to FIG. 14A, the dummy circuits are arranged in columns, including (3*k*-2)-th column C(3*k*-2), (3*k*-1)-th column C(3*k*-1), and (3*k*)-th column C(3*k*) of K columns, K and k being positive integers, 1≤k≤(K/3).

As used herein, the terms "(3*k*-2)-th column", "(3*k*-1)-th column", and "(3*k*)-th column" are used in the context of the K columns. The array substrate may or may not include additional column(s) before the first column of the K columns and/or additional columns after the last column of the K columns. In the context of the array substrate, the term "(3*k*-1)-th column" does not necessarily denote an odd-numbered column, and the term "(3*k*-2)-th column" or "(3*k*)-th column does not necessarily denote an even-numbered column. In one example, the (3*k*-2)-th column is an even-numbered column in the context of the K columns, but may be an odd-numbered column in the context of the array substrate. In another example, the (3*k*-2)-th column is an even-numbered column in the context of the K columns, and also an even-numbered column in the context of the array substrate. In one example, the (3*k*-1)-th column is an odd-numbered column in the context of the K columns, but may be an even-numbered column in the context of the array substrate. In another example, the (3*k*-1)-th column is an odd-numbered column in the context of the K columns, and also an odd-numbered column in the context of the array substrate. In one example, the (3*k*)-th column is an even-numbered column in the context of the K columns, but may be an odd-numbered column in the context of the array substrate. In another example, the (3*k*)-th column is an even-numbered column in the context of the K columns, and also an even-numbered column in the context of the array substrate.

In some embodiments, the (3*k*-2)-th column C(3*k*-2) includes a (3*k*-2)-th dummy circuit, the (3*k*-1)-th column C(3*k*-1) includes a (3*k*-1)-th dummy circuit, and the (3*k*)-th column C(3*k*) includes a (3*k*)-th dummy circuit. The (3*k*-2)-th dummy circuit, the (3*k*-1)-th dummy circuit, and the (3*k*)-th dummy circuit are in a same row.

In some embodiments, the (3*k*-2)-th column C(3*k*-2) includes a (3*k*-2)-th fourth voltage supply line of the plurality of fourth voltage supply lines and a k-th fourth reset signal line of the plurality of fourth reset signal lines; the (3*k*-1)-th column C(3*k*-1) includes a (3*k*-1)-th fourth voltage supply line of the plurality of fourth voltage supply lines and a k-th fifth reset signal line of the plurality of fifth reset signal lines; and the (3k)-th column C(3k) includes a (3k)-th fourth voltage supply line of the plurality of fourth voltage supply lines and a k-th sixth reset signal line of the plurality of sixth reset signal lines.

FIG. 14B is a schematic diagram illustrating an arrangement of pixel driving circuits in an array substrate in some embodiments according to the present disclosure. Referring to FIG. 14B, the pixel driving circuits and the dummy circuits are arranged in columns, including (12j-11)-th column C(12j-11), (12j-10)-th column C(12j-10), (12j-9)-th column C(12j-9), (12j-8)-th column C(12j-8), (12j-7)-th column C(12j-7), (12j-6)-th column C(12j-6), (12j-5)-th column C(12j-5), and (12j-4)-th column C(12j-4), (12j-3)-th column C(12j-3), (12j-2)-th column C(12j-2), (12j-1)-th column C(12j-1), and (12j)-th column C(12j) of J columns, J and j being positive integers, 1≤j≤(J/12).

In some embodiments, the (12j-11)-th column C(12j-11) includes a (3k-2)-th dummy circuit, the (12j-7)-th column C(12j-7) includes a (3k-1)-th dummy circuit, and the (12j-3)-th column C(12j-3) includes a (3k)-th dummy circuit. Optionally, each of the (12j-10)-th column C(12j-10), the (12j-9)-th column C(12j-9), the (12j-8)-th column C(12j-8), (12j-6)-th column C(12j-6), the (12j-5)-th column C(12j-5), the (12j-4)-th column C(12j-4), the (12j-2)-th column C(12j-2), the (12j-1)-th column C(12j-1), and the (12j)-th column C(12j) includes an individual pixel driving circuit.

In some embodiments, the (12j-11)-th column C(12j-11) includes a (3k-2)-th respective fourth voltage supply line of the plurality of fourth voltage supply lines and a k-th fourth reset signal line of the plurality of fourth reset signal lines; the (12j-7)-th column C(12j-7) includes a (3k-1)-th respective fourth voltage supply line of the plurality of fourth voltage supply lines and a k-th fifth reset signal line of the plurality of fifth reset signal lines; and the (12j-3)-th column C(12j-3) includes a (3k)-th respective fourth voltage supply line of the plurality of fourth voltage supply lines and a k-th sixth reset signal line of the plurality of sixth reset signal lines.

As used herein, the terms "(12j-11)-th column", "(12j-10)-th column", "(12j-9)-th column", "(12j-8)-th column", "(12j-7)-th column", "(12j-6)-th column", "(12j-5)-th column", "(12j-4)-th column", "(12j-3)-th column", "(12j-2)-th column", "(12j-1)-th column", and "(12j)-th column" are used in the context of the J columns. The array substrate may or may not include additional column(s) before the first column of the J columns and/or additional columns after the last column of the J columns. In the context of the array substrate, the terms "(12j-11)-th column", "(12j-9)-th column", "(12j-7)-th column", "(12j-5)-th column", "(12j-3)-th column", and "(12j-1)-th column" does not necessarily denote an odd-numbered column, and the term "(12j-10)-th column", "(12j-8)-th column", "(12j-6)-th column", "(12j-4)-th column", "(12j-2)-th column" and "(12j)-th column does not necessarily denote an even-numbered column. In one example, the (12j-11)-th column is an odd-numbered column in the context of the J columns, but may be an even-numbered column in the context of the array substrate. In another example, the (12j-11)-th column is an odd-numbered column in the context of the J columns, and also an odd-numbered column in the context of the array substrate. In one example, the (12j-10)-th column is an even-numbered column in the context of the J columns, but may be an odd-numbered column in the context of the array substrate. In another example, the (12j-10)-th column is an even-numbered column in the context of the J columns, and also an even-numbered column in the context of the array substrate. In one example, the (12j-9)-th column is an odd-numbered column in the context of the J columns, but may be an even-numbered column in the context of the array substrate. In another example, the (12j-9)-th column is an odd-numbered column in the context of the J columns, and odd-numbered column in the context of the J columns, and also an odd-numbered column in the context of the array substrate. In one example, the (12j-8)-th column is an even-numbered column in the context of the J columns, but may be an odd-numbered column in the context of the array substrate. In another example, the (12j-8)-th column is an even-numbered column in the context of the J columns, and also an even-numbered column in the context of the array substrate. In one example, the (12j-7)-th column is an odd-numbered column in the context of the J columns, but may be an even-numbered column in the context of the array substrate. In another example, the (12j-7)-th column is an odd-numbered column in the context of the J columns, and also an odd-numbered column in the context of the array substrate. In one example, the (12j-6)-th column is an even-numbered column in the context of the J columns, but may be an odd-numbered column in the context of the array substrate. In another example, the (12j-6)-th column is an even-numbered column in the context of the J columns, and also an even-numbered column in the context of the array substrate. In one example, the (12j-5)-th column is an odd-numbered column in the context of the J columns, but may be an even-numbered column in the context of the array substrate. In another example, the (12j-5)-th column is an odd-numbered column in the context of the J columns, and also an odd-numbered column in the context of the array substrate. In one example, the (12j-4)-th column is an even-numbered column in the context of the J columns, but may be an odd-numbered column in the context of the array substrate. In another example, the (12j-4)-th column is an even-numbered column in the context of the J columns, and also an even-numbered column in the context of the array substrate. In one example, the (12j-3)-th column is an odd-numbered column in the context of the J columns, but may be an even-numbered column in the context of the array substrate. In another example, the (12j-3)-th column is an odd-numbered column in the context of the J columns, and also an odd-numbered column in the context of the array substrate. In one example, the (12j-2)-th column is an even-numbered column in the context of the J columns, but may be an odd-numbered column in the context of the array substrate. In another example, the (12j-2)-th column is an even-numbered column in the context of the J columns, and also an even-numbered column in the context of the array substrate. In one example, the (12j-1)-th column is an odd-numbered column in the context of the J columns, but may be an even-numbered column in the context of the array substrate. In another example, the (12j-1)-th column is an odd-numbered column in the context of the J columns, and also an odd-numbered column in the context of the array substrate. In one example, the (12j)-th column is an even-numbered column in the context of the J columns, but may be an odd-numbered column in the context of the array substrate. In another example, the (12j)-th column is an even-numbered column in the context of the J columns, and also an even-numbered column in the context of the array substrate.

Figure 15:
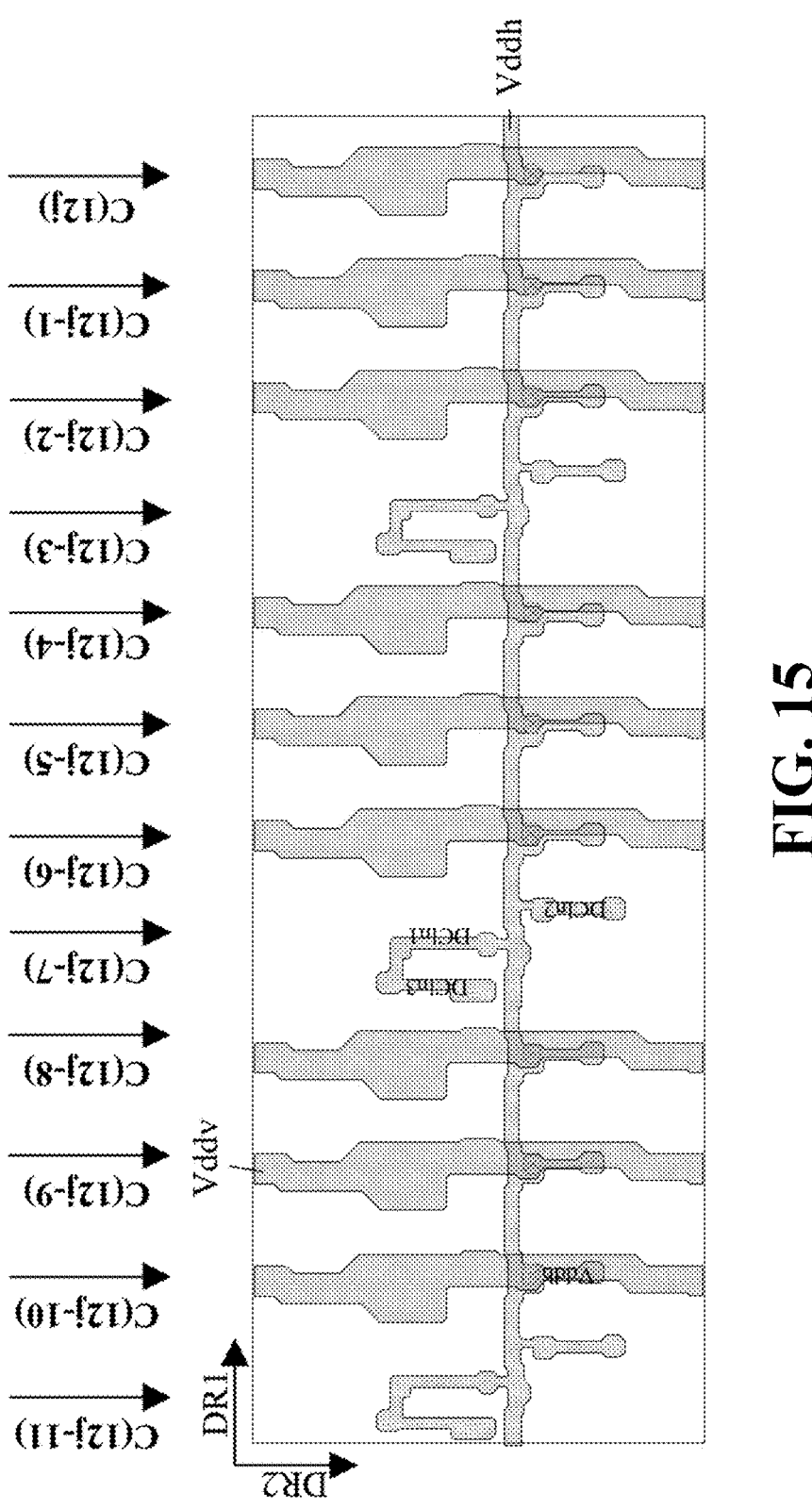
FIG. 15 illustrates a first voltage supply network in some embodiments according to the present disclosure.

FIG. 15 illustrates a first voltage supply network in some embodiments according to the present disclosure. Referring to FIG. 15, the array substrate in some embodiments includes a first interconnected voltage supply network configured to provide a first reference voltage signal to a plurality of pixel driving circuits. In some embodiments, the first interconnected voltage supply network includes a plurality of first voltage supply lines respectively along a first direction DR1; and a plurality of third voltage supply lines respectively along a second direction DR2; wherein the plurality of first voltage supply lines respectively cross over the plurality of third voltage supply lines.

Optionally, a respective first voltage supply line Vddh of the plurality of first voltage supply lines is connected to at least multiple ones of the plurality of third voltage supply lines; and a respective third voltage supply line Vddv of the plurality of third voltage supply lines is connected to at least multiple ones of the plurality of first voltage supply lines.

Optionally, the plurality of first voltage supply lines are in a first signal line layer. Optionally, the plurality of third voltage supply lines are in a second signal line layer on a side of the first signal line layer away from a base substrate.

Optionally, the first interconnected voltage supply network further includes a plurality of voltage supply branches connected to the respective first voltage supply line Vddh. Optionally, the plurality of voltage supply branches and the respective first voltage supply line Vddh are in a same layer. Optionally, the plurality of voltage supply branches and the respective first voltage supply line Vddh are parts of a unitary structure. Optionally, the plurality of voltage supply branches protrude away from the respective first voltage supply line Vddh along the second direction DR2.

Optionally, the respective third voltage supply line Vddv is connected to a voltage supply branch Vddb in the pixel driving circuit, and the voltage supply branch Vddb in the pixel driving circuit is connected to the respective first voltage supply line Vddh.

Optionally, the plurality of third voltage supply lines and the plurality of first voltage supply lines interconnect through third vias respectively extending through a first planarization layer. Optionally, the respective third voltage supply line Vddv is connected to at least multiple ones of the plurality of first voltage supply lines respectively through multiple third vias extending through the first planarization layer. Optionally, the respective first voltage supply line Vddh is connected to at least multiple ones of the plurality of third voltage supply lines respectively through multiple third vias extending through the first planarization layer.

Optionally, the first interconnected voltage supply network further includes a plurality of dummy first node connecting lines connected to the respective first voltage supply line Vddh. Optionally, the plurality of dummy first node connecting lines and the respective first voltage supply line Vddh are in a same layer, Optionally, the plurality of dummy first node connecting lines and the respective first voltage supply line Vddh are parts of a unitary structure.

Optionally, the first interconnected voltage supply network further includes a plurality of dummy third node connecting lines connected to the plurality of dummy first node connecting lines, respectively. Optionally, the plurality of dummy first node connecting lines, the plurality of dummy third node connecting lines, and the respective first voltage supply line Vddh are in a same layer. Optionally, the plurality of dummy first node connecting lines, the plurality of dummy third node connecting lines, and the respective first voltage supply line Vddh are parts of a unitary structure.

Optionally, the first interconnected voltage supply network further includes a plurality of dummy second node connecting lines connected to the respective first voltage supply line Vddh. Optionally, the plurality of dummy second node connecting lines and the respective first voltage supply line Vddh are in a same layer. Optionally, the plurality of dummy second node connecting lines and the respective first voltage supply line Vddh are parts of a unitary structure.

Optionally, a dummy first node connecting line DCln1 and a dummy second node connecting line DCln2 are on two opposite sides with respect to the respective first voltage supply line Vddh. Optionally, a dummy third node connecting line DCln3 and a dummy second node connecting line DCln2 are on two opposite sides with respect to the respective first voltage supply line Vddh.

Optionally, the plurality of third voltage supply lines are in the (12$j$-10)-th column C(12$j$-10), the (12$j$-9)-th column C(12$j$-9), the (12$j$-8)-th column C(12$j$-8), the (12$j$-6)-th column C(12$j$-6), the (12$j$-5)-th column C(12$j$-5), the (12$j$-4)-th column C(12$j$-4), the (12$j$-2)-th column C(12$j$-2), the (12$j$-1)-th column C(12$j$-1), and the (12$j$)-th column C(12$j$). Optionally, the plurality of dummy first node connecting lines, the plurality of dummy second node connecting lines, or the plurality of dummy third node connecting lines are in the (12$j$-11)-th column C(12$j$-11), the (12$j$-7)-th column C(12$j$-7), and the (12$j$-3)-th column C(12$j$-3).

Figure 16:
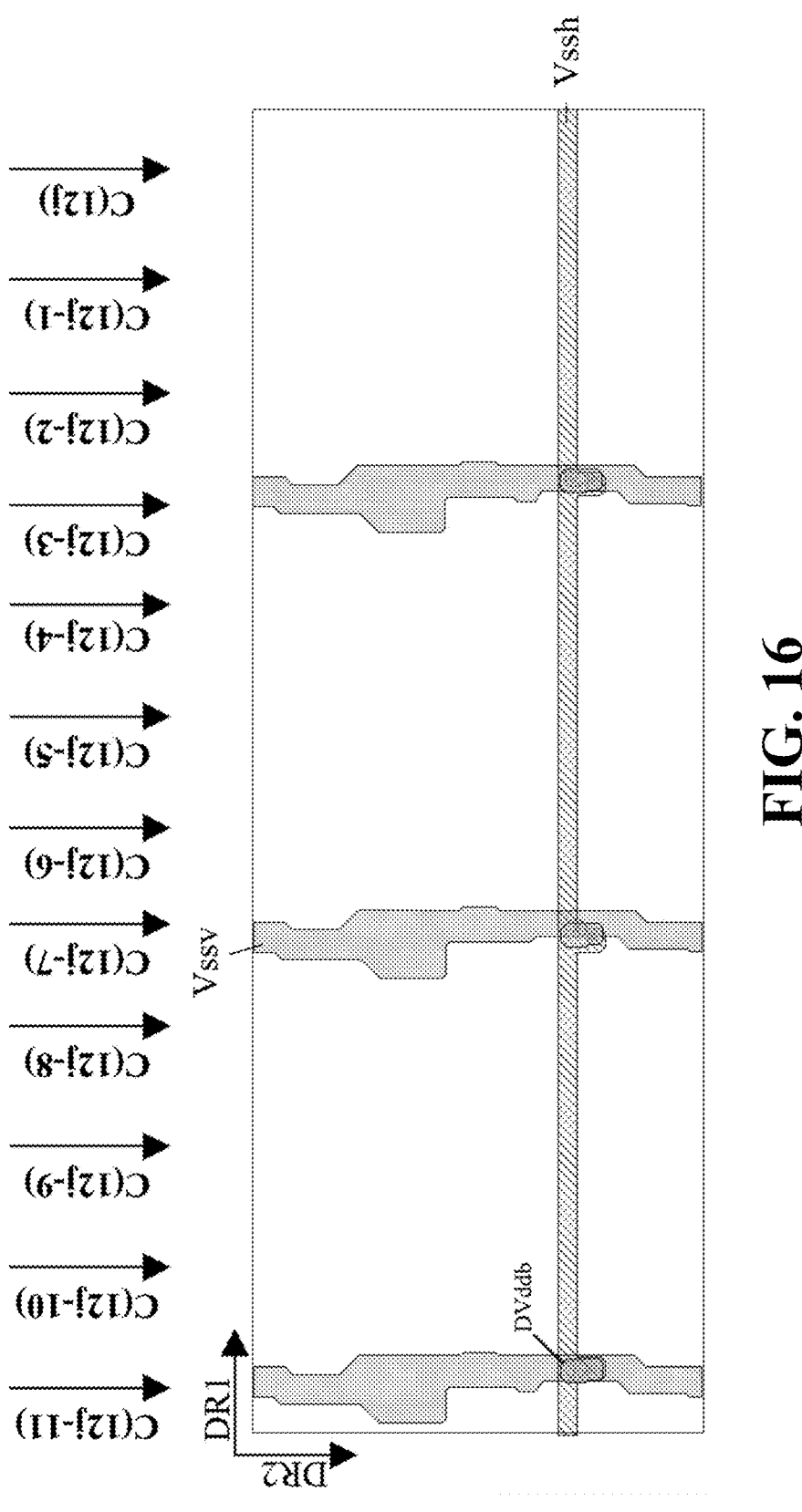
FIG. 16 illustrates a second voltage supply network in some embodiments according to the present disclosure.

FIG. 16 illustrates a second voltage supply network in some embodiments according to the present disclosure. Referring to FIG. 16, the array substrate in some embodiments includes a second interconnected voltage supply network configured to provide a second reference voltage signal to cathodes of a plurality of light emitting elements in a plurality of pixel driving circuits. In some embodiments, the second interconnected voltage supply network includes a plurality of second voltage supply lines respectively along a first direction DR1; and a plurality of fourth voltage supply lines respectively along a second direction DR2; wherein the plurality of second voltage supply lines respectively cross over the plurality of fourth voltage supply lines.

Optionally, a respective second voltage supply line Vssh of the plurality of second voltage supply lines is connected to at least multiple ones of the plurality of fourth voltage supply lines; and a respective fourth voltage supply line Vssv of the plurality of fourth voltage supply lines is connected to at least multiple ones of the plurality of second voltage supply lines.

Optionally, the plurality of second voltage supply lines are in a third gate metal layer. Optionally, the plurality of fourth voltage supply lines are in a second signal line layer on a side of the third gate metal layer away from a base substrate.

Optionally, the second interconnected voltage supply network further includes a plurality of dummy voltage supply branches. A dummy voltage supply branch DVddb is connected to a respective second voltage supply line Vssh, and is connected to a respective fourth voltage supply line Vssv. Optionally, the plurality of dummy voltage supply branches are in a first signal line layer between the third gate metal layer and the second signal line layer.

Optionally, the respective fourth voltage supply line Vssv is connected to a dummy voltage supply branch DVddb in the dummy circuit, and the dummy voltage supply branch DVddb in the dummy circuit is connected to the respective second voltage supply line Vssh.

Optionally, the plurality of fourth voltage supply lines and the plurality of dummy voltage supply branches interconnect through dummy third vias respectively extending through a first planarization layer. Optionally, the respective fourth voltage supply line Vssv is connected to at least multiple ones of the plurality of dummy voltage supply branches respectively through multiple third vias extending through the first planarization layer.

Optionally, the plurality of dummy voltage supply branches and the plurality of fourth voltage supply lines interconnect through dummy fourth vias respectively extending through a passivation layer, a second inter-layer dielectric layer, a first inter-layer dielectric layer, an insulating layer, and a gate insulating layer. Optionally, the respective fourth voltage supply line is connected to at least multiple ones of the plurality of dummy voltage supply branches respectively through multiple fourth vias extending through the passivation layer, the second inter-layer dielectric layer, the first inter-layer dielectric layer, the insulating layer, and the gate insulating layer.

Optionally, the plurality of fourth voltage supply lines are in the $(12j$-$11)$-th column $C(12j$-$11)$, the $(12j$-$7)$-th column $C(12j$-$7)$, and the $(12j$-$3)$-th column $C(12j$-$3)$. Optionally, the plurality of dummy voltage supply branches are in the $(12j$-$11)$-th column $C(12j$-$11)$, the $(12j$-$7)$-th column $C(12j$-$7)$, and the $(12j$-$3)$-th column $C(12j$-$3)$.

The inventors of the present disclosure discover that, by having the second interconnected voltage supply network, the power consumption of the array substrate can be reduced, and the display uniformity of the array substrate can be enhanced.

Optionally, an orthographic projection of the respective second voltage supply line Vssh on a base substrate at least partially (e.g., at least 80%, at least 85%, at least 90%, at least 95%, at least 98%, or at least 99%) overlaps with an orthographic projection of the respective light emitting control signal line em on the base substrate.

Optionally, an orthographic projection of the respective second voltage supply line Vssh on a base substrate is non-overlapping with an orthographic projection of the respective first gate line GL1 on the base substrate. Optionally, an orthographic projection of the respective second voltage supply line Vssh on a base substrate is non-overlapping with an orthographic projection of the respective second gate line first branch GL2-1 on the base substrate. Optionally, an orthographic projection of the respective second voltage supply line Vssh on a base substrate is non-overlapping with an orthographic projection of the respective second gate line second branch GL2-2 on the base substrate. By having this layout, the interference between gate signals and second reference signals can be minimized.

Figure 17:
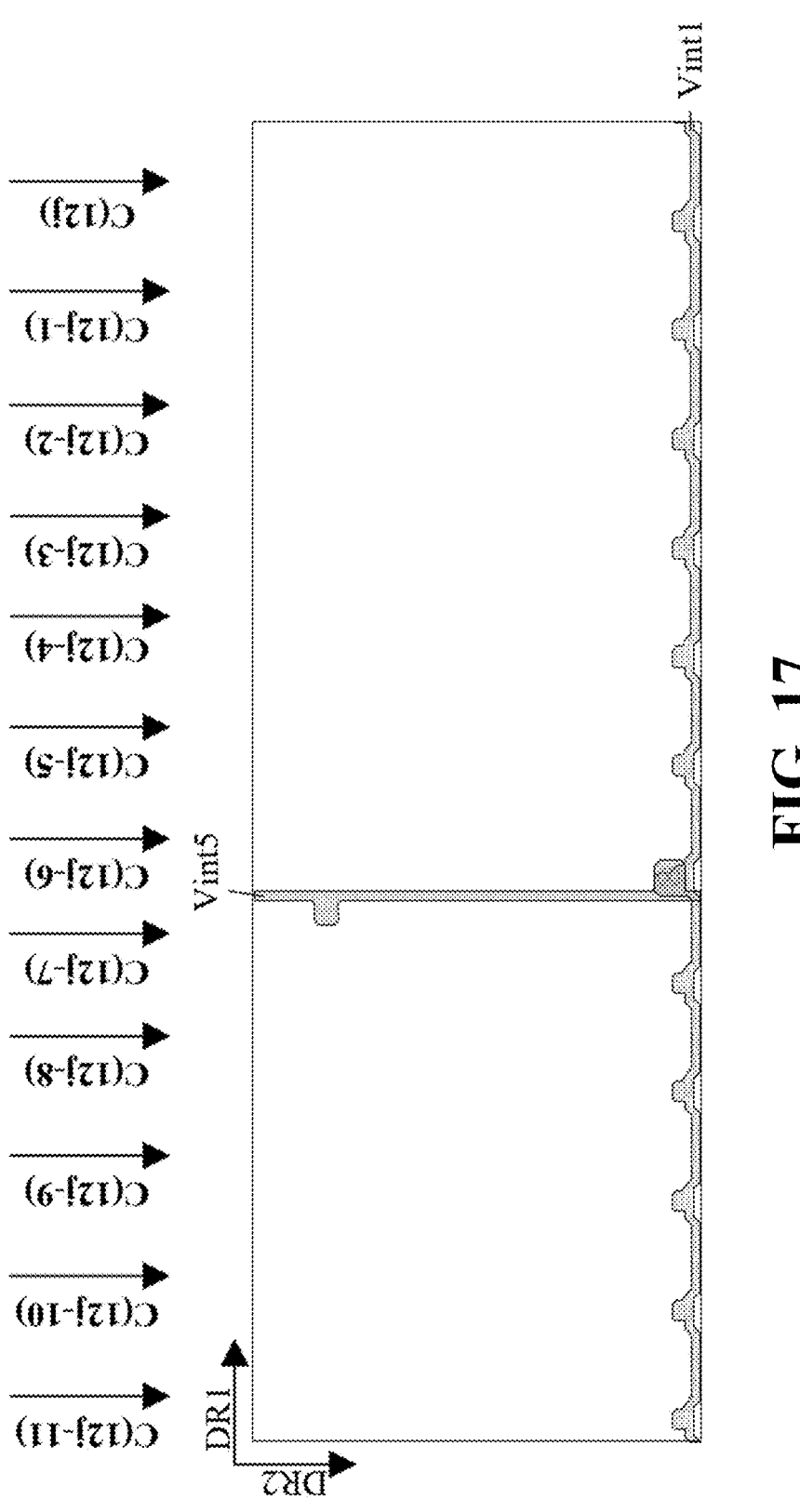
FIG. 17 illustrates a first interconnected reset signal line network in some embodiments according to the present disclosure.

FIG. 17 illustrates a first interconnected reset signal line network in some embodiments according to the present disclosure. Referring to FIG. 17, the array substrate in some embodiments includes a first interconnected reset signal line network configured to provide a first reset signal to a plurality of pixel driving circuits. In some embodiments, the first interconnected reset signal line network includes a plurality of first reset signal lines respectively along a first direction DR1; and a plurality of fifth reset signal lines respectively along a second direction DR2; wherein the plurality of first reset signal lines respectively cross over the plurality of fifth reset signal lines.

Optionally, a respective first reset signal line Vint1 of the plurality of first reset signal lines is connected to at least multiple ones of the plurality of fifth reset signal lines, and a respective fifth reset signal line Vint5 of the plurality of fifth reset signal lines is connected to at least multiple ones of the plurality of first reset signal lines.

Optionally, the plurality of first reset signal lines are in a first signal line layer. Optionally, the plurality of fifth reset signal lines are in a second signal line layer on a side of the first signal line layer away from a base substrate.

Optionally, the plurality of first reset signal lines and the plurality of fifth reset signal lines interconnect through dummy eighteenth vias respectively extending through a first planarization layer. Optionally, the respective first reset signal line Vint1 is connected to at least multiple ones of the plurality of fifth reset signal lines respectively through multiple dummy eighteenth vias extending through the first planarization layer. Optionally, the respective fifth reset signal line Vint5 is connected to at least multiple ones of the plurality of first reset signal lines respectively through multiple dummy eighteenth vias extending through the first planarization layer.

Optionally, the plurality of fifth reset signal lines are in the $(12j$-$7)$-th column $C(12j$-$7)$.

The inventors of the present disclosure discover that, by having the first interconnected reset signal line network, the loading in the reset signal lines can be reduced, enhancing display quality (particularly display quality at a low gray-scale).

Figure 18:
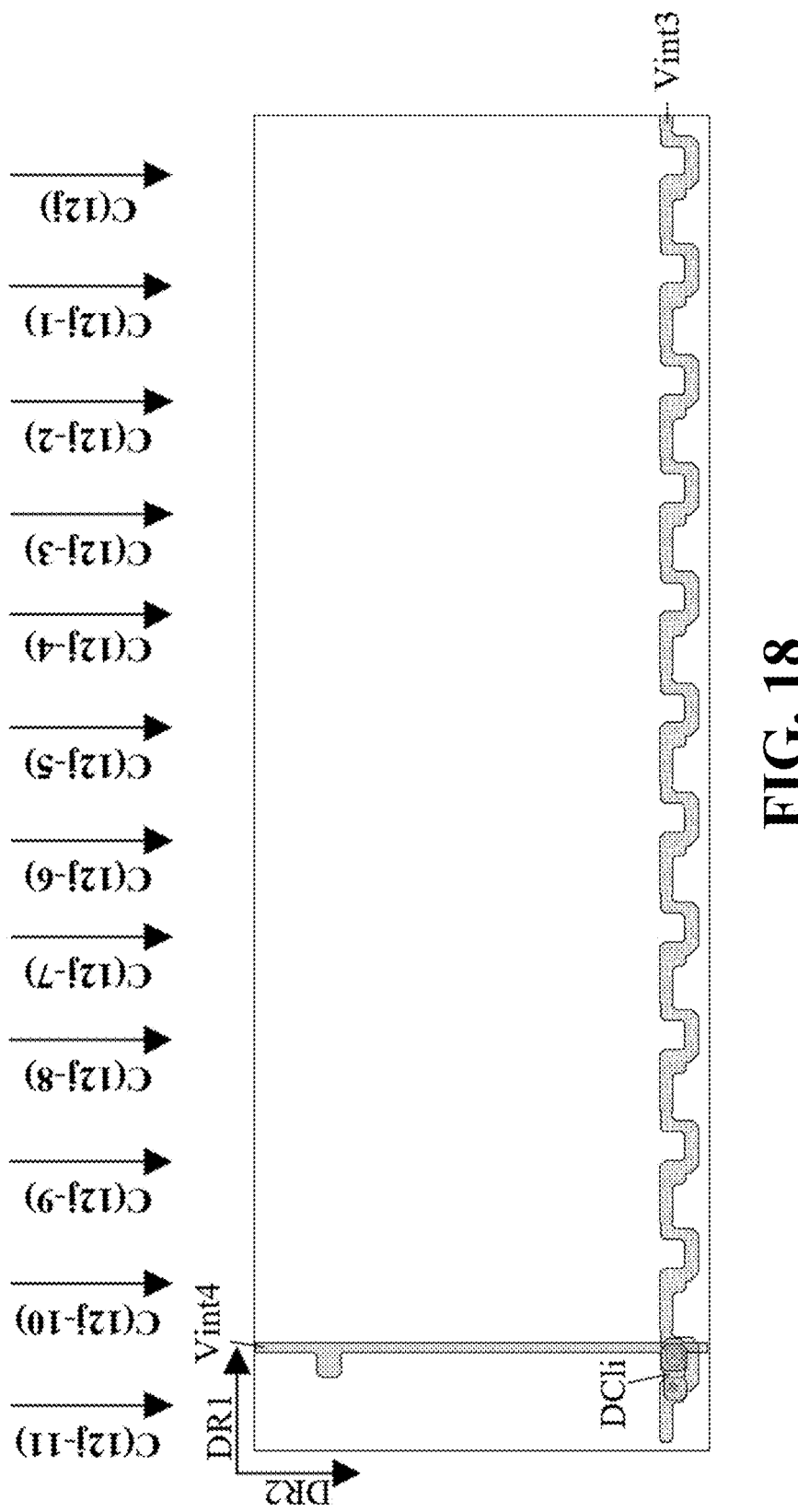
FIG. 18 illustrates a second interconnected reset signal line network in some embodiments according to the present disclosure.

FIG. 18 illustrates a second interconnected reset signal line network in some embodiments according to the present disclosure, Referring to FIG. 18, the array substrate in some embodiments includes a second interconnected reset signal line network configured to provide a third reset signal to a plurality of pixel driving circuits. In some embodiments, the second interconnected reset signal line network includes a plurality of third reset signal lines respectively along a first direction DR1; and a plurality of fourth reset signal lines respectively along a second direction DR2; wherein the plurality of third reset signal lines respectively cross over the plurality of fourth reset signal lines.

Optionally, a respective third reset signal line Vint3 of the plurality of third reset signal lines is connected to at least multiple ones of the plurality of fourth reset signal lines; and a respective fourth reset signal line Vint4 of the plurality of fourth reset signal lines is connected to at least multiple ones of the plurality of third reset signal lines.

Optionally, the plurality of third reset signal lines are in a second gate metal layer. Optionally, the plurality of fourth reset signal lines are in a second signal line layer on a side of the second gate metal layer away from a base substrate.

Optionally, the second interconnected reset signal line network further includes a plurality of dummy reset signal connecting lines connected to the respective third reset signal line Vint3. Optionally, the plurality of dummy reset signal connecting lines are in a first signal line layer between the second gate metal layer and the second signal line layer. A dummy reset signal connecting line DCli is connected to the respective third reset signal line Vint3, and is connected to the respective fourth reset signal line Vint4.

Optionally, the respective fourth reset signal line Vint4 is connected to a dummy reset signal connecting line DCli in the first dummy circuit, and the dummy reset signal connecting line DCli in the first dummy circuit is connected to the respective third reset signal line Vint3.

Optionally, the plurality of fourth reset signal lines and the plurality of dummy reset signal connecting lines interconnect through dummy seventeenth vias respectively extending through a first planarization layer. Optionally, the respective fourth reset signal line Vint4 is connected to at least multiple ones of the plurality of dummy reset signal connecting lines respectively through multiple dummy seventeenth vias extending through the first planarization layer.

Optionally, the plurality of dummy reset signal connecting lines and the plurality of third reset signal lines interconnect through dummy sixteenth vias respectively extending through a passivation layer, a second inter-layer dielectric layer, and a first inter-layer dielectric layer. Optionally, the respective third reset signal lines Vint3 is connected to at least multiple ones of the plurality of dummy reset signal connecting lines respectively through multiple dummy sixteenth vias extending through the passivation layer, the second inter-layer dielectric layer, and the first inter-layer dielectric layer.

Optionally, the plurality of fourth reset signal lines are in the $(12j\text{-}11)$-th column $C(12j\text{-}11)$.

The inventors of the present disclosure discover that, by having the second interconnected reset signal line network, the loading in the reset signal lines can be reduced, enhancing display quality (particularly display quality at a low grayscale).

In some embodiments, referring to FIG. 3F, the respective third reset signal line Vint3 is in the second gate metal layer. The inventors of the present disclosure discover that by having the respective third reset signal line Vint3 in the second gate metal layer, the loading in the respective third reset signal line Vint3 can be reduced because the second gate metal layer is further spaced apart from the first signal line layer where most of the signal lines in the array substrate are located. In alternative embodiments, the respective third reset signal line Vint3 may be disposed in the third gate metal layer.

Figure 19:
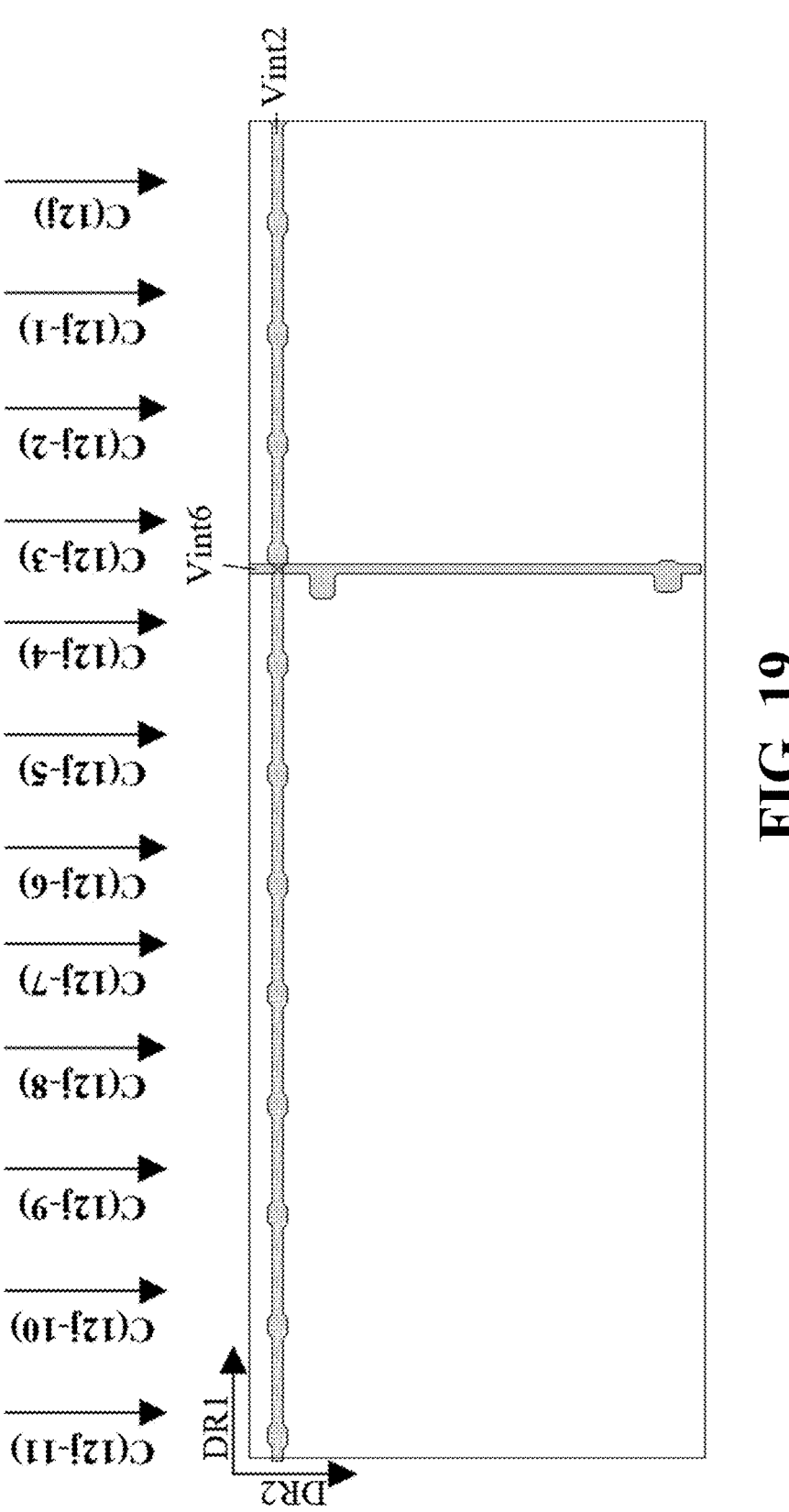
FIG. 19 illustrates a third reset signal line network in some embodiments according to the present disclosure.

FIG. 19 illustrates a third reset signal line network in some embodiments according to the present disclosure. Referring to FIG. 19, the array substrate in some embodiments includes a third interconnected reset signal line network configured to provide a second reset signal to a plurality of pixel driving circuits. In some embodiments, the third interconnected reset signal line network includes a plurality of second reset signal lines respectively along a first direction DR1; and a plurality of sixth reset signal lines respectively along a second direction DR2; wherein the plurality of second reset signal lines respectively cross over the plurality of sixth reset signal lines.

Optionally, a respective second reset signal line Vint2 of the plurality of second reset signal lines is connected to at least multiple ones of the plurality of sixth reset signal lines; and a respective sixth reset signal line Vint6 of the plurality of sixth reset signal lines is connected to at least multiple ones of the plurality of second reset signal lines.

Optionally, the plurality of second reset signal lines are in a first signal line layer. Optionally, the plurality of sixth reset signal lines are in a second signal line layer on a side of the first signal line layer away from a base substrate.

Optionally, the plurality of second reset signal lines and the plurality of sixth reset signal lines interconnect through dummy vias respectively extending through a first planarization layer. Optionally, the respective second reset signal line Vint2 is connected to at least multiple ones of the plurality of sixth reset signal lines respectively through multiple dummy vias extending through the first planarization layer. Optionally, the respective sixth reset signal line Vint6 is connected to at least multiple ones of the plurality of second reset signal lines respectively through multiple dummy vias extending through the first planarization layer.

Optionally, the plurality of sixth reset signal lines are in the $(12j\text{-}3)$-th column $C(12j\text{-}3)$.

The inventors of the present disclosure discover that, by having the third interconnected reset signal line network, the loading in the reset signal lines can be reduced, enhancing display quality (particularly display quality at a low grayscale).

Figure 20A:
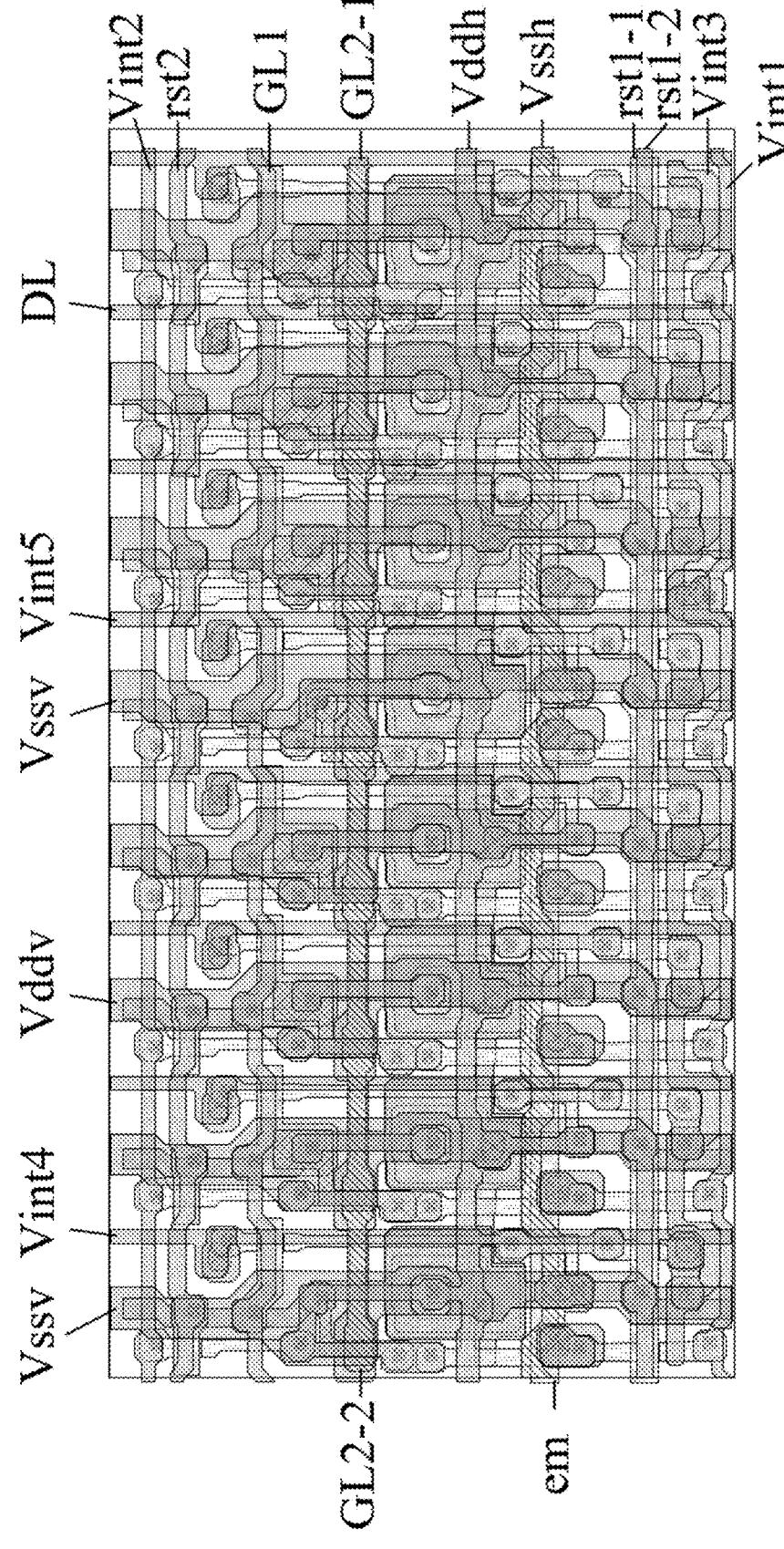
FIG. 20A is a diagram illustrating the structure of pixel driving circuits and dummy circuits in an array substrate in some embodiments according to the present disclosure.
Figure 20B:
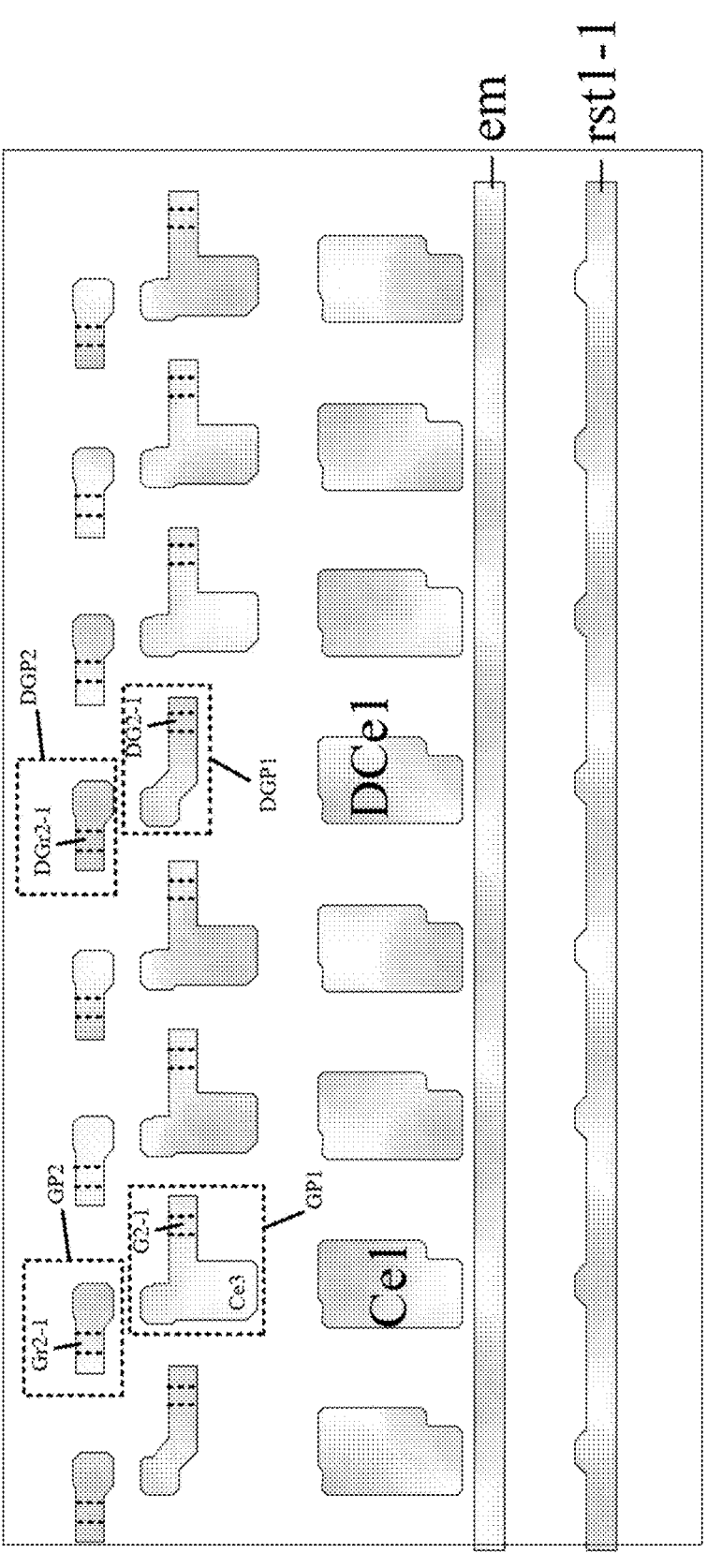
FIG. 20B is a diagram illustrating the structure of a first gate metal layer in the array substrate depicted in FIG. 20A.
Figure 20C:
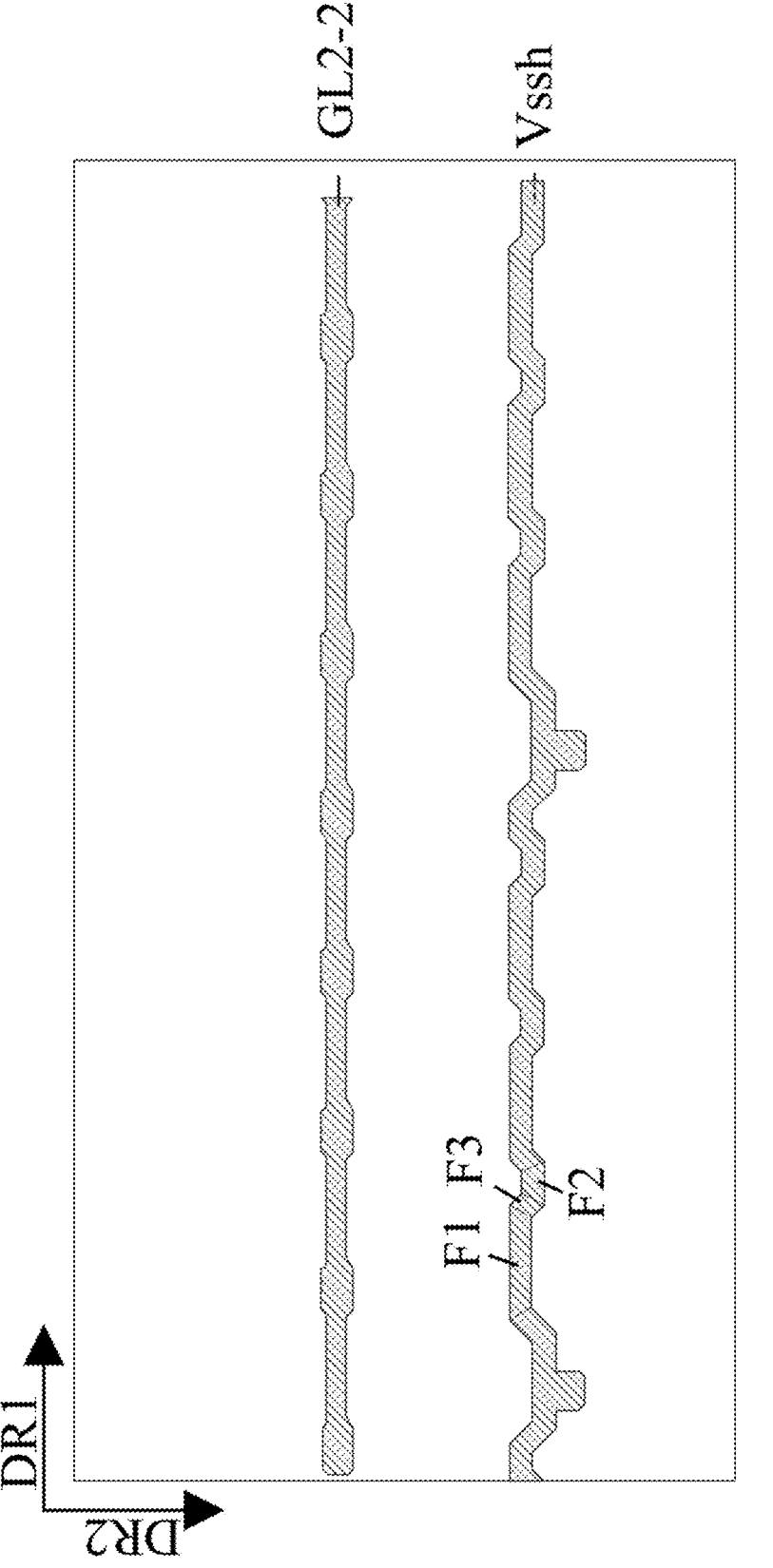
FIG. 20C is a diagram illustrating the structure of a third gate metal layer in the array substrate depicted in FIG. 20A.
Figure 20D:
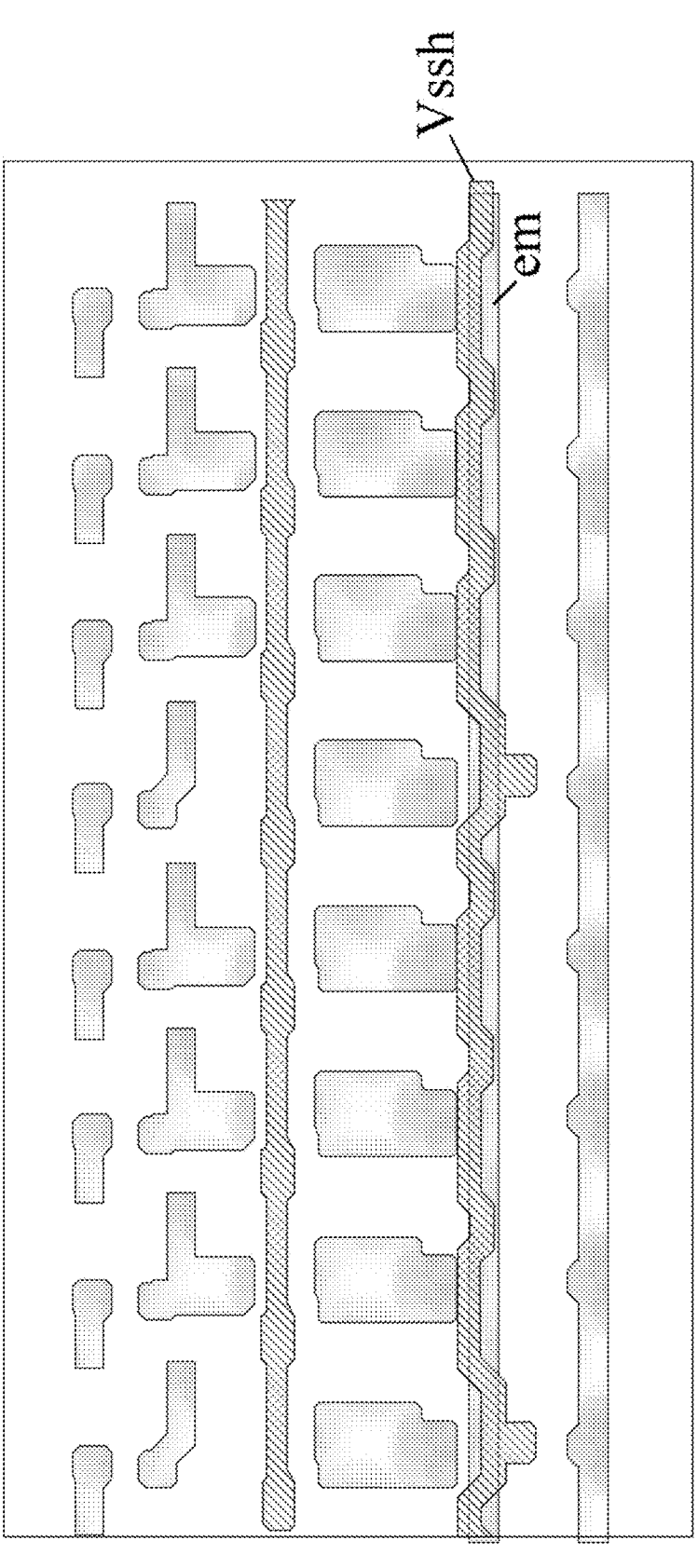
FIG. 20D is a diagram illustrating the structure of a first gate metal layer and a third gate metal layer in the array substrate depicted in FIG. 20A.

FIG. 20A is a diagram illustrating the structure of pixel driving circuits and dummy circuits in an array substrate in some embodiments according to the present disclosure. FIG. 20B is a diagram illustrating the structure of a first gate metal layer in the array substrate depicted in FIG. 20A. FIG. 20C is a diagram illustrating the structure of a third gate metal layer in the array substrate depicted in FIG. 20A. FIG. 20D is a diagram illustrating the structure of a first gate metal layer and a third gate metal layer in the array substrate depicted in FIG. 20A. The structures of a light shielding layer, a first semiconductor material layer, a second gate metal layer, a second semiconductor material layer, a first signal line layer, and a second signal line layer in the array substrate depicted in FIG. 20A are similar to those depicted in FIG. 3C, FIG. 3D, FIG. 3F, FIG. 3G, FIG. 3J, and FIG. 3L. The structure of the third gate metal layer in the array substrate depicted in FIG. 20A is different from that depicted in FIG. 3H. In particular, the structure of the respective second voltage supply line Vssh in the array substrate depicted in FIG. 20A is different from that depicted in FIG. 3H.

Referring to FIG. 20A to FIG. 20D, in some embodiments, an orthographic projection of the respective second voltage supply line Vssh on a base substrate is at least partially non-overlapping with an orthographic projection of the respective light emitting control signal line em on the base substrate. Optionally, the orthographic projection of the respective second voltage supply line Vssh on the base substrate partially overlaps with, and is partially non-overlapping with, the orthographic projection of the respective light emitting control signal line em on the base substrate. The inventors of the present disclosure discover that by having the orthographic projection of the respective second voltage supply line Vssh on the base substrate partially non-overlapping with the orthographic projection of the respective light emitting control signal line em on the base substrate, the interference of the second reference signal transmitted by the respective second voltage supply line Vssh to the loading of the light emitting control signal in the respective light emitting control signal line em can be reduced. Optionally, at least 5% (e.g., at least 10%, at least 15%, at least 20%, at least 25%, at least 30%, at least 35%, at least 40%, at least 45%, at least 50%, at least 55%, or at least 60%) of the orthographic projection of the respective second voltage supply line Vssh on the base substrate is non-overlapping with the orthographic projection of the respective light emitting control signal line em on the base substrate.

Referring to FIG. 20C, the respective second voltage supply line Vssh has an overall extension direction substantially parallel to the first direction DR1. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. The respective second voltage supply line Vssh includes a plurality of first fragments, a plurality of second fragments, and a plurality of third fragments. At least a first fragment F1 of the plurality of first fragments and a second fragment F2 of the plurality of second fragments are connected by a third fragment F3 of the plurality of third fragments F3. Optionally, the plurality of first fragments extend along a direction substantially parallel to the first direction DR1; and the plurality of second fragments extend along a direction substantially parallel to the first direction DR1. Optionally, the plurality of third fragments extend along a direction non-parallel to the first direction DR1.

Referring to FIG. 20C and FIG. 20D, in some embodiments, an orthographic projection of the first fragment F1 on a base substrate is at least partially non-overlapping with an orthographic projection of the respective light emitting control signal line em on the base substrate.

Connection between the respective second voltage supply line Vssh and the respective fourth voltage supply line Vssv is similar to that depicted in FIG. 3A to FIG. 3L, FIG. 6B, and FIG. 7B. For example, the respective fourth voltage supply line Vssv is connected to the dummy voltage supply branch DVddb through the dummy third via v3', and the dummy voltage supply branch DVddb is connected to the respective second voltage supply line Vssh through the dummy fourth via v4'.

Figure 21A:
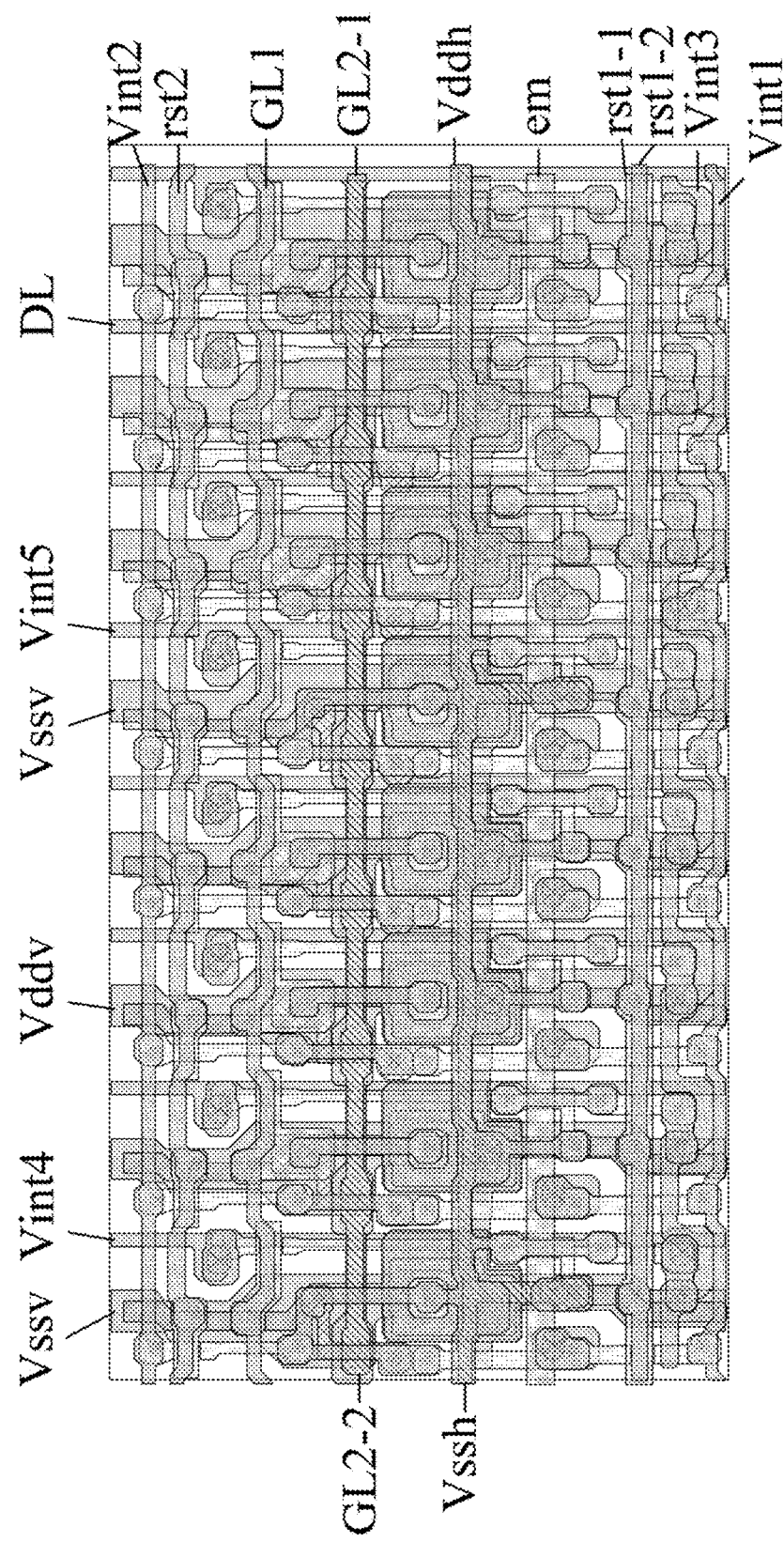
FIG. 21A is a diagram illustrating the structure of pixel driving circuits and dummy circuits in an array substrate in some embodiments according to the present disclosure.
Figure 21B:
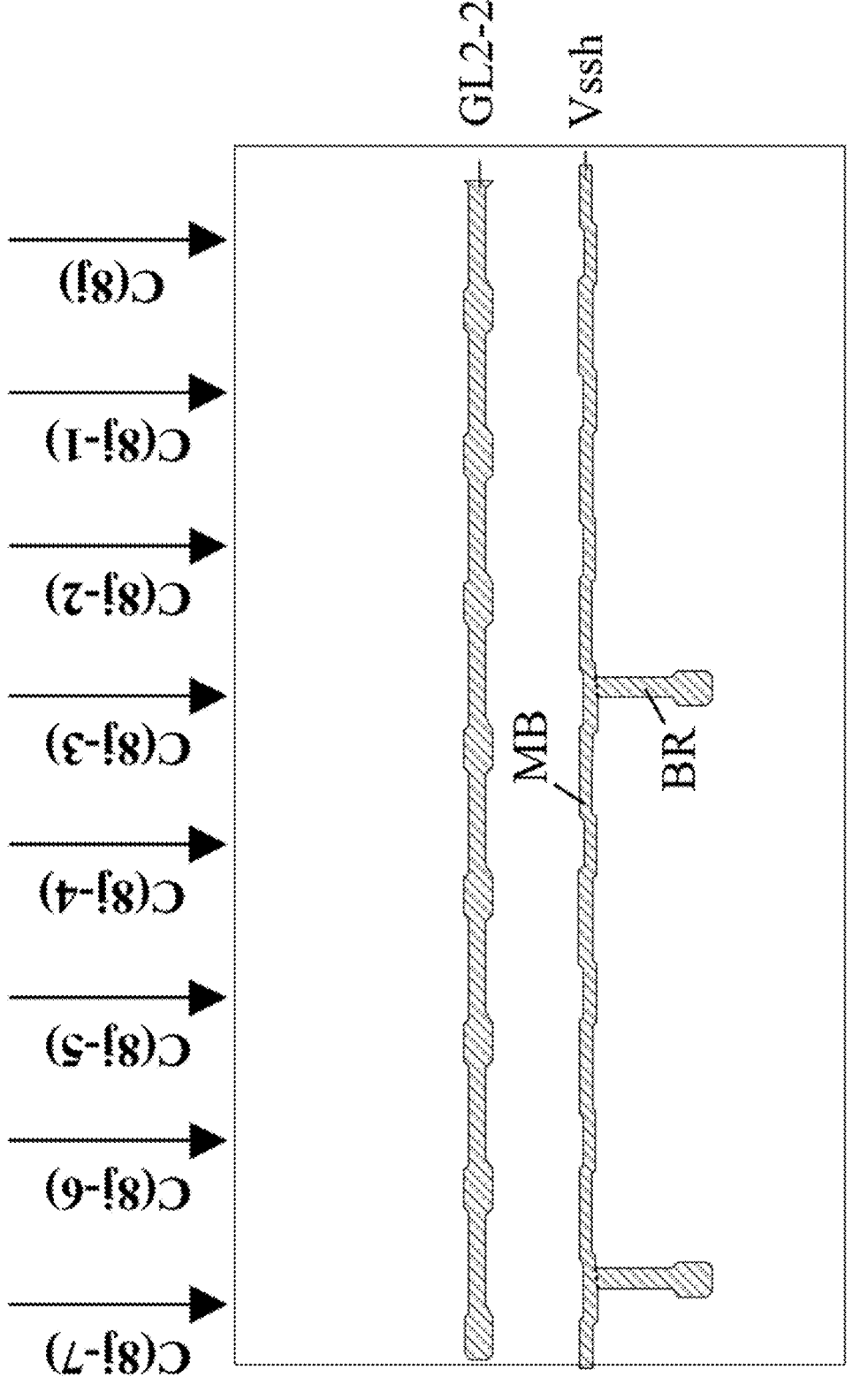
FIG. 21B is a diagram illustrating the structure of a third gate metal layer in the array substrate depicted in FIG. 21A.
Figure 21C:
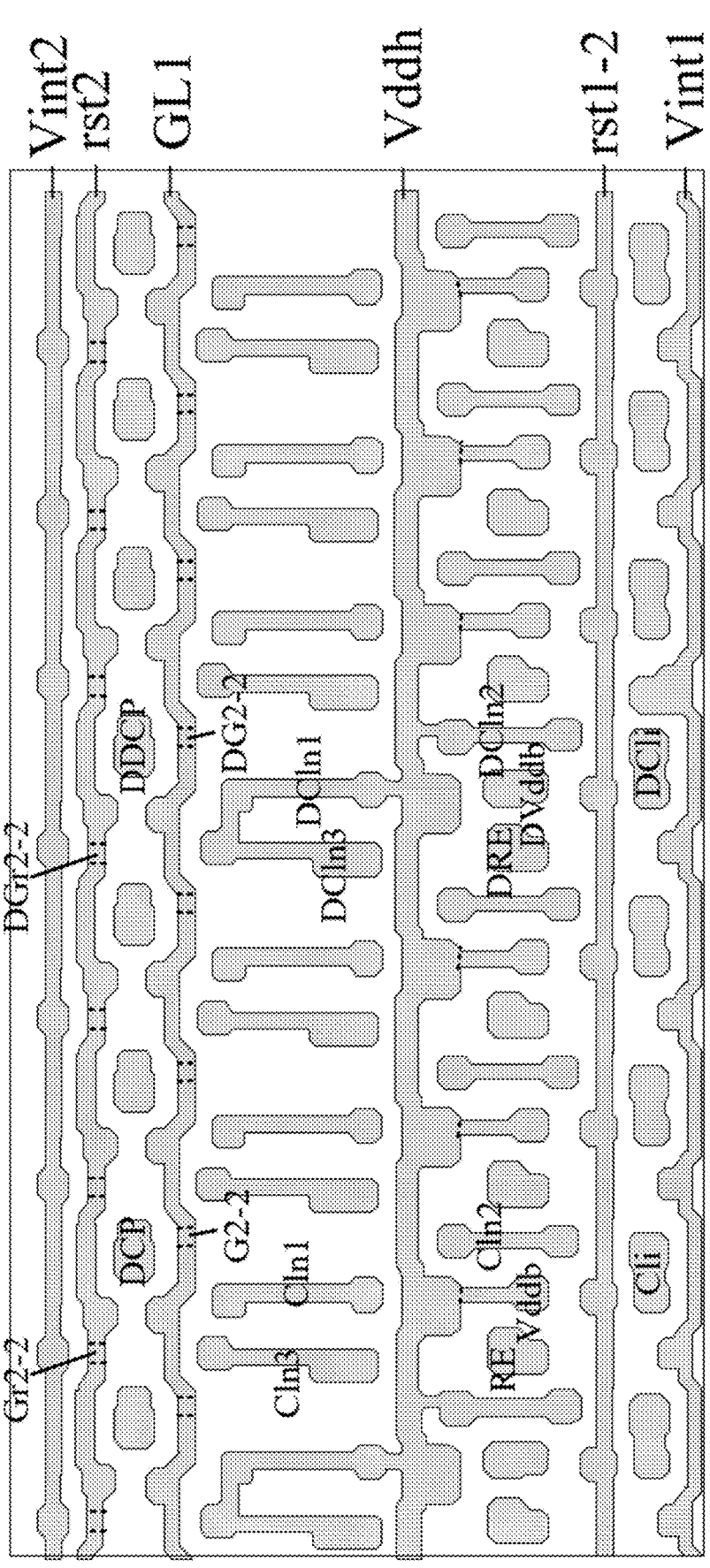
FIG. 21C is a diagram illustrating the structure of a first signal line layer in the array substrate depicted in FIG. 21A.
Figure 21D:
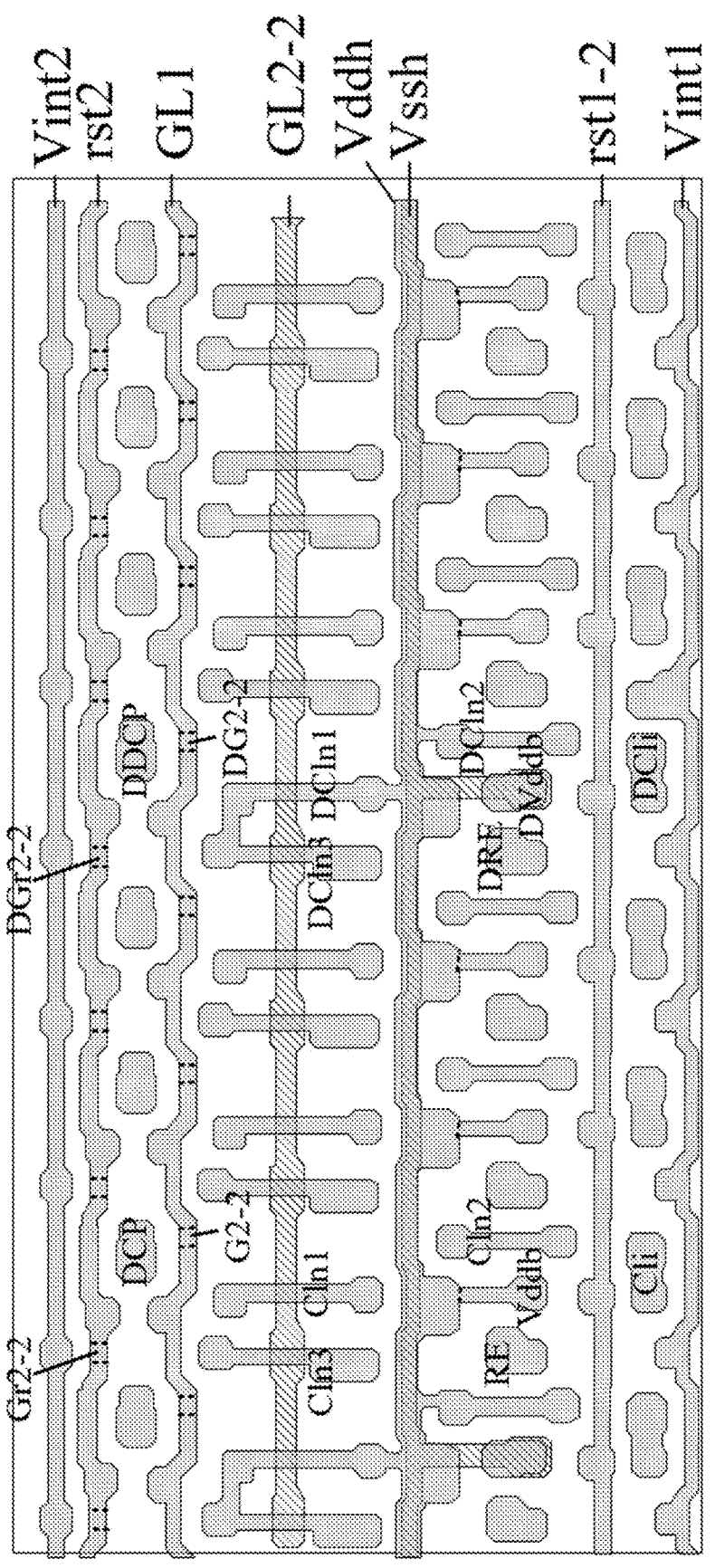
FIG. 21D is a diagram illustrating the structure of a third gate metal layer and a first signal line layer in the array substrate depicted in FIG. 21A.

FIG. 21A is a diagram illustrating the structure of pixel driving circuits and dummy circuits in an array substrate in some embodiments according to the present disclosure. FIG. 21B is a diagram illustrating the structure of a third gate metal layer in the array substrate depicted in FIG. 21A. FIG. 21C is a diagram illustrating the structure of a first signal line layer in the array substrate depicted in FIG. 21A. FIG. 21D is a diagram illustrating the structure of a third gate metal layer and a first signal line layer in the array substrate depicted in FIG. 21A. The structures of a light shielding layer, a first semiconductor material layer, a first gate metal layer, a second gate metal layer, a second semiconductor material layer, and a second signal line layer in the array substrate depicted in FIG. 21A are similar to those depicted in FIG. 3C, FIG. 3D, FIG. 3E, FIG. 3F, FIG. 3G, and FIG. 3L. The structure of the third gate metal layer in the array substrate depicted in FIG. 21A is different from that depicted in FIG. 3H, In particular, the structure of the respective second voltage supply line Vssh in the array substrate depicted in FIG. 21A is different from that depicted in FIG. 3H.

Referring to FIG. 21A to FIG. 21D, in some embodiments, an orthographic projection of the respective second voltage supply line Vssh on a base substrate at least partially (e.g., at least 80%, at least 85%, at least 90%, at least 95%, at least 98%, or at least 99%) overlaps with an orthographic projection of the respective first voltage supply line Vddh on the base substrate.

Referring to FIG. 21B, the respective second voltage supply line Vssh in some embodiments includes a main body MB and a plurality of branches BR extending away from the main body MB. Optionally, the plurality of branches BR are present in regions having dummy circuits and are absent in regions having pixel driving circuits. Optionally, the plurality of branches BR are in the (8*j*-7)-th column C(8*j*-7), and in the (8*j*-3)-th column C(8*j*-3).

In some embodiments, referring to FIG. 21D, an orthographic projection of the respective first voltage supply line Vddh on a base substrate substantially covers (e.g., covers at least 80%, covers at least 85%, covers at least 90%, covers at least 95%, covers at least 99%, or completely covers) an orthographic projection of the respective second voltage supply line Vssh on the base substrate.

In some embodiments, referring to FIG. 21D, an orthographic projection of the respective first voltage supply line Vddh on a base substrate is at least partially non-overlapping with an orthographic projection of the respective second voltage supply line Vssh on the base substrate.

The inventors of the present disclosure discover that, by having the orthographic projection of the respective first voltage supply line Vddh on the base substrate substantially covers the orthographic projection of the respective second voltage supply line Vssh on the base substrate, the respective first voltage supply line Vddh can effectively prevent interference of the second reference signal transmitted by the respective second voltage supply line Vssh to the loading of the loading of signals in other signal lines on a side of the respective first voltage supply line Vddh away from the respective second voltage supply line Vssh.

Connection between the respective second voltage supply line Vssh and the respective fourth voltage supply line Vssv is similar to that depicted in FIG. 3A to FIG. 3L, FIG. 6B, and FIG. 7B. For example, the respective fourth voltage supply line Vssv is connected to the dummy voltage supply branch DVddb through the dummy third via v3', and the dummy voltage supply branch DVddb is connected to a respective branch of the plurality of branches BR of the respective second voltage supply line Vssh through the dummy fourth via v4'.

Figure 22:
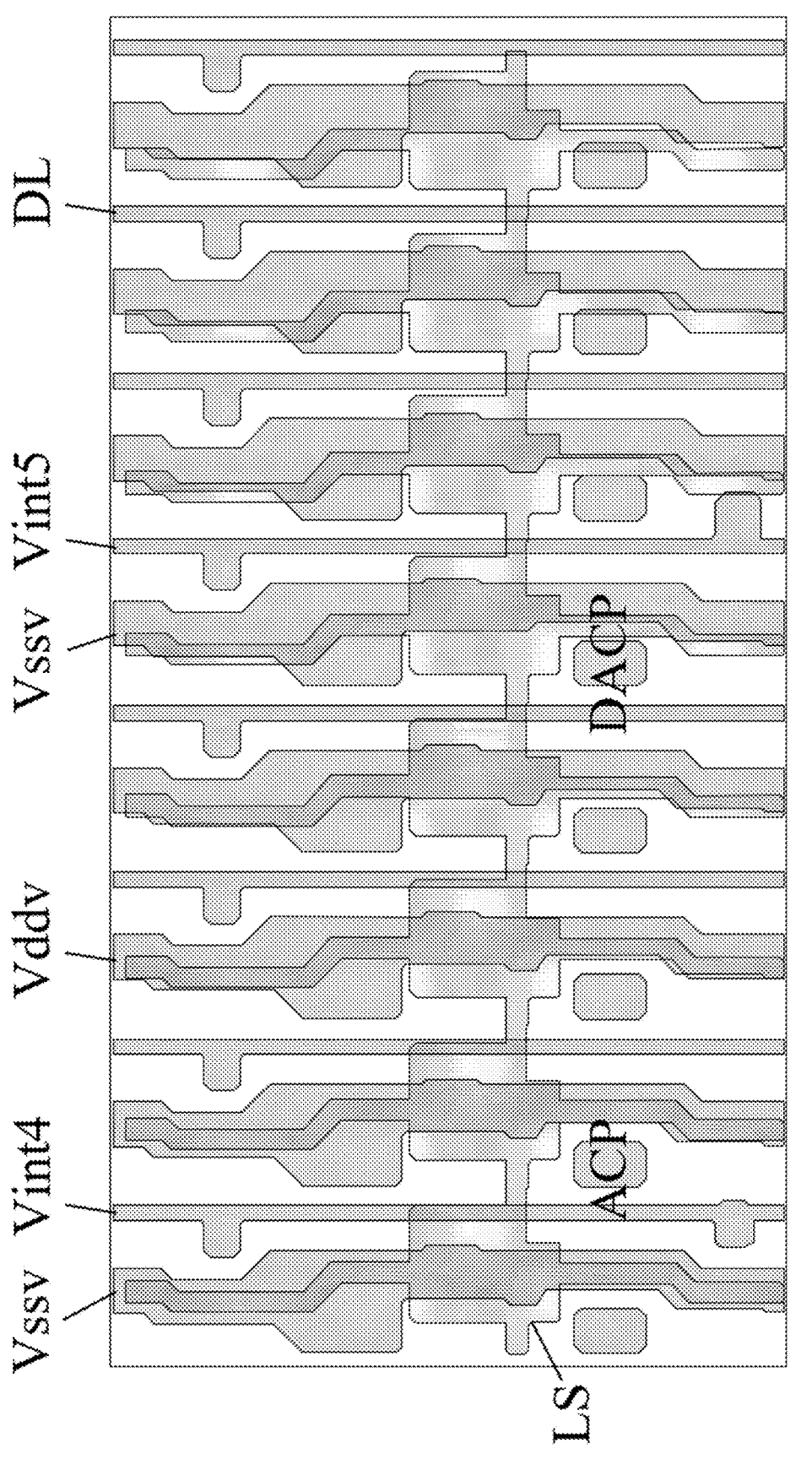
FIG. 22 is a diagram illustrating the structure of a light shielding layer and a second signal line layer in an array substrate in some embodiments according to the present disclosure.

FIG. 22 is a diagram illustrating the structure of a light shielding layer and a second signal line layer in an array substrate in some embodiments according to the present disclosure. Referring to FIG. 3A, FIG. 3C, FIG. 3L, and FIG. 22, in some embodiments, the light shield LS includes a plurality of islands Is and a plurality of bridges. Optionally, an orthographic projection of a respective island of the plurality of islands Is on a base substrate covers an orthographic projection of an active layer of the driving transistor in the pixel driving circuit, or an orthographic projection of a dummy active layer of the dummy driving transistor in the dummy circuit, thereby shielding the active layer or the dummy active layer from light irradiation. The plurality of bridges include bridges extending along a first direction DR1 for connecting multiple islands in a same row, and bridges extending along a second direction DR2 for connecting multiple islands in a same column. As shown in FIG. 3C, at least one island of the plurality of islands Is is connected to a first bridge Br1, a second bridge BR2, a third bridge BR3, and a fourth bridge BR4. The first bridge BR1 connects the island to a first adjacent island in a same column, the second bridge BR2 connects the island to a second adjacent island in the same column, the third bridge BR3 connects the island to a third adjacent island in a same row, the fourth bridge BR4 connects the island to a fourth adjacent island in the same row.

Referring to FIG. 3A, FIG. 3C, FIG. 3L, and FIG. 22, in some embodiments, an orthographic projection of the light shield LS on a base substrate at least partially overlaps with an orthographic projection of the second signal line layer on the base substrate. Optionally, an orthographic projection of the plurality of third voltage supply lines and the plurality of fourth voltage supply lines on a base substrate covers an orthographic projection of the bridges extending along a second direction DR2 on the base substrate. Optionally, the orthographic projection of the plurality of third voltage supply lines and the plurality of fourth voltage supply lines on the base substrate at least partially overlaps with an orthographic projection of the plurality of islands Is on the base substrate. The inventors of the present disclosure discover that this structure is conducive to a higher light transmission rate in the array substrate.

In some embodiments, the light shield LS is configured to be provided with a first reference signal. Optionally, the light shield LS is electrically connected to a voltage supply line. In one example, the light shield LS is electrically connected to a voltage supply line in a peripheral area of the array substrate.

In alternative embodiments, the light shield LS is configured to be provided with a second reference signal.

In alternative embodiments, the light shield LS is configured to be provided with a reset signal.

In another aspect, the present invention provides an array substrate. In some embodiments, the array substrate includes a plurality of first signal lines extending along a second direction, respectively; and a plurality of second signal lines extending along the second direction, respectively. Optionally, the plurality of first signal lines comprise a plurality of third voltage supply lines and a plurality of fourth voltage supply lines. Optionally, the plurality of second signal lines comprise a plurality of data lines and a plurality of reset signal lines. Optionally, a respective third voltage supply line of the plurality of third voltage supply lines is in a region having a column of pixel driving circuits. Optionally, a respective fourth voltage supply line of the plurality of fourth voltage supply lines is in a region having a column of dummy circuits. Optionally, the plurality of reset signal lines are configured to provide a reset signal. Optionally, the plurality of fourth voltage supply lines are configured to provide a second reference voltage signal, the second reference voltage signal being different from the reset signal.

In some embodiments, the second reference voltage signal has a voltage level lower than a voltage level of the reset signal.

In some embodiments, the plurality of third voltage supply lines are configured to provide a first reference voltage signal. Optionally, the second reference voltage signal has a voltage level lower than a voltage level of the first reference voltage signal.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In some embodiments, the display apparatus is a gate-on-array in panel (GOP) type display apparatus. In some embodiments, a gate-on-array (GOA) circuit is disposed in a display area of the display apparatus. In the area corresponding to the gate-on-array circuit, the pixel driving circuits are absent, and anodes of light emitting elements are present. The display area includes a transition area adjacent to the area corresponding to the gate-on-array circuit. The anodes in the area corresponding to the gate-on-array circuit are connected to pixel driving circuits in the transition area.

In some embodiments, the transition area is absent of dummy circuits, and includes pixel driving circuits connected to the anodes in the area corresponding to the gate-on-array circuit. Accordingly, the transition area has a higher density of pixel driving circuits as compared to a normal display area, which is on a side of transition area away from the gate-on-array. In the transition area, the relative position between the node connecting line and the first node is different from that in the normal display area.

In some embodiments, FIG. 3A to FIG. 3L, FIG. 4A to FIG. 4E, FIG. 5, FIG. 6A to FIG. 6B, FIG. 7A to FIG. 7F, FIG. 8A, FIG. 8B, FIG. 9 to FIG. 19, FIG. 20A to FIG. 20D, FIG. 21A to FIG. 21D, and FIG. 22 depict the normal display area of the array substrate.

In another aspect, the present disclosure provides a method of fabricating an army substrate. In some embodiments, the method includes forming a plurality of first signal lines extending along a second direction, respectively. Optionally, forming the plurality of first signal lines includes forming a plurality of third voltage supply lines and forming a plurality of fourth voltage supply lines. Optionally, a respective third voltage supply line of the plurality of third voltage supply lines is formed in a region having a column of pixel driving circuits. Optionally, a respective fourth voltage supply line of the plurality of fourth voltage supply lines is formed in a region having a column of dummy circuits. Optionally, the plurality of third voltage supply lines are configured to provide a first reference voltage signal. Optionally, the plurality of fourth voltage supply lines are configured to provide a second reference voltage signal. Optionally, the second reference voltage signal being different from the first reference voltage signal.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of first signal lines extending along a second direction, respectively;

wherein the plurality of first signal lines comprise a plurality of third voltage supply lines and a plurality of fourth voltage supply lines;

wherein a respective third voltage supply line of the plurality of third voltage supply lines is in a region having a column of pixel driving circuits;

a respective fourth voltage supply line of the plurality of fourth voltage supply lines is in a region having a column of dummy circuits;

the plurality of third voltage supply lines are configured to provide a first reference voltage signal; and the plurality of fourth voltage supply lines are configured to provide a second reference voltage signal, the second reference voltage signal being different from the first reference voltage signal.

2. The array substrate of claim 1, further comprising a plurality of first voltage supply lines extending along a first direction, respectively;

wherein the plurality of first voltage supply lines and the plurality of third voltage supply lines form a first interconnected voltage supply network configured to provide the first reference voltage signal;

the plurality of first voltage supply lines respectively cross over the plurality of third voltage supply lines;

a respective first voltage supply line of the plurality of first voltage supply lines is connected to at least multiple ones of the plurality of third voltage supply lines; and the respective third voltage supply line is connected to at least multiple ones of the plurality of first voltage supply lines.

3. The array substrate of claim 2, wherein the first interconnected voltage supply network further comprises a plurality of voltage supply branches in a plurality of pixel driving circuits, respectively;

a voltage supply branch is connected to the respective first voltage supply line; and the respective third voltage supply line is connected to the voltage supply branch in the pixel driving circuit.

4. The array substrate of claim 3, wherein the plurality of voltage supply branches are in a first signal line layer; and the respective third voltage supply line is in a second signal line layer.

5. The array substrate of claim 1, further comprising a plurality of second voltage supply lines extending along a first direction, respectively;

wherein the plurality of second voltage supply lines and the plurality of fourth voltage supply lines form a second interconnected voltage supply network configured to provide the second reference voltage signal;

the plurality of second voltage supply lines respectively cross over the plurality of fourth voltage supply lines;

a respective second voltage supply line of the plurality of second voltage supply lines is connected to at least multiple ones of the plurality of fourth voltage supply lines; and the respective fourth voltage supply line is connected to at least multiple ones of the plurality of second voltage supply lines.

6. The array substrate of claim 5, wherein the second interconnected voltage supply network further comprises a plurality of dummy voltage supply branches in a plurality of dummy circuits, respectively;

a dummy voltage supply branch is connected to the respective second voltage supply line; and the respective fourth voltage supply line is connected to the dummy voltage supply branch.

7. The array substrate of claim 6, wherein the respective second voltage supply line is in a third gate metal layer;

the plurality of dummy voltage supply branches are in a first signal line layer on a side of the third gate metal layer away from a base substrate; and the respective fourth voltage supply line is in a second signal line layer on a side of the first signal line layer away from the base substrate.

8. The array substrate of claim 1, further comprising a plurality of second signal lines extending along the second direction, respectively;

wherein the plurality of second signal lines comprise a plurality of data lines and a plurality of reset signal lines;

wherein a respective data line of the plurality of data lines is in the region having the column of pixel driving circuits; and a respective reset signal line of the plurality of reset signal lines is in the region having the column of dummy circuits.

9. The array substrate of claim 8, wherein at least two data lines of the plurality of data lines are between two adjacent reset signal lines of the plurality of reset signal lines.

10. The array substrate of claim 8, wherein the plurality of reset signal lines comprise a plurality of fourth reset signal lines and a plurality of fifth reset signal lines;

the plurality of fourth reset signal lines and the plurality of fifth reset signal lines are alternately arranged in regions having columns of dummy circuits; and a respective fourth reset signal of the plurality of fourth reset signal lines and a respective fifth reset signal line of the plurality of fifth reset signal lines are configured to provide reset signals to different reset transistors in a same pixel driving circuit.

11. The array substrate of claim 8, wherein the plurality of reset signal lines comprise a plurality of fourth reset signal lines, a plurality of fifth reset signal lines, and a plurality of sixth reset signal lines;

the plurality of fourth reset signal lines, the plurality of fifth reset signal lines, and the plurality of sixth reset signal lines are alternately arranged in regions having columns of dummy circuits; and a respective fourth reset signal of the plurality of fourth reset signal lines, a respective fifth reset signal line of the plurality of fifth reset signal lines, and a respective sixth reset signal of the plurality of sixth reset signal lines are configured to provide reset signals to different reset transistors in a same pixel driving circuit.

12. The array substrate of claim 1, wherein an orthographic projection of the respective third voltage supply line on a base substrate at least partially overlaps with an orthographic projection of active layers of compensating transistors in the column of pixel driving circuits on the base substrate; and an orthographic projection of the respective fourth voltage supply line on the base substrate at least partially overlaps with an orthographic projection of dummy active layers of dummy compensating transistors in the column of dummy circuits on the base substrate.

13. The array substrate of claim 12, wherein the active layers of the compensating transistors and the dummy active layers of the dummy compensating transistors are in a second semiconductor material layer;

active layers of driving transistors in the column of pixel driving circuits and dummy active layers of dummy driving transistors in the column of dummy circuits are in a first semiconductor material layer; and the second semiconductor material layer is on a side of the first semiconductor material layer away from the base substrate.

14. The array substrate of claim 1, further comprising a second interconnected reset signal line network configured to provide a third reset signal to a plurality of pixel driving circuits;

wherein the second interconnected reset signal line network comprises a plurality of third reset signal lines respectively along a first direction and a plurality of fourth reset signal lines respectively along a second direction;

US 12,635,240 B2

51 wherein the plurality of third reset signal lines respectively cross over the plurality of fourth reset signal lines;

a respective third reset signal line of the plurality of third reset signal lines is connected to at least multiple ones of the plurality of fourth reset signal lines; and a respective fourth reset signal line of the plurality of fourth reset signal lines is connected to at least multiple ones of the plurality of third reset signal lines.

15. The array substrate of claim 14, wherein the second interconnected reset signal line network further comprises a plurality of dummy reset signal connecting lines in a plurality of dummy circuits, respectively;

a dummy reset signal connecting line is connected to the respective third reset signal line; and the respective fourth reset signal line is connected to the dummy reset signal connecting line.

16. The array substrate of claim 1, wherein an orthographic projection of the respective third voltage supply line on a base substrate at least partially overlaps with an orthographic projection of active layers of driving transistors in the column of pixel driving circuits on the base substrate; and an orthographic projection of the respective fourth voltage supply line on the base substrate at least partially overlaps with an orthographic projection of dummy active layers of dummy driving transistors in the column of dummy circuits on the base substrate.

17. The array substrate of claim 1, wherein at least two third voltage supply lines of the plurality of third voltage supply lines are between two adjacent fourth voltage supply lines of the plurality of fourth voltage supply lines; and at least two columns of pixel driving circuits are between two adjacent columns of dummy circuits.

18. The array substrate of claim 1, further comprising a first interconnected reset signal line network configured to provide a first reset signal to a plurality of pixel driving circuits;

52 wherein the first interconnected reset signal line network comprises a plurality of first reset signal lines respectively along a first direction and a plurality of fifth reset signal lines respectively along a second direction;

wherein the plurality of first reset signal lines respectively cross over the plurality of fifth reset signal lines;

a respective first reset signal line of the plurality of first reset signal lines is connected to at least multiple ones of the plurality of fifth reset signal lines; and a respective fifth reset signal line of the plurality of fifth reset signal lines is connected to at least multiple ones of the plurality of first reset signal lines.

19. A display apparatus, comprising the array substrate of claim 1, and one or more integrated circuits connected to the array substrate.

20. An array substrate, comprising:

a plurality of first signal lines extending along a second direction, respectively; and a plurality of second signal lines extending along the second direction, respectively;

wherein the plurality of first signal lines comprise a plurality of third voltage supply lines and a plurality of fourth voltage supply lines;

the plurality of second signal lines comprise a plurality of data lines and a plurality of reset signal lines;

a respective third voltage supply line of the plurality of third voltage supply lines is in a region having a column of pixel driving circuits;

a respective fourth voltage supply line of the plurality of fourth voltage supply lines is in a region having a column of dummy circuits;

the plurality of reset signal lines are configured to provide a reset signal; and the plurality of fourth voltage supply lines are configured to provide a second reference voltage signal, the second reference voltage signal being different from the reset signal.

* * * * *